(12) United States Patent
Torii

(10) Patent No.: US 9,524,899 B2
(45) Date of Patent: Dec. 20, 2016

(54) SEMICONDUCTOR DEVICE HAVING MULTIPLE WELLS FOR LOW- AND HIGH-VOLTAGE CMOS TRANSISTORS

(71) Applicant: FUJITSU SEMICONDUCTOR LIMITED, Yokohama, Kanagawa (JP)

(72) Inventor: Yasunobu Torii, Kuwana (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 14/228,819

(22) Filed: Mar. 28, 2014

(65) Prior Publication Data

US 2014/0306319 A1    Oct. 16, 2014

(30) Foreign Application Priority Data

Apr. 15, 2013  (JP) ................................ 2013-084813

(51) Int. Cl.

| H01L 29/78 | (2006.01) |
|---|---|
| H01L 27/092 | (2006.01) |
| H01L 21/336 | (2006.01) |
| H01L 29/00 | (2006.01) |
| H01L 29/06 | (2006.01) |
| H01L 21/761 | (2006.01) |
| H01L 21/8238 | (2006.01) |

(52) U.S. Cl.
CPC ..... *H01L 21/761* (2013.01); *H01L 21/823857* (2013.01); *H01L 21/823878* (2013.01); *H01L 21/823892* (2013.01); *H01L 27/0922* (2013.01); *H01L 27/0928* (2013.01)

(58) Field of Classification Search
CPC ........... H01L 29/7816; H01L 29/66681; H01L 29/7833;H01L 29/6659; H01L 21/823878; H01L 21/266; H01L 27/0928; H01L 29/66689; H01L 29/7317; H01L 21/762; H01L 21/76229; H01L 21/761; H01L 29/0646
USPC .......... 257/330–370, 542–552; 438/415–425
See application file for complete search history.

(56) References Cited

U.S. PATENT DOCUMENTS 5,556,796 A * 9/1996 Garnett ............... H01L 21/8249
148/DIG. 9
7,795,100 B2 * 9/2010 Ema .................. H01L 21/82385
257/E21.156

(Continued)

FOREIGN PATENT DOCUMENTS

| JP | 2001-15695 A | 1/2001 |
| JP | 2002-134702 A | 5/2002 |
| JP | 2008-277320 A | 11/2008 |

*Primary Examiner* — Marc Armand
*Assistant Examiner* — Nelson Garces
(74) *Attorney, Agent, or Firm* — Westerman, Hattori, Daniels & Adrian, LLP

(57) ABSTRACT

There are included: forming element isolation regions in a semiconductor substrate; introducing a first impurity of a first conductivity type, to thereby form a first well and a second well of the first conductivity type; introducing a second impurity of a second conductivity type, to thereby form a third well of the second conductivity type and introducing the second impurity into a region between the first well and the second well, to thereby form a separation well of the second conductivity type; and further introducing a third impurity of the second conductivity type into the region between the first well and the second well.

11 Claims, 38 Drawing Sheets

(56) References Cited

U.S. PATENT DOCUMENTS

| | | | |
|---|---|---|---|
| 2003/0151109 A1* | 8/2003 | Taniguchi | H01L 21/82341 257/500 |
| 2008/0265328 A1 | 10/2008 | Suwa et al. | |
| 2010/0052052 A1* | 3/2010 | Lotfi | H01L 21/28518 257/336 |
| 2011/0233687 A1* | 9/2011 | Shima | H01L 21/82341 257/402 |
| 2012/0080754 A1* | 4/2012 | Ema | H01L 21/761 257/368 |
| 2012/0223391 A1* | 9/2012 | Fujita | H01L 21/82380 257/369 |

* cited by examiner

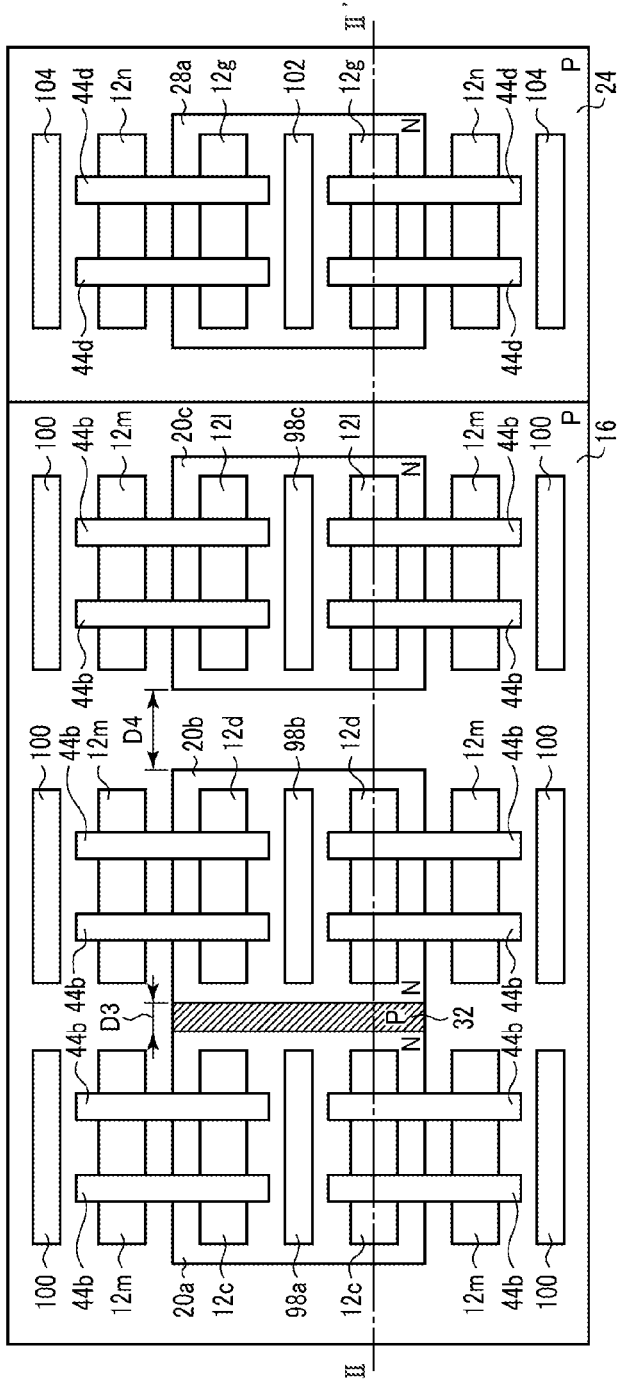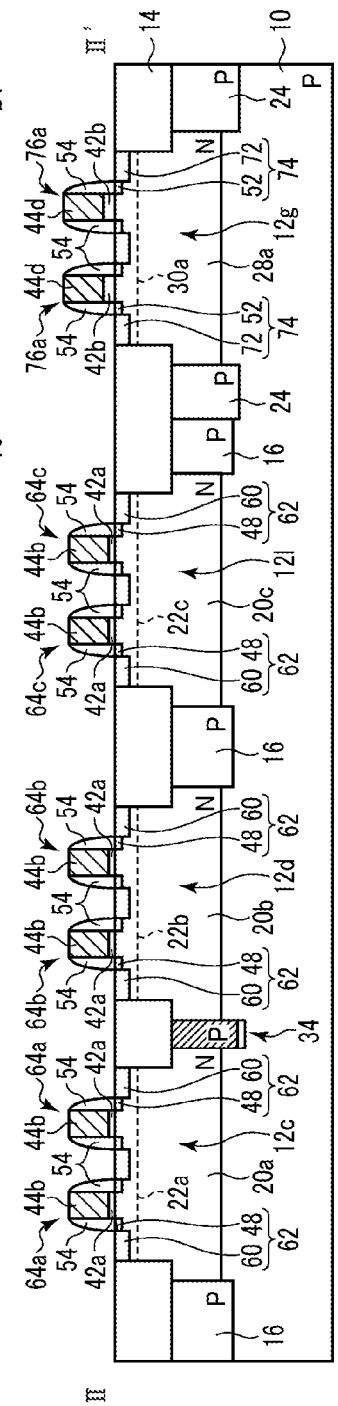
FIG. 3A
FIG. 3B

FIG. 4A
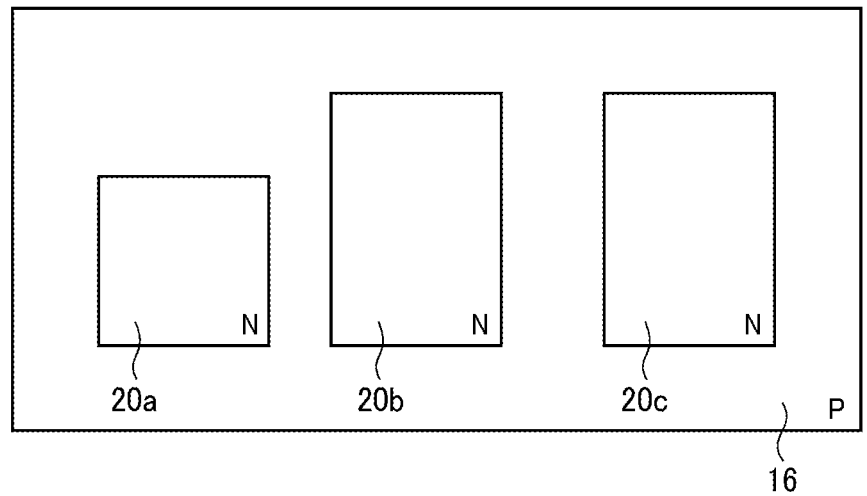
FIG. 4B
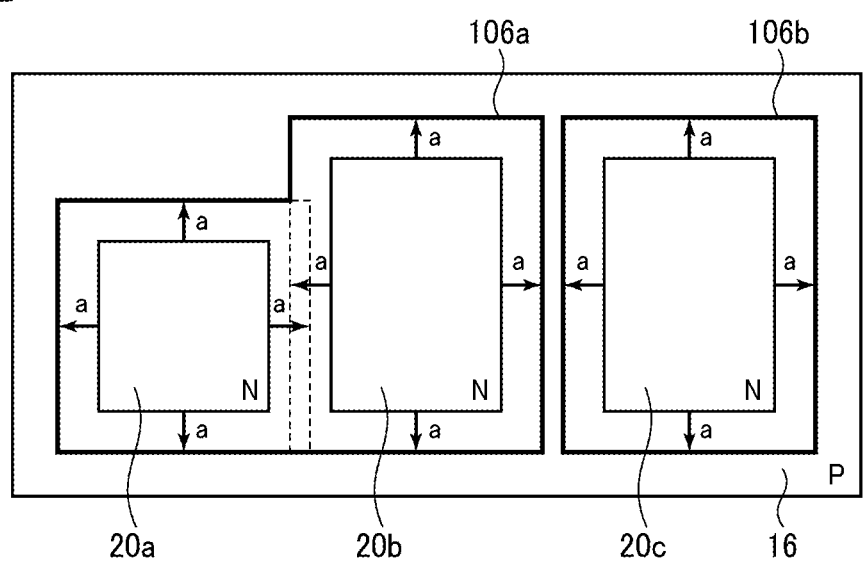
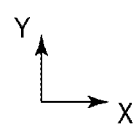

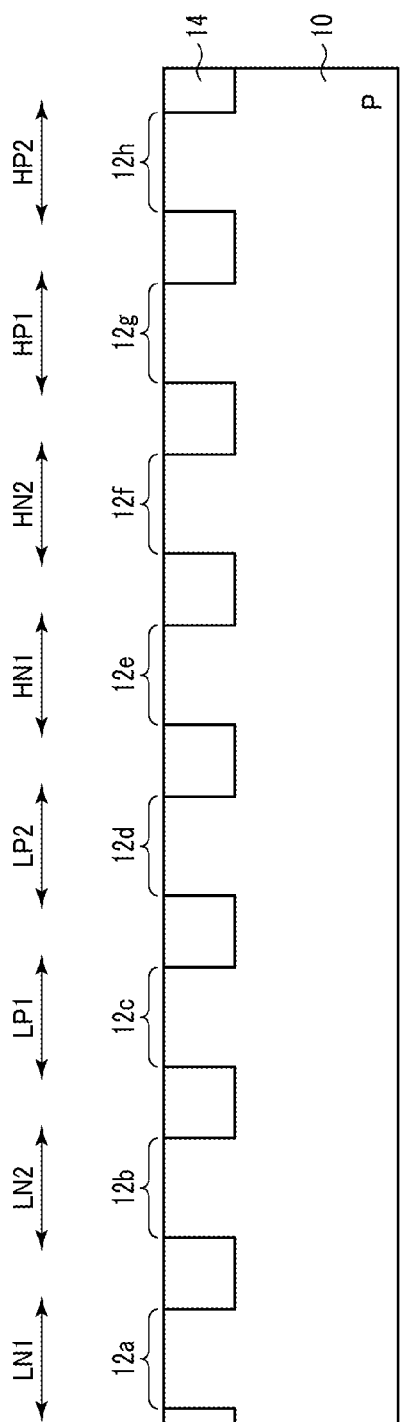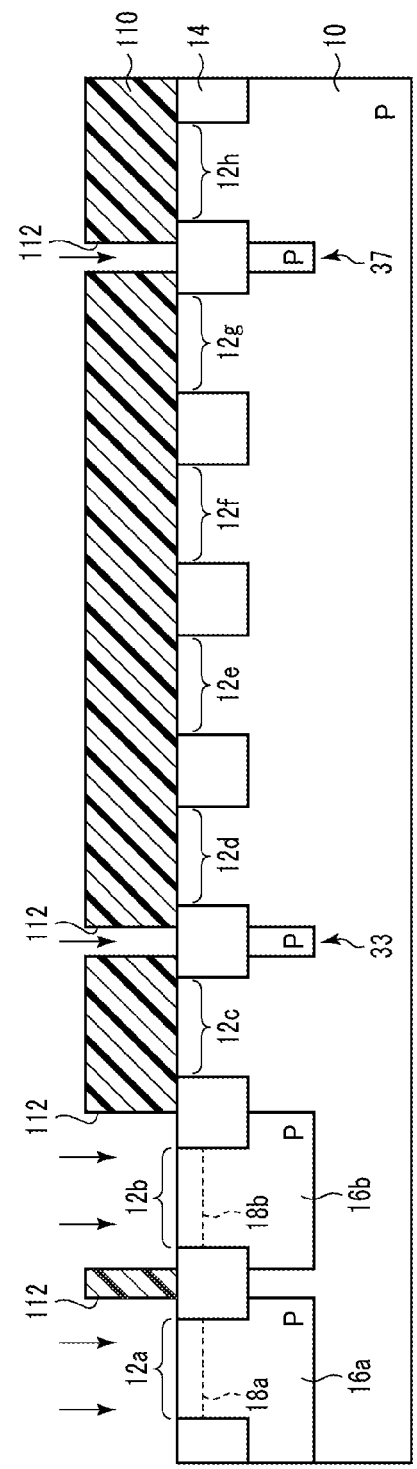

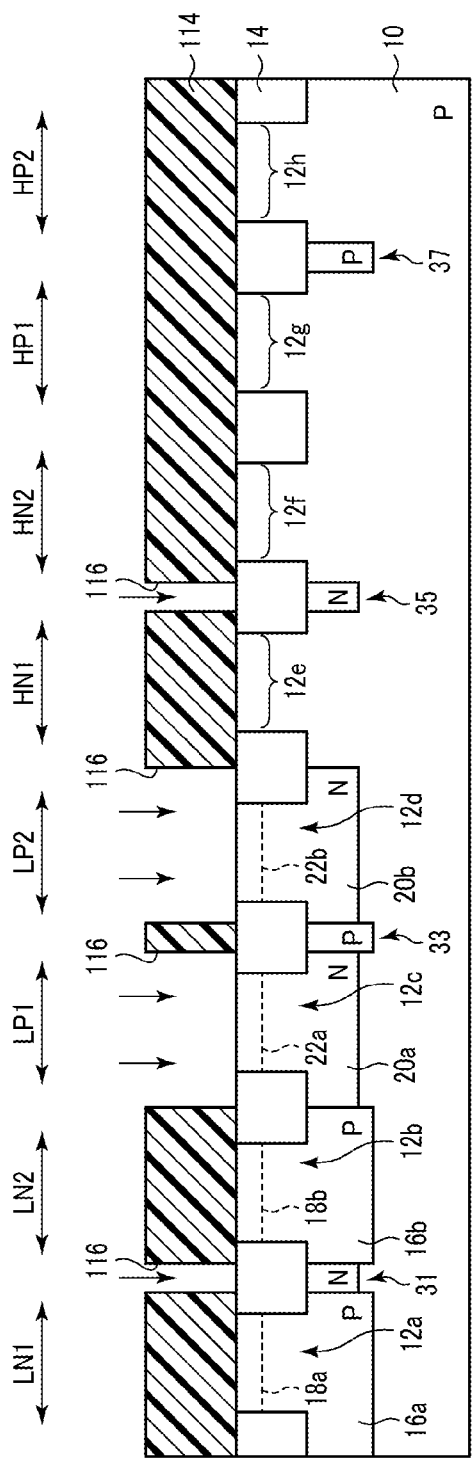
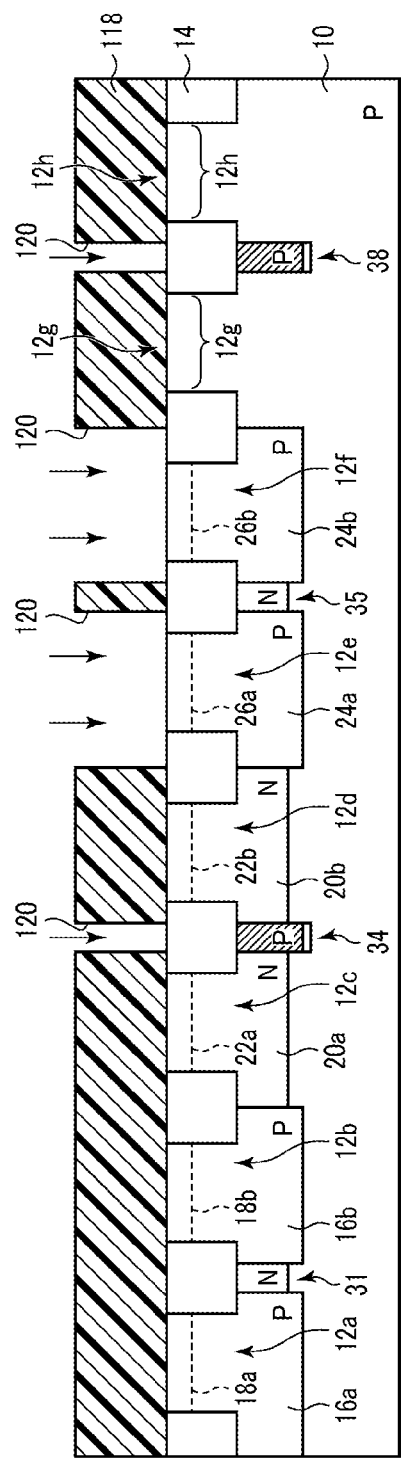
FIG. 12A
FIG. 12B

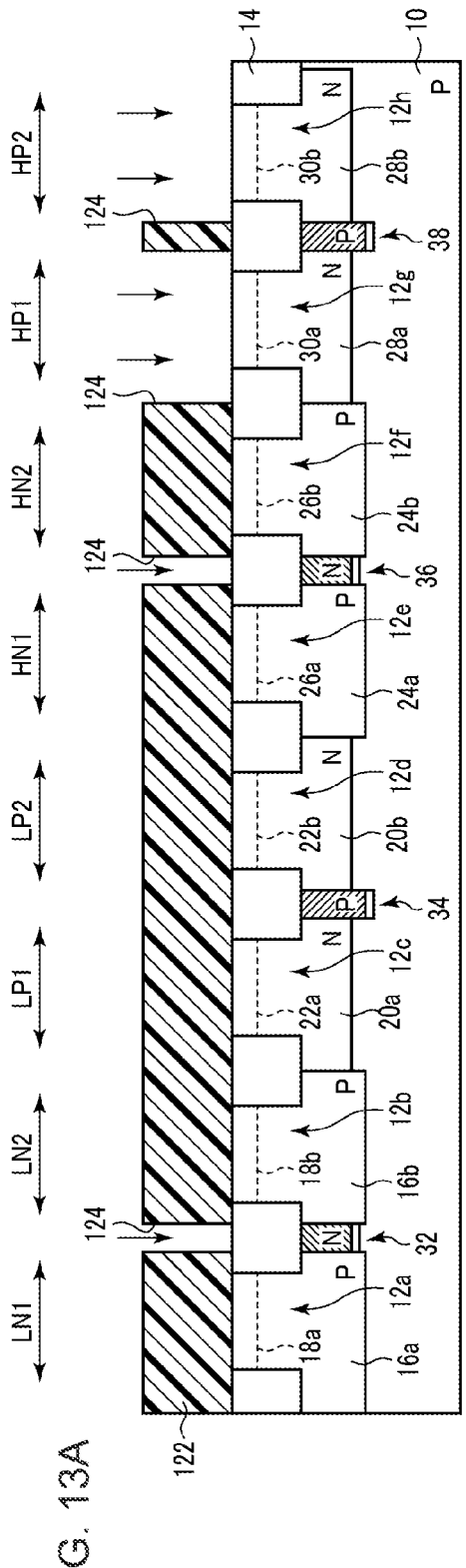
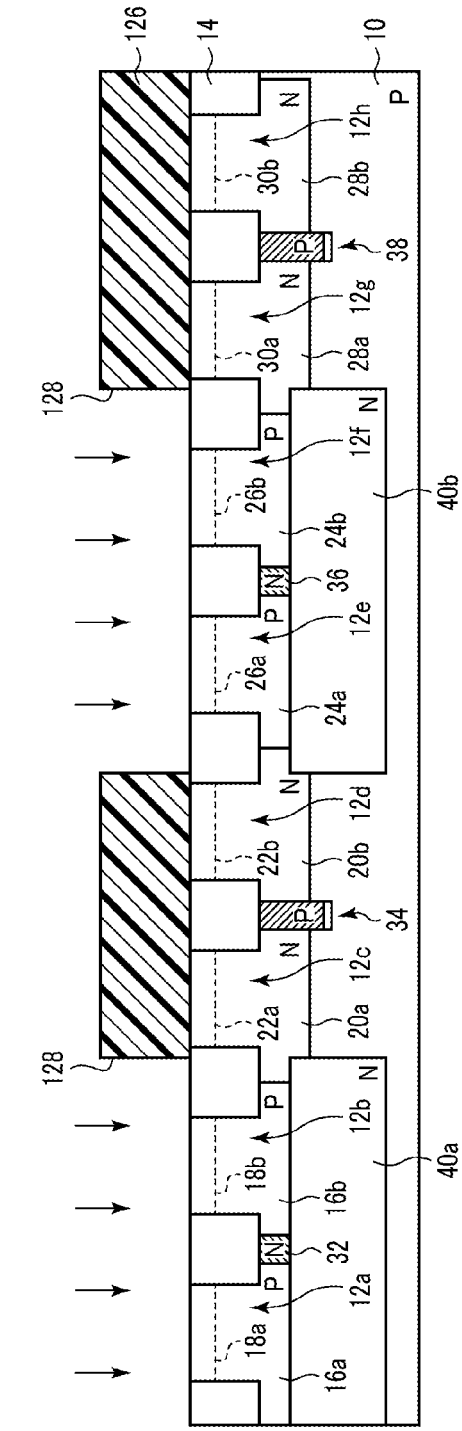

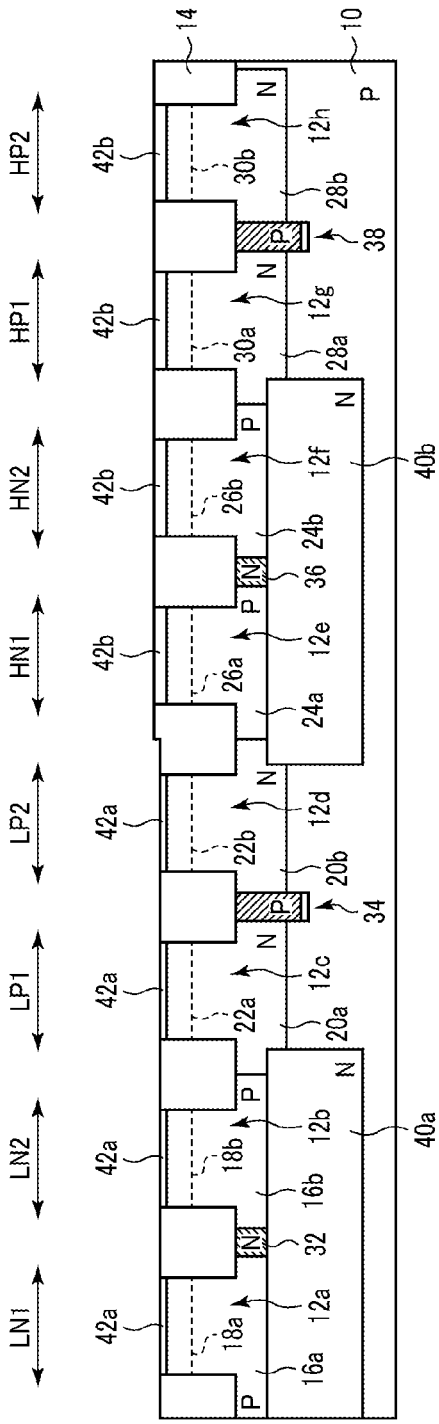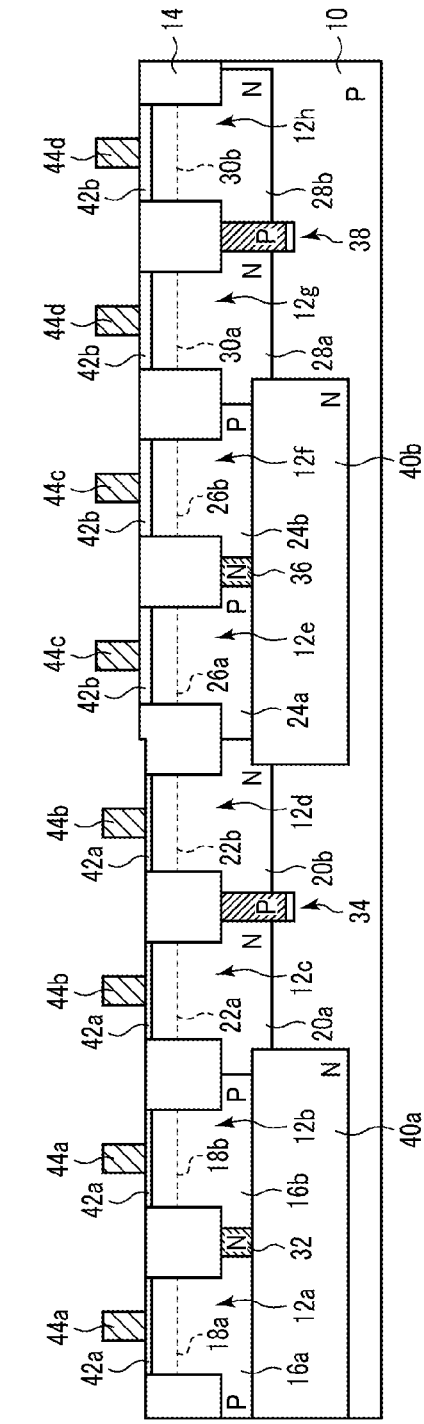
FIG. 14A
FIG. 14B

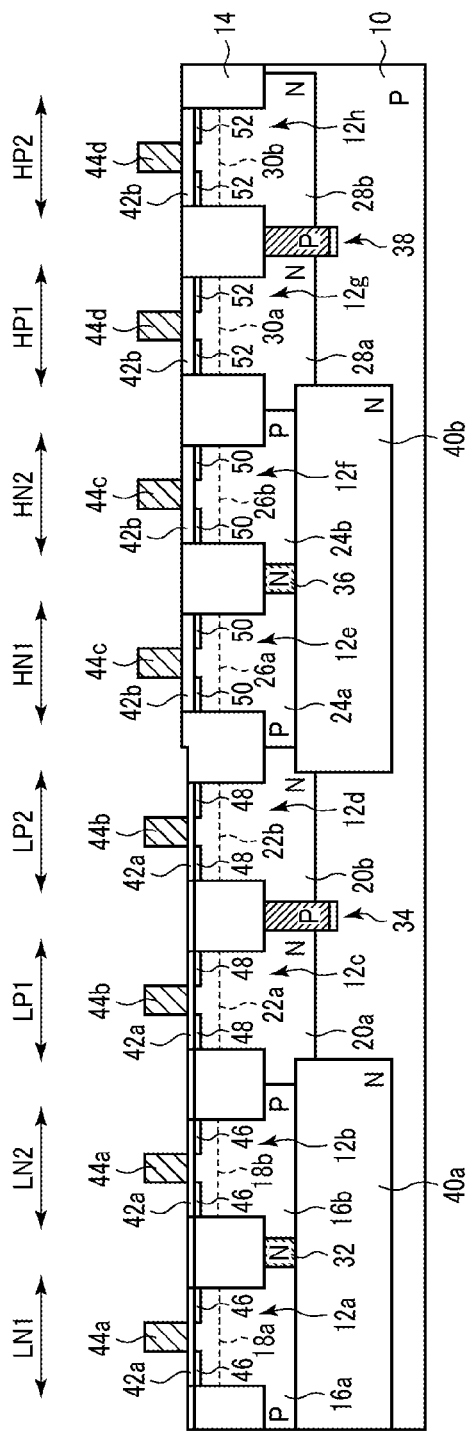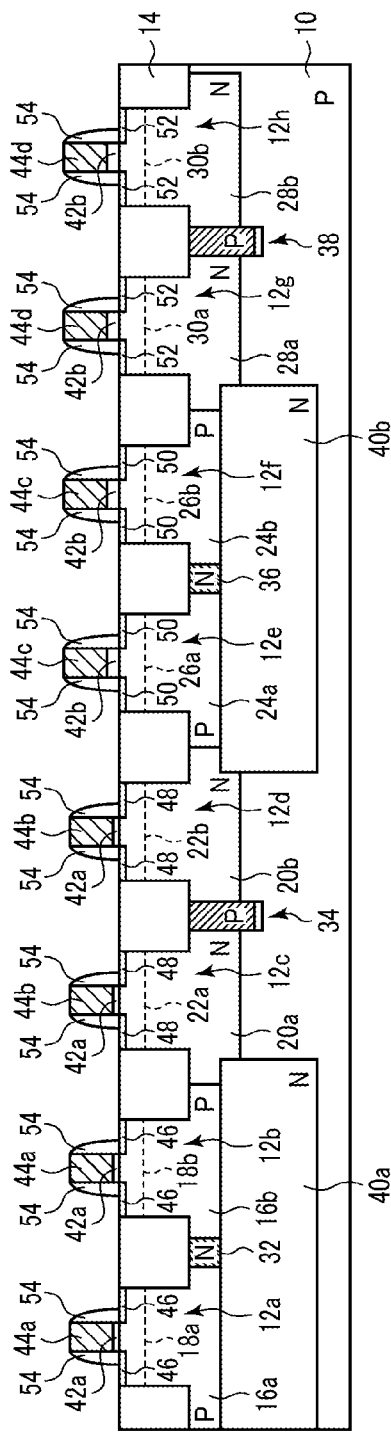
FIG. 15A
FIG. 15B

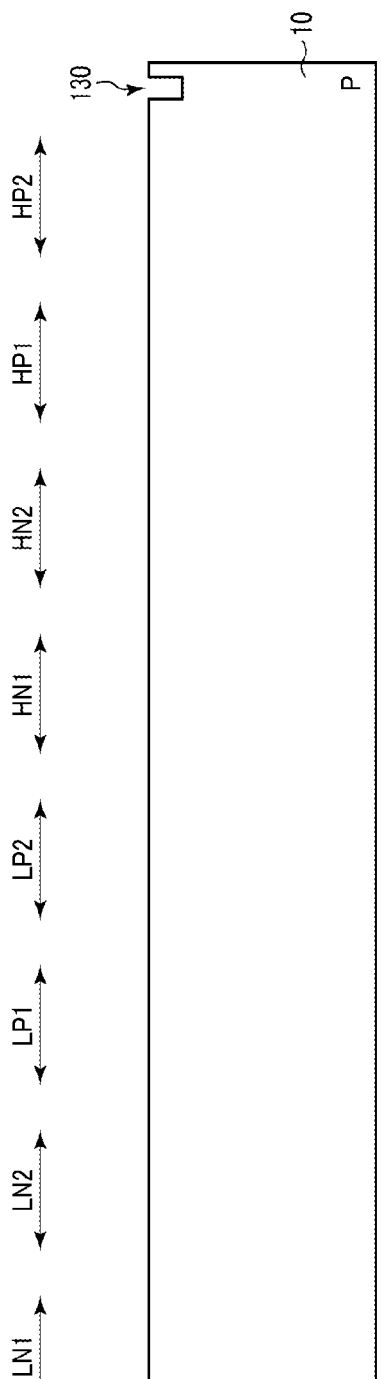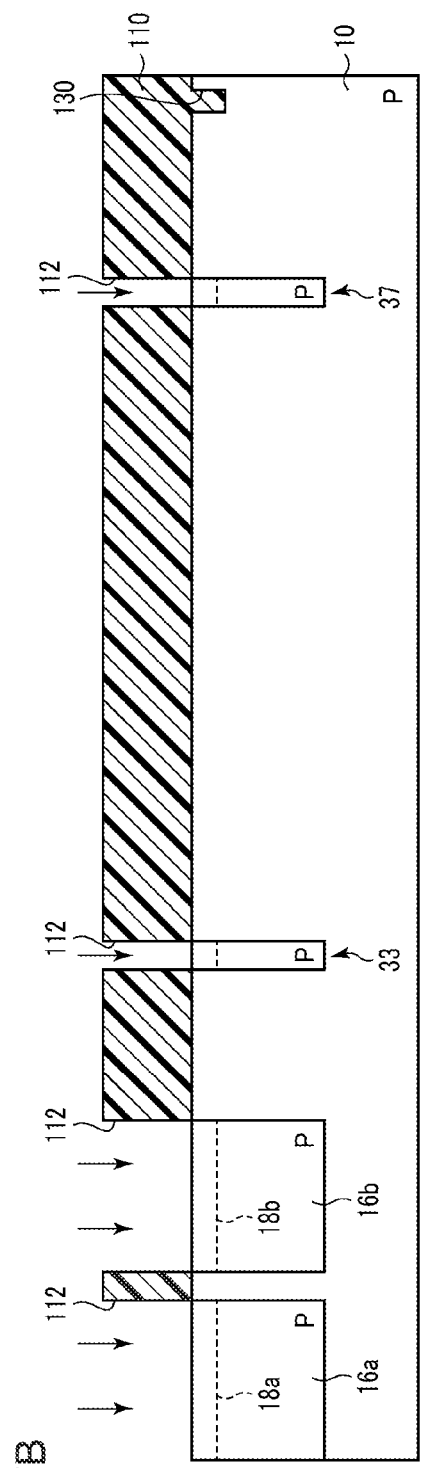

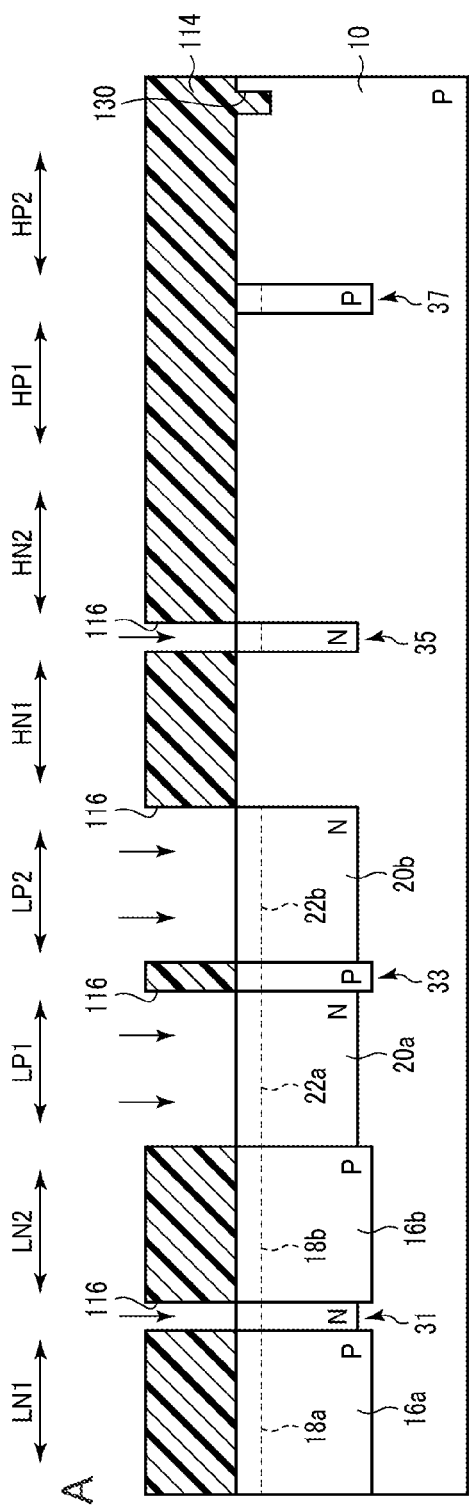
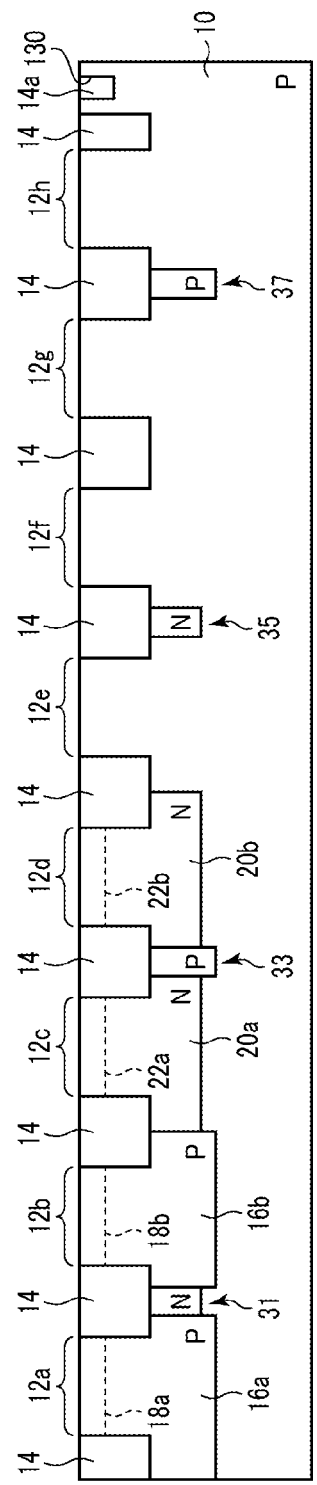

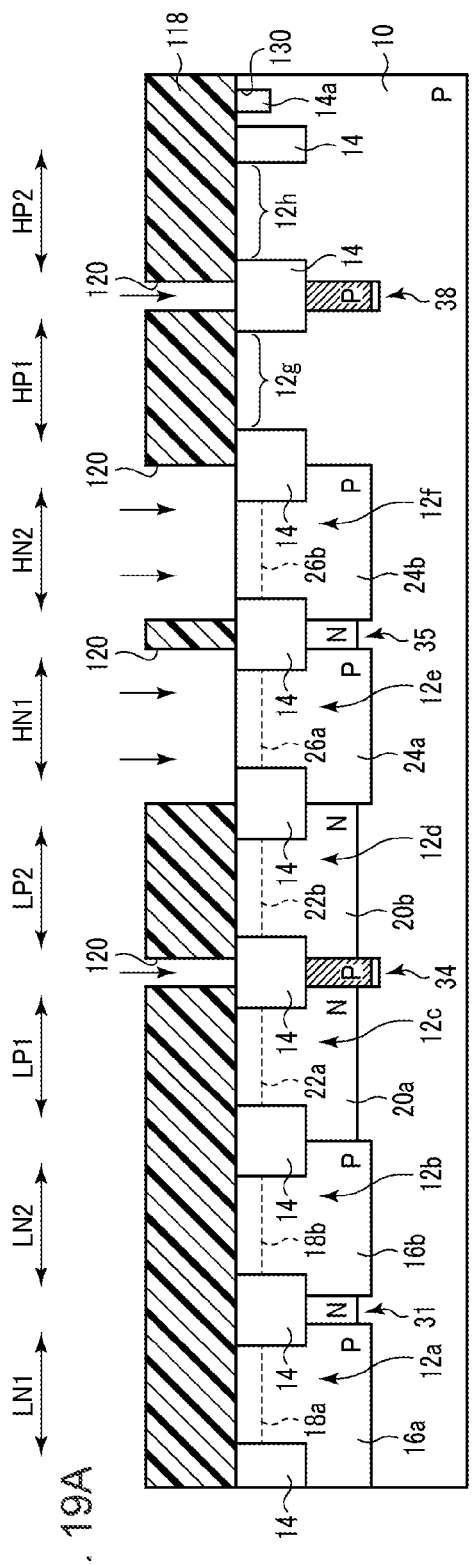
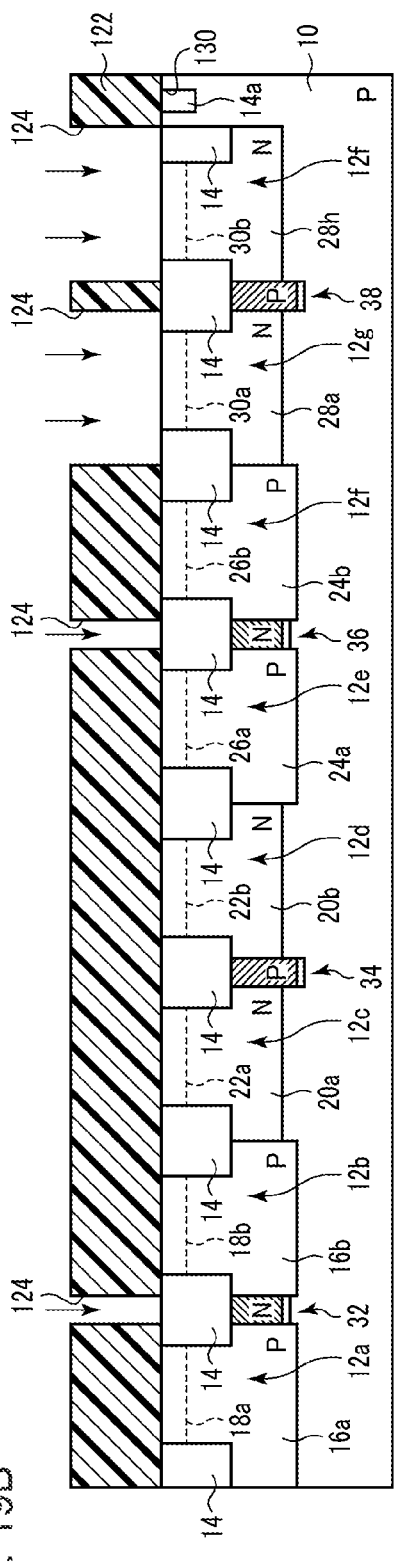
FIG. 19A
FIG. 19B

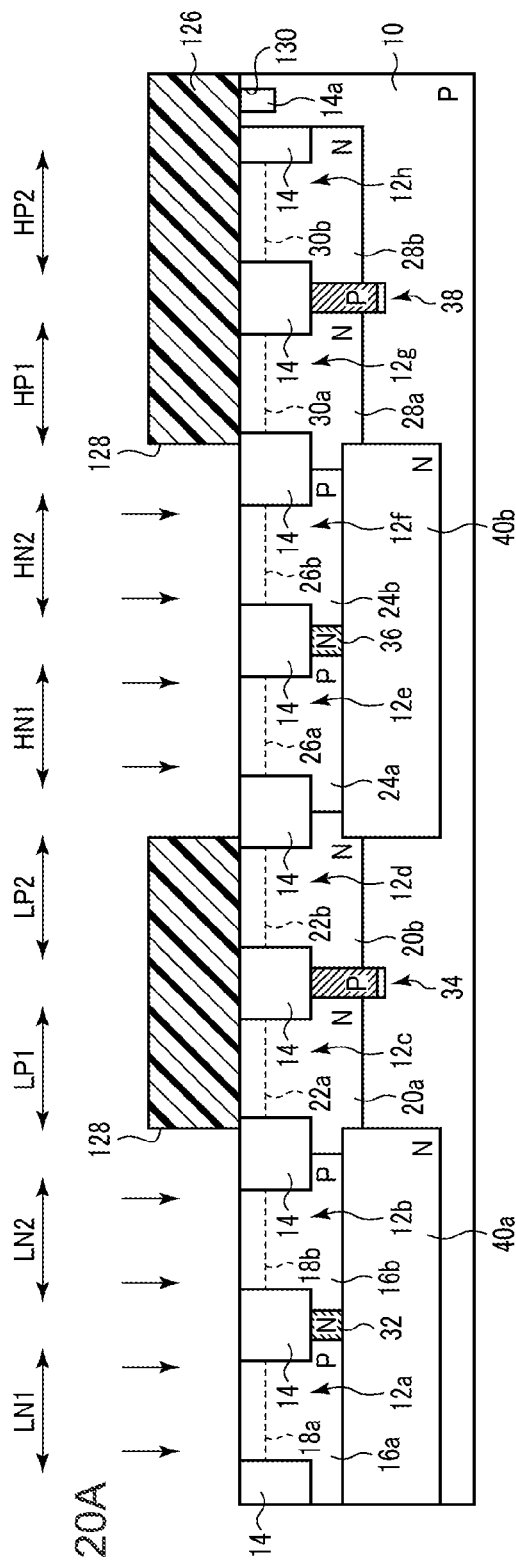

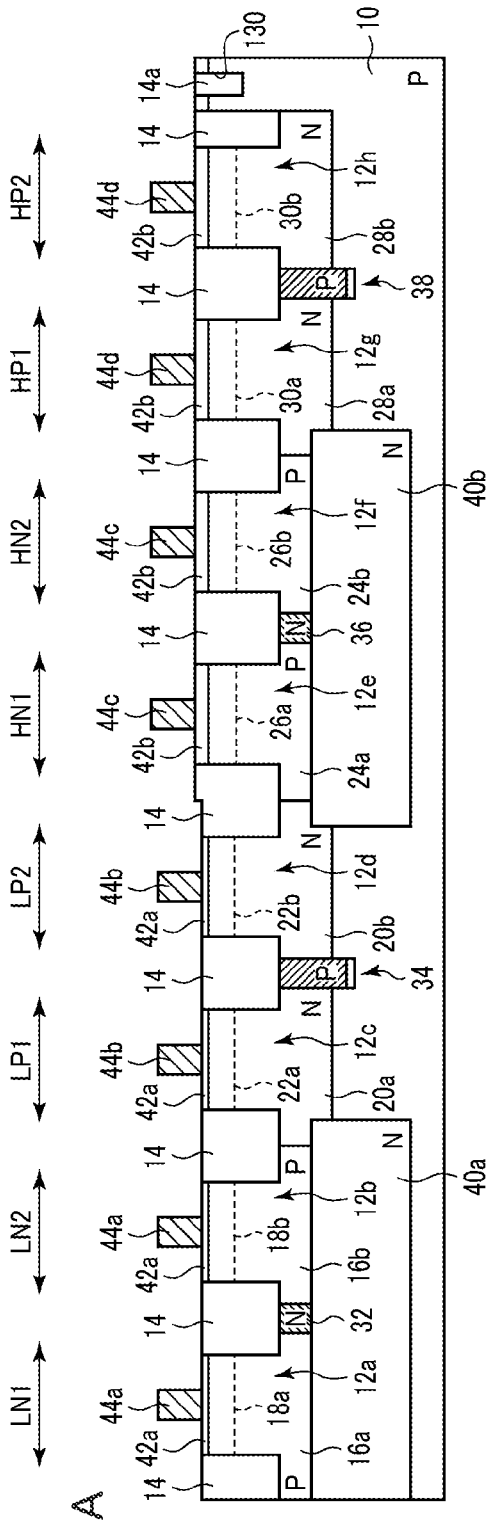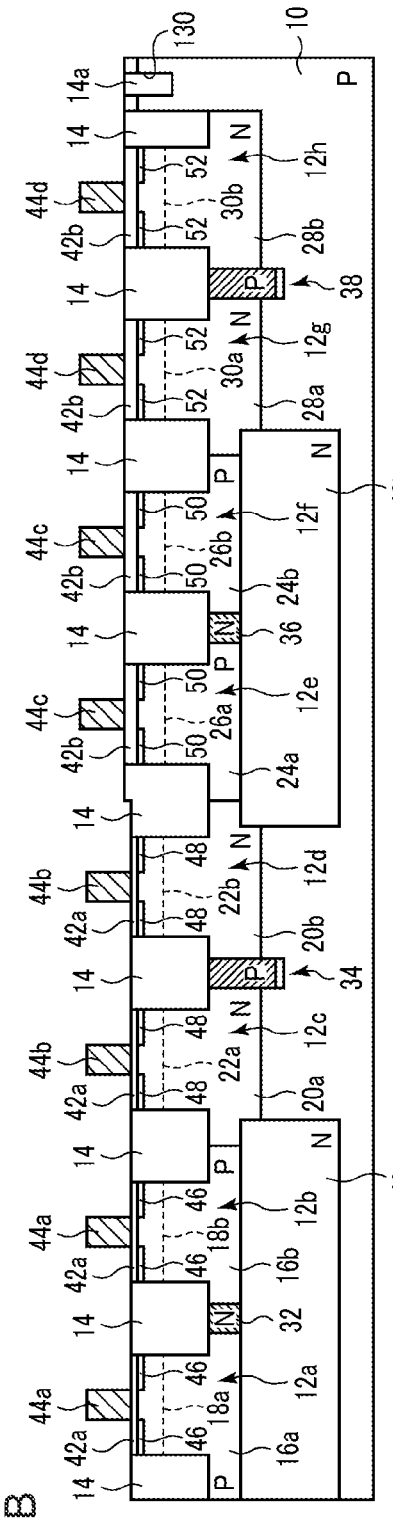
FIG. 21A
FIG. 21B

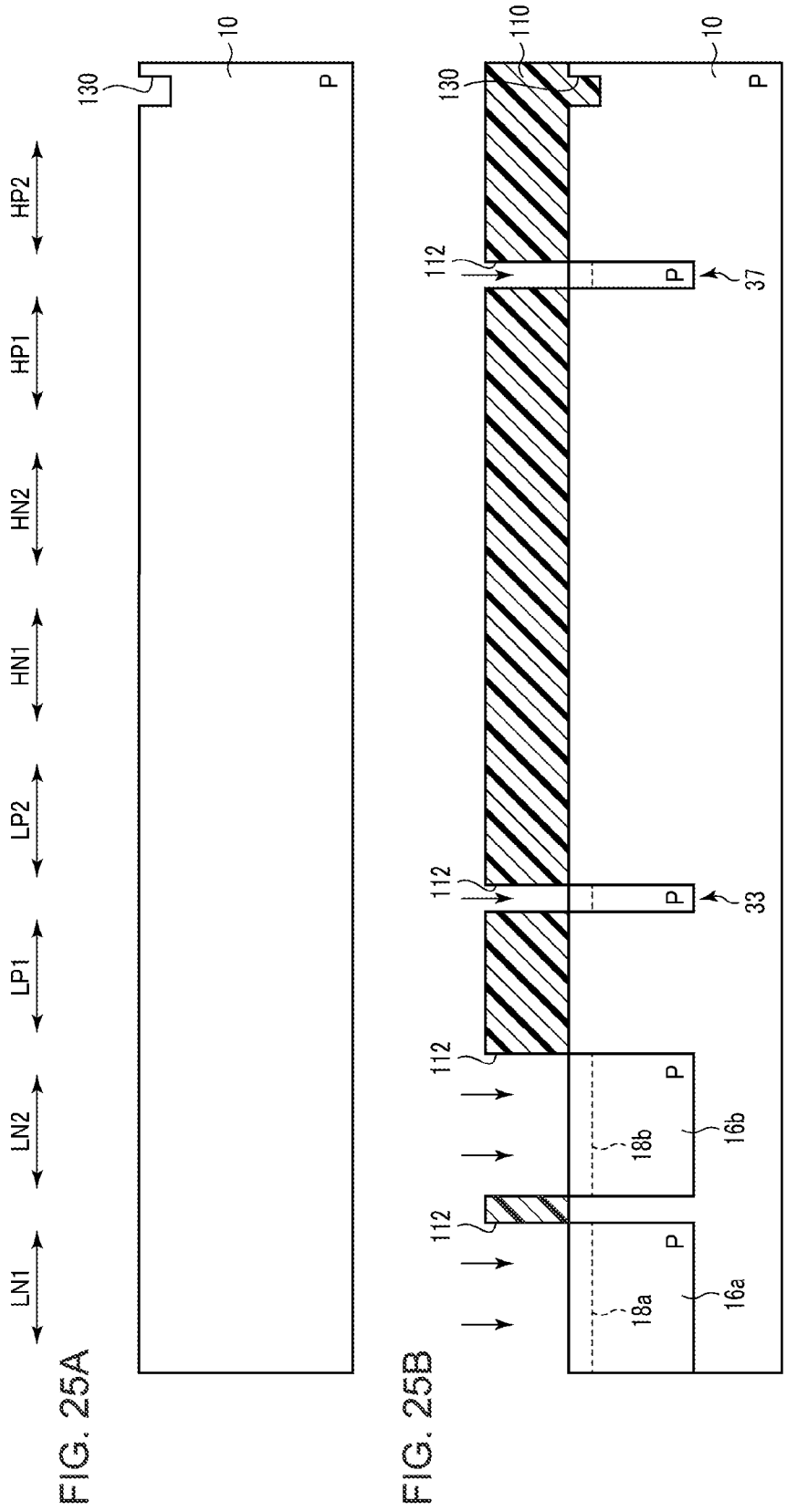

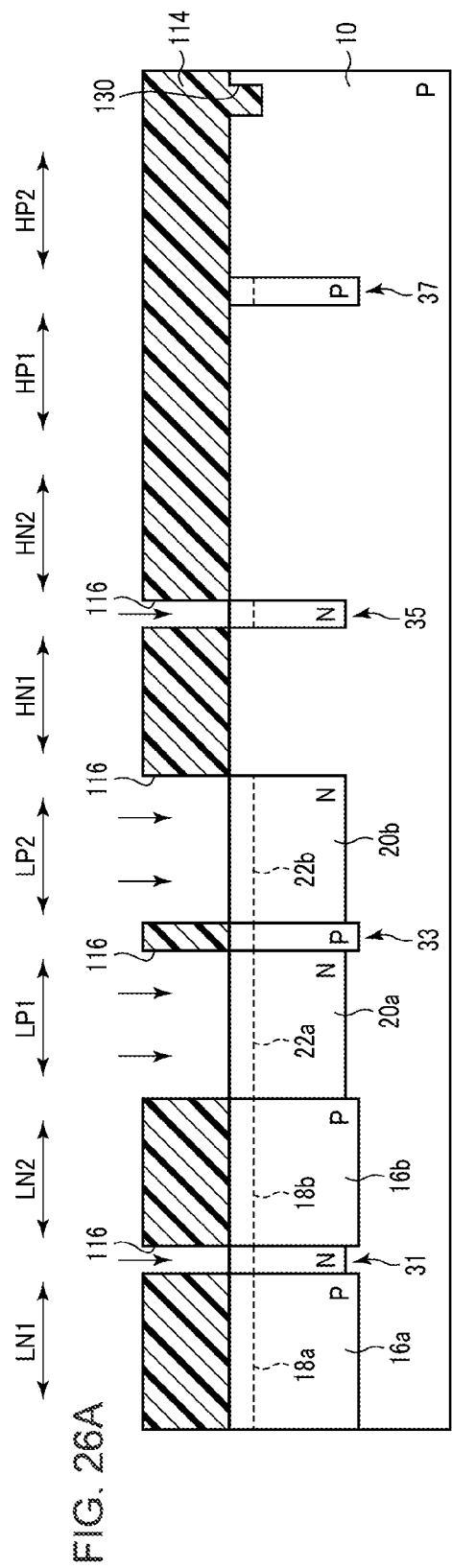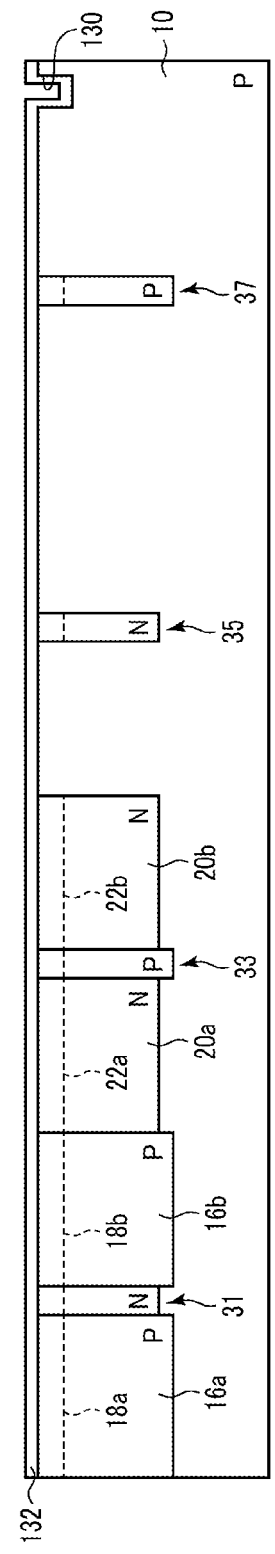

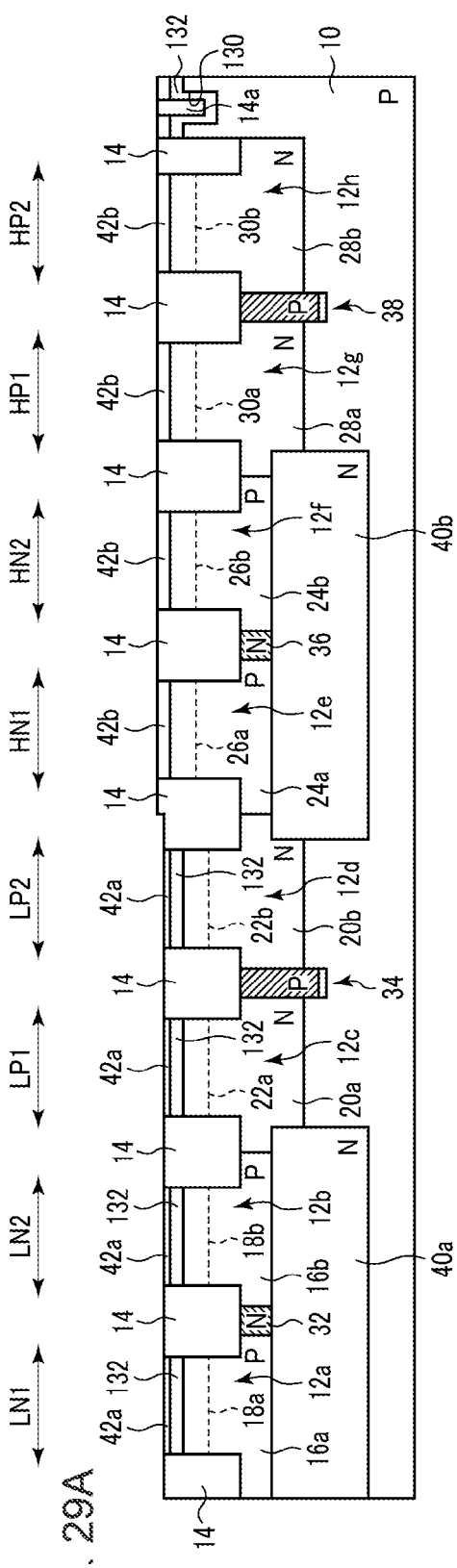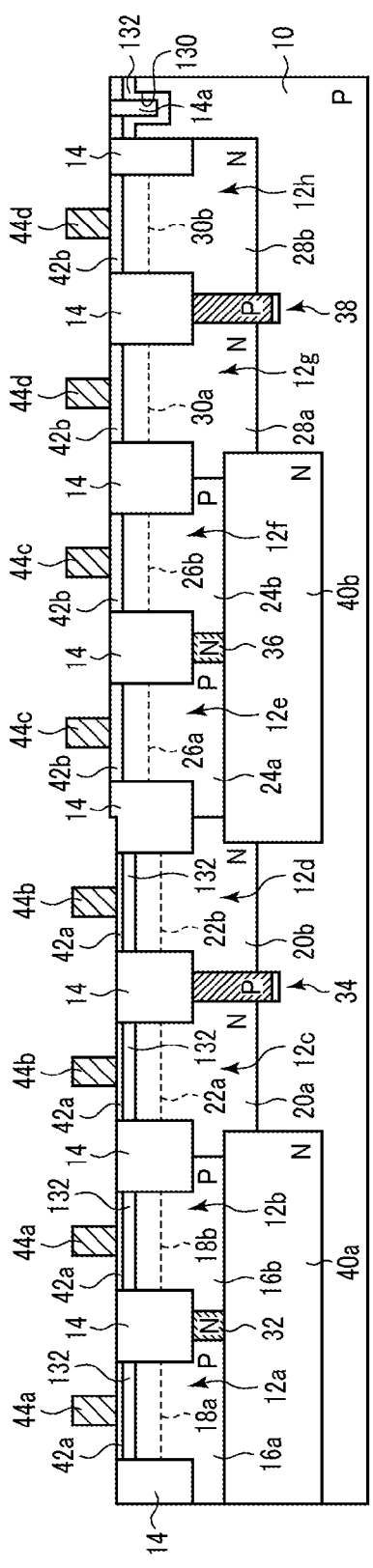

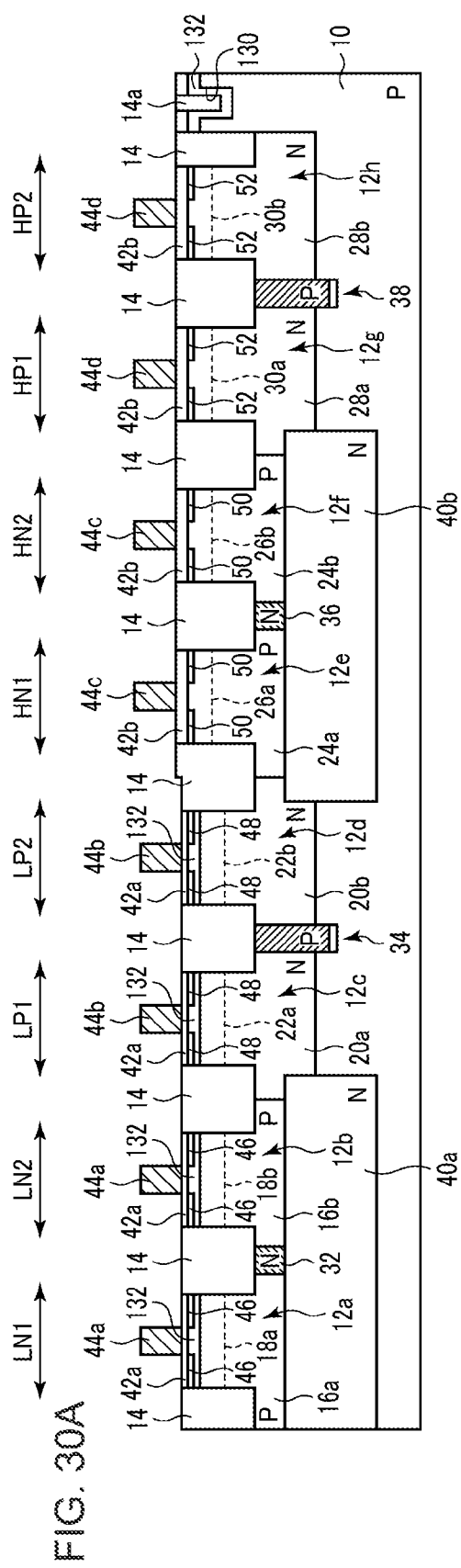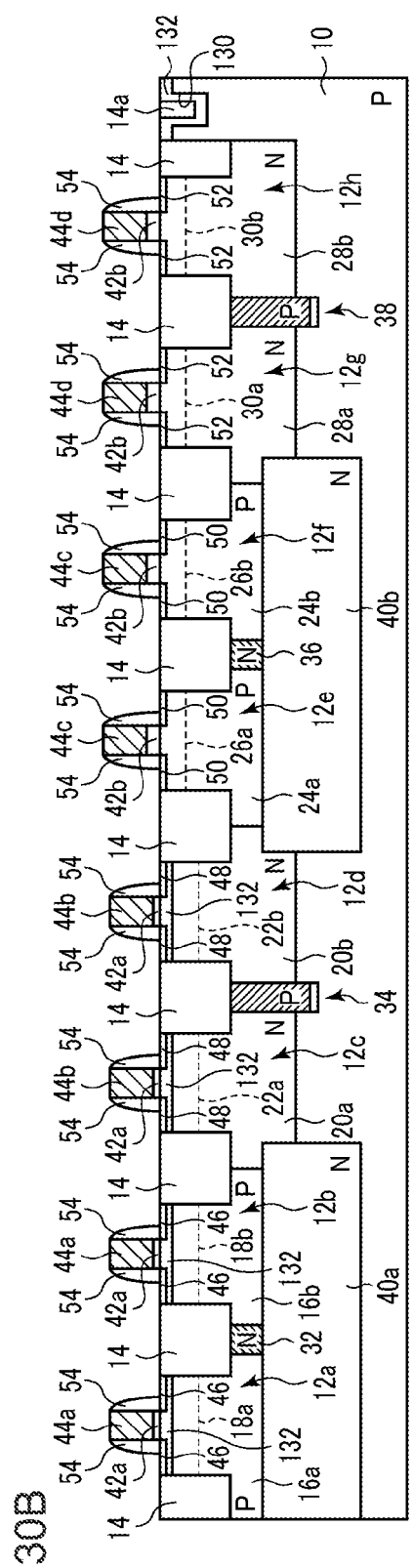

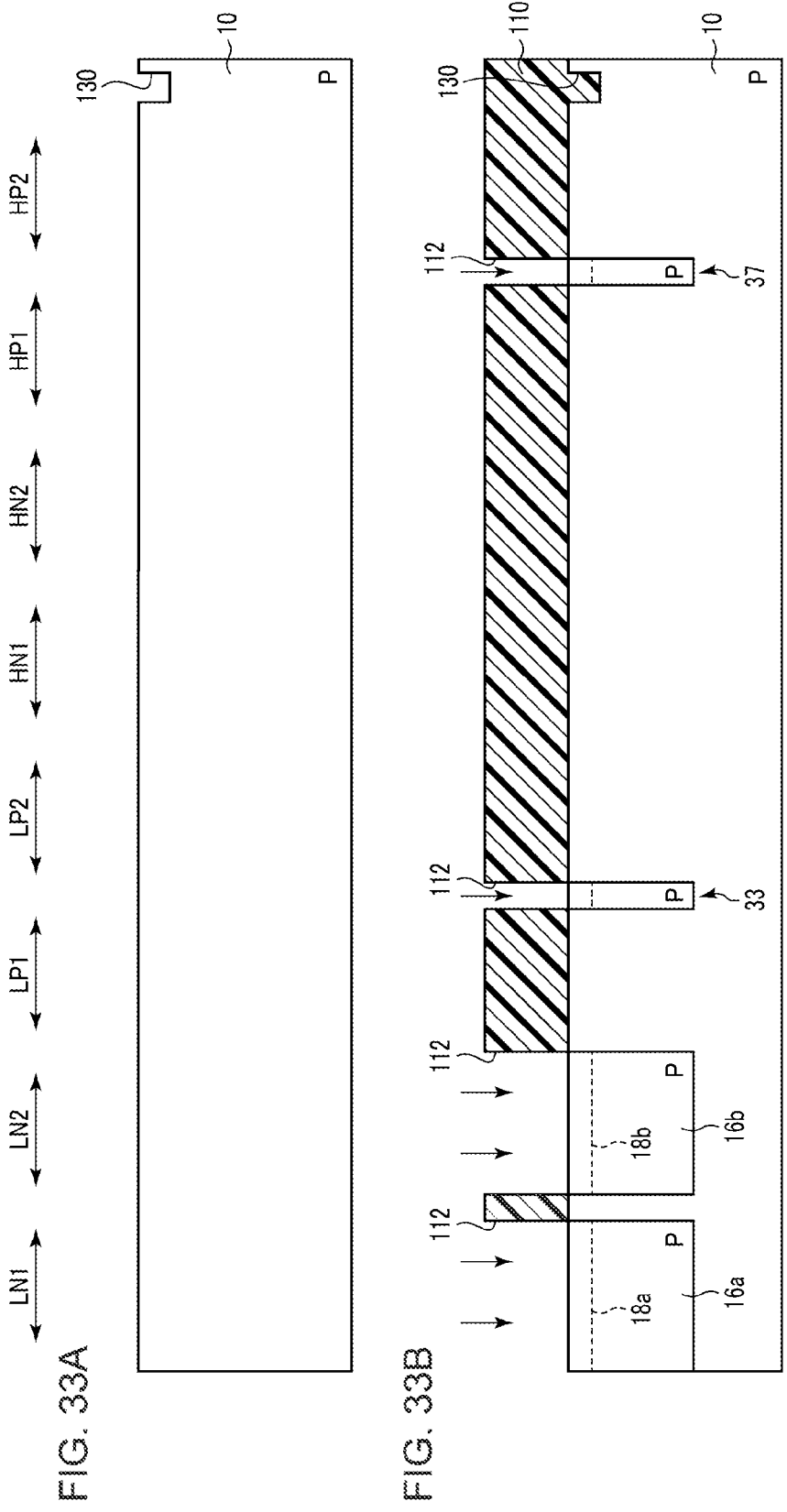

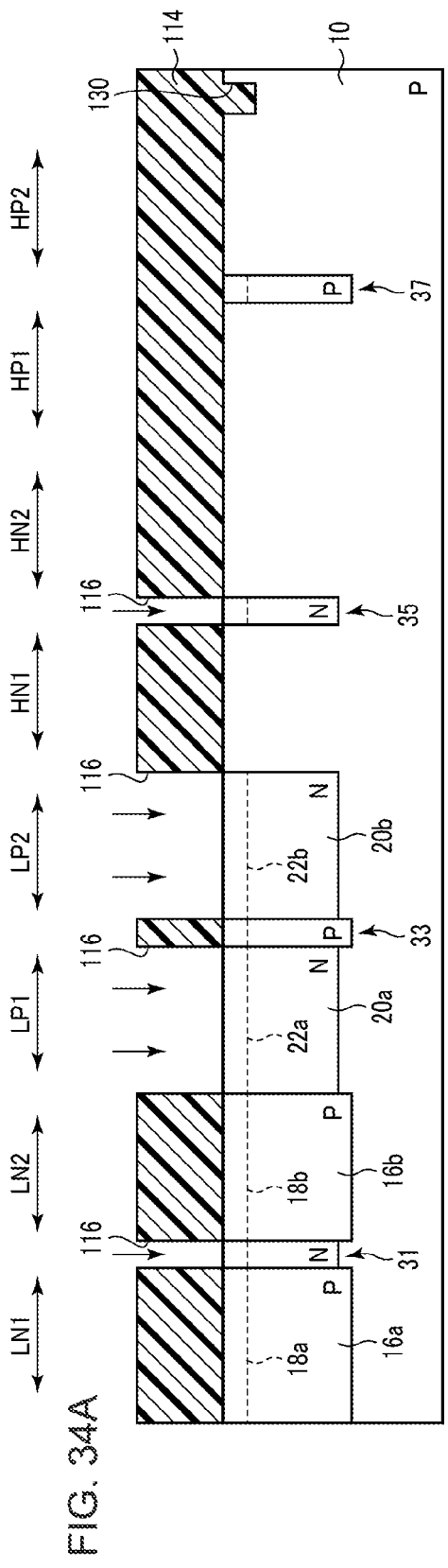
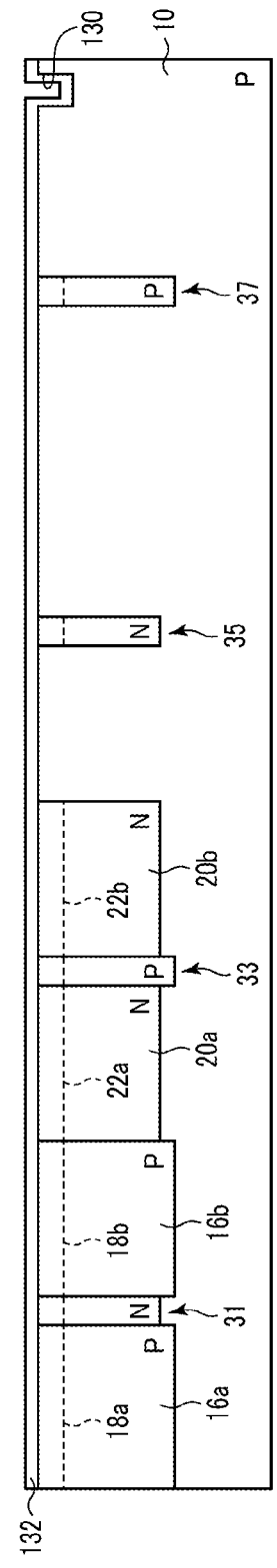

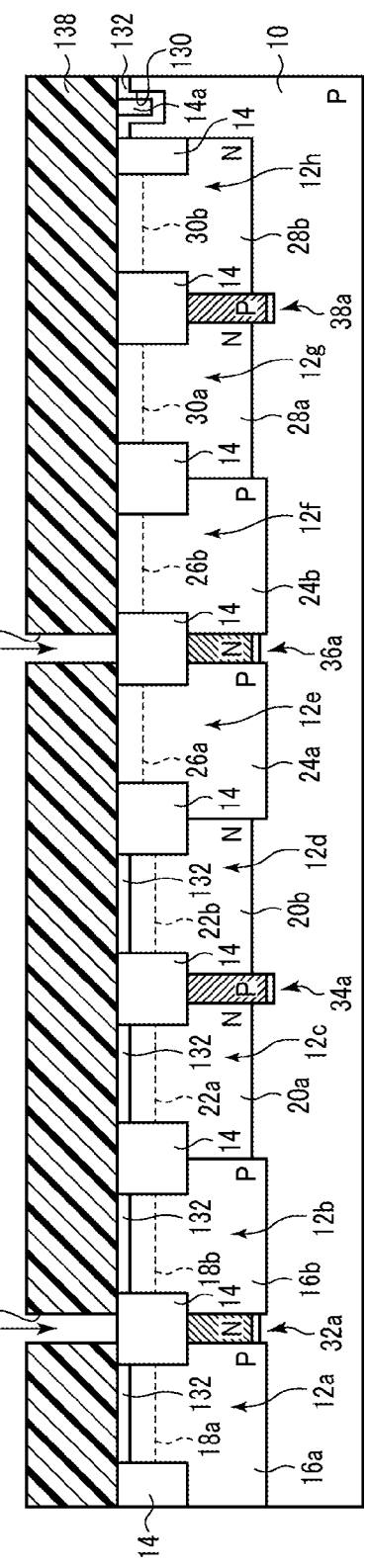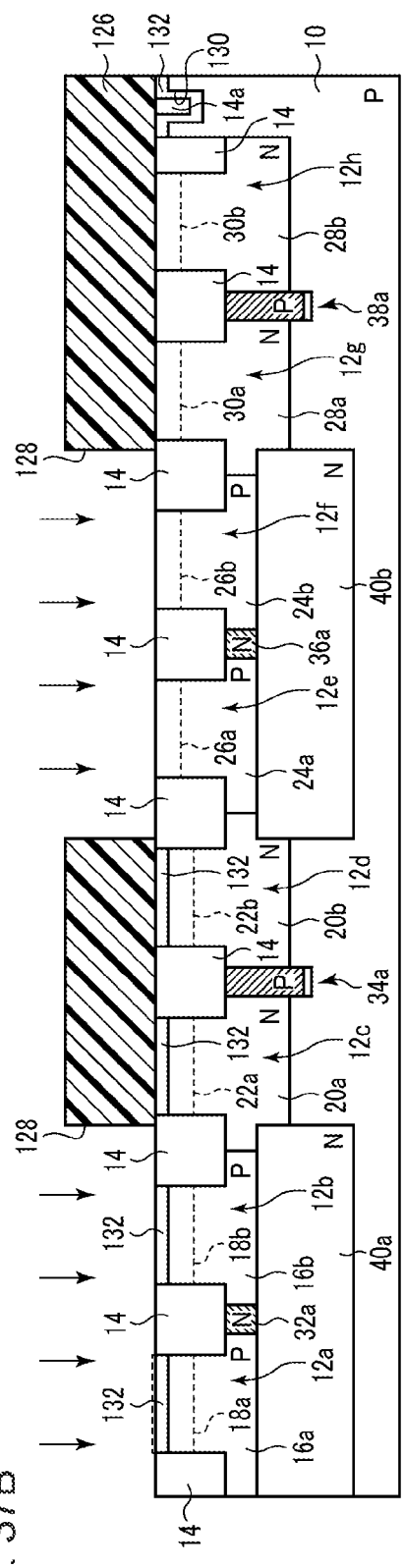

SEMICONDUCTOR DEVICE HAVING MULTIPLE WELLS FOR LOW- AND HIGH-VOLTAGE CMOS TRANSISTORS

CROSS-REFERENCE TO RELATED APPLICATION

This application is based upon and claims the benefit of priority of the prior Japanese Patent Application No. 2013-084813, filed on Apr. 15, 2013, the entire contents of which are incorporated herein by reference.

FIELD

The present embodiments discussed herein are directed to a semiconductor device and a manufacturing method thereof.

BACKGROUND

In recent years, there has been proposed to apply a bias voltage to a well where a transistor is formed.

By applying a bias voltage to a well where a transistor is formed, it is possible to adjust a threshold voltage of the transistor.

Further, there has been also proposed to apply bias voltages different from each other to wells of the same conductivity type that are electrically separated from each other.

[Patent Document 1] Japanese Laid-open Patent Publication No. 2008-277320

[Patent Document 2] Japanese Laid-open Patent Publication No. 2001-15695

[Patent Document 3] Japanese Laid-open Patent Publication No. 2002-134702

However, when the distance between the wells to which bias voltages different from each other are applied is made small in order to achieve miniaturization of a semiconductor device, a large leak current flows.

SUMMARY

According to one aspect of the embodiments, there is provided a manufacturing method of a semiconductor device including: forming element isolation regions demarcating element regions in a semiconductor substrate; introducing a first impurity of a first conductivity type into a first region of the semiconductor substrate, to thereby form a first well of the first conductivity type and introducing the first impurity into a second region of the semiconductor substrate, to thereby form a second well of the first conductivity type; introducing a second impurity of a second conductivity type being a conductivity type opposite to the first conductivity type into a third region of the semiconductor substrate, to thereby form a third well of the second conductivity type and introducing the second impurity into a fourth region of the semiconductor substrate between the first well and the second well, to thereby form a first separation well of the second conductivity type; and introducing a third impurity of the second conductivity type into the fourth region.

According to another aspect of the embodiments, there is provided a semiconductor device including: element isolation regions that are formed in a semiconductor substrate and demarcate element regions; a first well of a first conductivity type that is formed in the semiconductor substrate; a second well of the first conductivity type that is formed in the semiconductor substrate; a third well of a second conductivity type being a conductivity type opposite to the first conductivity type that is formed in the semiconductor substrate; a fourth well of the second conductivity type that is formed in the semiconductor substrate; and a first separation well of the second conductivity type that is formed under the element isolation region in a region between the first well and the second well, in which the concentration of an impurity of the second conductivity type in the first separation well at a first depth deeper than a bottom surface of the element isolation region and shallower than a bottom surface of the first well is equal to the sum of the concentration of an impurity of the second conductivity type in the third well at the first depth and the concentration of an impurity of the second conductivity type in the fourth well at the first well.

According to still another aspect of the embodiments, there is provided a semiconductor device including: element isolation regions that are formed in a semiconductor substrate and demarcate element regions; a first well of a first conductivity type that is formed in the semiconductor substrate; a second well of the first conductivity type that is formed in the semiconductor substrate; a plurality of wells of a second conductivity type being a conductivity type opposite to the first conductivity type that is formed in the semiconductor substrate; and a separation well that is a separation well of the second conductivity type that is formed under the element isolation region in a region between the first well and the second well and has a concentration of an impurity of the second conductivity type higher than that in the well that has the highest concentration of an impurity of the second conductivity type of the plural wells of the second conductivity type.

According to still another aspect of the embodiments, there is provided a semiconductor device including: element isolation regions that are formed in a semiconductor substrate and demarcate element regions; a first well of a first conductivity type that is formed in the semiconductor substrate; a second well of the first conductivity type that is formed in the semiconductor substrate; a third well of a second conductivity type being a conductivity type opposite to the first conductivity type that is formed in the semiconductor substrate; a fourth well of the second conductivity type that is formed in the semiconductor substrate; and a separation well of the second conductivity type that is formed under the element isolation region in a region between the first well and the second well, in which the concentration of an impurity of the second conductivity type in the separation well at a first depth deeper than a bottom surface of the element isolation region and shallower than a bottom surface of the first well is higher than the sum of the concentration of an impurity of the second conductivity type in the third well at the first depth and the concentration of an impurity of the second conductivity type in the fourth well at the first well.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 3A and FIG. 3B are a plan view and a cross-sectional view each illustrating part of the semiconductor device according to the first embodiment (part 2);

FIG. 4A and FIG. 4B are plan views each illustrating an example of a generating method of a separation well pattern (part 1);

FIG. 11A and FIG. 11B are process cross-sectional views each illustrating a manufacturing method of the semiconductor device according to the first embodiment (part 1);

FIG. 12A and FIG. 12B are process cross-sectional views each illustrating the manufacturing method of the semiconductor device according to the first embodiment (part 2);

FIG. 13A and FIG. 13B are process cross-sectional views each illustrating the manufacturing method of the semiconductor device according to the first embodiment (part 3);

FIG. 14A and FIG. 14B are process cross-sectional views each illustrating the manufacturing method of the semiconductor device according to the first embodiment (part 4);

FIG. 15A and FIG. 15B are process cross-sectional views each illustrating the manufacturing method of the semiconductor device according to the first embodiment (part 5);

FIG. 17A and FIG. 17B are process cross-sectional views each illustrating a manufacturing method of a semiconductor device according to a second embodiment (part 1);

FIG. 18A and FIG. 18B are process cross-sectional views each illustrating the manufacturing method of the semiconductor device according to the second embodiment (part 2);

FIG. 19A and FIG. 19B are process cross-sectional views each illustrating the manufacturing method of the semiconductor device according to the second embodiment (part 3);

FIG. 20A and FIG. 20B are process cross-sectional views each illustrating the manufacturing method of the semiconductor device according to the second embodiment (part 4);

FIG. 21A and FIG. 21B are process cross-sectional views each illustrating the manufacturing method of the semiconductor device according to the second embodiment (part 5);

FIG. 22A and FIG. 22B are process cross-sectional views each illustrating the manufacturing method of the semiconductor device according to the second embodiment (part 6);

FIG. 25A and FIG. 25B are process cross-sectional views each illustrating a manufacturing method of the semiconductor device according to the third embodiment (part 1);

FIG. 26A and FIG. 26B are process cross-sectional views each illustrating the manufacturing method of the semiconductor device according to the third embodiment (part 2);

FIG. 28A and FIG. 28B are process cross-sectional views each illustrating the manufacturing method of the semiconductor device according to the third embodiment (part 4);

FIG. 29A and FIG. 29B are process cross-sectional views each illustrating the manufacturing method of the semiconductor device according to the third embodiment (part 5);

FIG. 30A and FIG. 30B are process cross-sectional views each illustrating the manufacturing method of the semiconductor device according to the third embodiment (part 6);

FIG. 33A and FIG. 33B are process cross-sectional views each illustrating a manufacturing method of the semiconductor device according to the fourth embodiment (part 1);

FIG. 34A and FIG. 34B are process cross-sectional views each illustrating the manufacturing method of the semiconductor device according to the fourth embodiment (part 2);

FIG. 35A and FIG. 35B are process cross-sectional views each illustrating the manufacturing method of the semiconductor device according to the fourth embodiment (part 3);

FIG. 36A and FIG. 36B are process cross-sectional views each illustrating the manufacturing method of the semiconductor device according to the fourth embodiment (part 4);

FIG. 37A and FIG. 37B are process cross-sectional views each illustrating the manufacturing method of the semiconductor device according to the fourth embodiment (part 5);

DESCRIPTION OF EMBODIMENTS

Figure 39A:
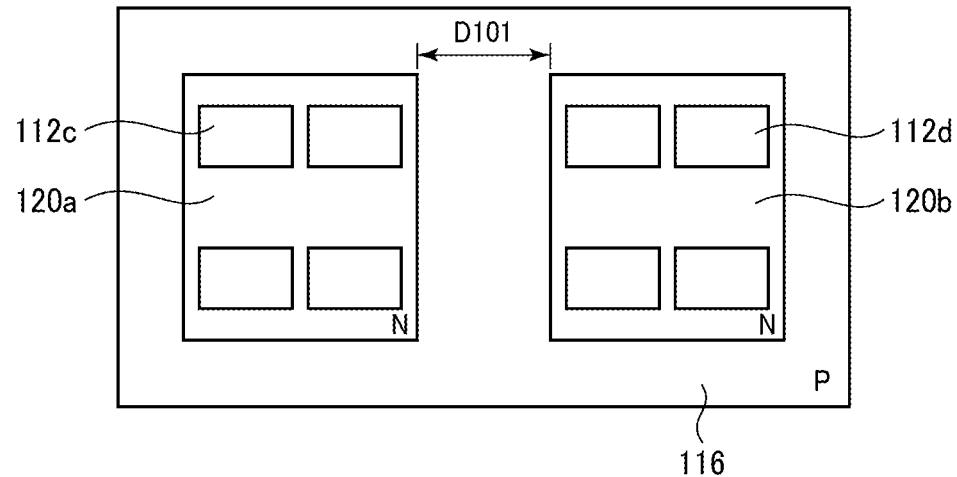
FIG. 39A and FIG. 39B are plan views each illustrating a semiconductor device according to a reference example.
Figure 39B:
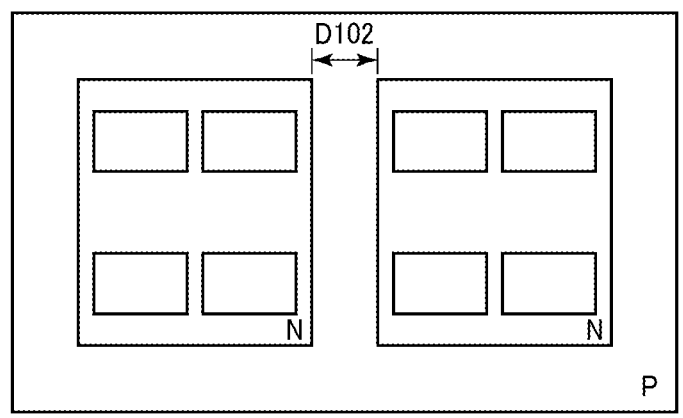

FIG. 39A and FIG. 39B are plan views each illustrating a semiconductor device according to a reference example.

As illustrated in FIG. 39A, for example, in a P-type semiconductor substrate (not illustrated), element regions (active regions) 112c and 112d demarcated by element isolation regions (not illustrated) are formed. In a region including the element regions 112c and a region including the element regions 112d, an N-type well 120a and an N-type well 120b are formed respectively, for example. A P-type well 116 is formed so as to surround the N-type wells 120a and 120b. The P-type well 116 exists around the periphery of the N-type well 120a, and the P-type semiconductor substrate exists under the N-type well 120a. Further, the P-type well 116 exists around the periphery of the N-type well 120b, and the P-type semiconductor substrate exists under the N-type well 120b. Therefore, the N-type well 120a and the N-type well 120b are electrically separated. Bias voltages different from each other are sometimes applied to the N-type well 120a and the N-type well 120b.

When a distance D102 between an N-type well 120a and an N-type well 120b is set to be small as illustrated in FIG. 39B in order to achieve further miniaturization of the semiconductor device, a leak current between the N-type well 120a and the N-type well 120b sometimes becomes large.

First Embodiment

There are explained a semiconductor device and a manufacturing method thereof according to a first embodiment by using FIG. 1 to FIG. 16A and FIG. 16B.

(Semiconductor Device)

Figure 1:
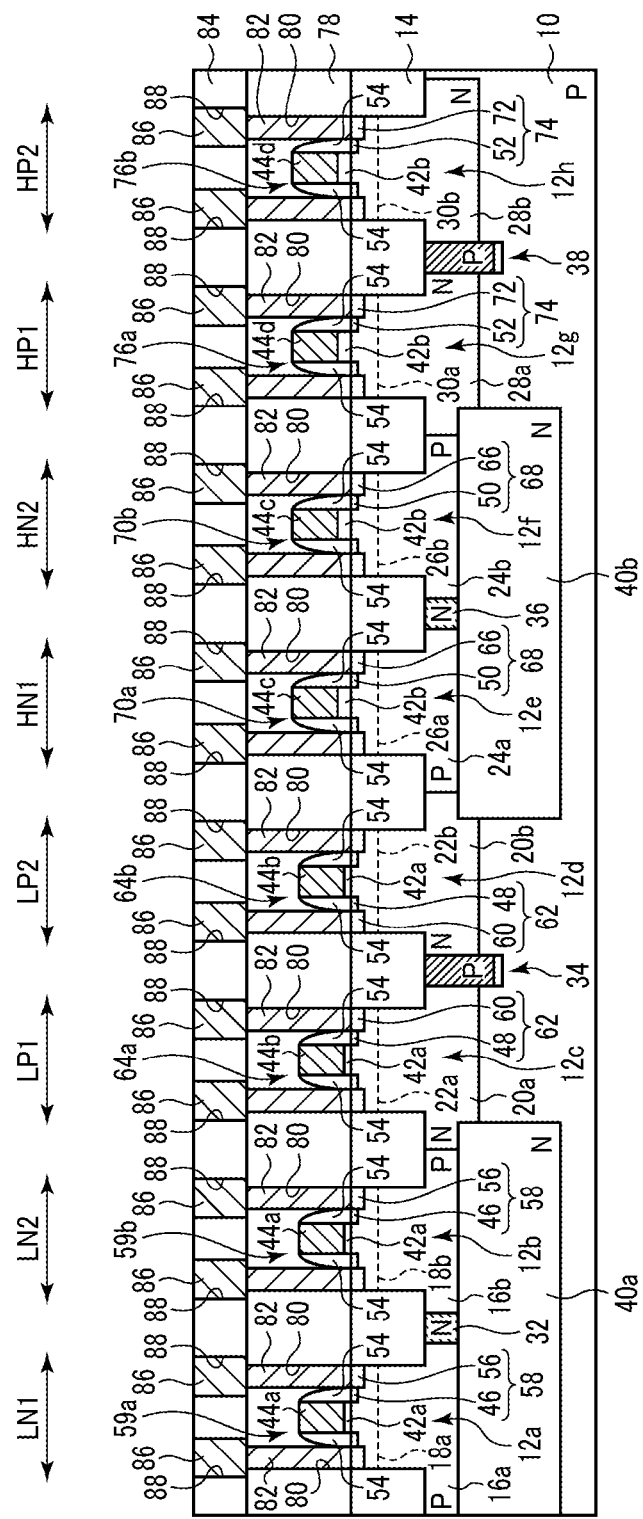
FIG. 1 is a cross-sectional view illustrating a semiconductor device according to a first embodiment.

First, the semiconductor device according to this embodiment is explained by using FIG. 1 to FIG. 10. FIG. 1 is a cross-sectional view illustrating the semiconductor device according to this embodiment.

As illustrated in FIG. 1, in a semiconductor substrate 10, element isolation regions 14 demarcating element regions 12a to 12h are formed. As the semiconductor substrate 10, a P-type silicon substrate is used, for example. The element isolation regions 14 are formed by a STI (Shallow Trench Isolation) method, for example. As a material of the element isolation regions 14, silicon dioxide is used, for example. The depth of the element isolation regions 14 is 250 to 350 nm or so, for example.

A region LN1 on the left side in the paper in FIG. 1 indicates a region where first low-voltage NMOS transistors (first low-withstand-voltage NMOS transistors) are formed. A region in the paper to the right of the region LN1 where the first low-voltage NMOS transistors are formed indicates a region LN2 where second low-voltage NMOS transistors (second low-withstand-voltage NMOS transistors) are formed.

A region in the paper to the right of the region LN2 where the second low-voltage NMOS transistors are formed indicates a region LP1 where first low-voltage PMOS transistors (first low-withstand-voltage PMOS transistors) are formed. A region in the paper to the right of the region LP1 where the first low-voltage PMOS transistors are formed indicates a region LP2 where second low-voltage PMOS transistors (second low-withstand-voltage PMOS transistors) are formed.

A region in the paper to the right of the region LP2 where the second low-voltage PMOS transistors are formed indicates a region HN1 where first high-voltage NMOS transistors (first high-withstand-voltage NMOS transistors) are formed. A region in the paper to the right of the region HN1 where the first high-voltage NMOS transistors are formed indicates a region HN2 where second high-voltage NMOS transistors (second high-withstand-voltage NMOS transistors) are formed.

A region in the paper to the right of the region HN2 where the second high-voltage NMOS transistors are formed indicates a region HP1 where first high-voltage PMOS transistors (first high-withstand-voltage PMOS transistors) are formed. A region in the paper to the right of the region HP1 where the first high-voltage PMOS transistors are formed indicates a region HP2 where second high-voltage PMOS transistors (second high-withstand-voltage PMOS transistors) are formed.

In the region LN1 including the element regions 12a where the first low-voltage NMOS transistors are formed, a P-type well 16a for low-voltage NMOS transistors is formed. In the region LN2 including the element regions 12b where the second low-voltage NMOS transistors are formed, a P-type well 16b for low-voltage NMOS transistors is formed. The peak concentration of a P-type dopant impurity in the P-type wells 16a and 16b for low-voltage NMOS transistors is set to $4\times10^{17}$ cm$^{-3}$ or so, for example. In each of the element regions 12a, a P-type channel doped layer (threshold voltage control layer) 18a is formed, and in each of the element regions 12b, a P-type channel doped layer 18b is formed.

In the region LP1 including the element regions 12c where the first low-voltage PMOS transistors are formed, an N-type well 20a for low-voltage PMOS transistors is formed. In the region LP2 including the element regions 12d where the second low-voltage PMOS transistors are formed, an N-type well 20b for low-voltage PMOS transistors is formed. The peak concentration of an N-type dopant impurity in the N-type wells 20a and 20b for low-voltage PMOS transistors is set to $3\times10^{17}$ cm$^{-3}$ or so, for example. In each of the element regions 12c, an N-type channel doped layer 22a is formed, and in each of the element regions 12d, an N-type channel doped layer 22b is formed.

In the region HN1 including the element regions 12e where the first high-voltage NMOS transistors are formed, a P-type well 24a for high-voltage NMOS transistors is formed. In the region HN2 including the element regions 12f where the second high-voltage NMOS transistors are formed, a P-type well 24b for high-voltage NMOS transistors is formed. The peak concentration of a P-type dopant impurity in the P-type wells 24a and 24b for high-voltage NMOS transistors is set to $3\times10^{17}$ cm$^{-3}$ or so, for example. In each of the element regions 12e, a P-type channel doped layer 26a is formed, and in each of the element regions 12f, a P-type channel doped layer 26b is formed.

In the region HP1 including the element regions 12g where the first high-voltage PMOS transistors are formed, an N-type well 28a for high-voltage PMOS transistors is formed. In the region HP2 including the element regions 12h where the second high-voltage PMOS transistors are formed, an N-type well 28b for high-voltage PMOS transistors is formed. The peak concentration of an N-type dopant impurity in the N-type wells 28a and 28b for high-voltage PMOS transistors is set to $3\times10^{17}$ cm$^{-3}$ or so, for example. In each of the element regions 12g, an N-type channel doped layer 30a is formed, and in each of the element regions 12h, an N-type channel doped layer 30b is formed.

In a region between the P-type well 16a for first low-voltage NMOS transistors and the P-type well 16b for second low-voltage NMOS transistors, a separation N-type well (N-type impurity layer) 32 is formed. The separation N-type well 32 is to electrically separate the P-type well 16a and the P-type well 16b. Bias voltages (well bias) different from each other are sometimes applied to the P-type well 16a and the P-type well 16b.

Incidentally, the same bias voltage may also be applied to the P-type well 16a and the P-type well 16b.

In order to sufficiently reduce a leak current when bias voltages different from each other are applied to the P-type well 16a and the P-type well 16b, an N-type dopant impurity is introduced into the separation N-type well 32 in relatively high concentration. The concentration of the N-type dopant impurity in the separation N-type well 32 is higher than that in the N-type well having the highest concentration of the N-type dopant impurity of the plural N-type wells formed in the semiconductor substrate 10. The peak concentration of the N-type dopant impurity in the separation N-type well 32 is set to $6\times10^{17}$ cm$^{-3}$ or so, for example. The separation N-type well 32 is one formed by implanting the N-type dopant impurity a plurality of times. Here, the implantation of the N-type dopant impurity is performed, for example, two times, and thereby the separation N-type well 32 is formed. Specifically, when implantation of an N-type dopant impurity for forming the N-type wells 20a and 20b for low-voltage PMOS transistors, the N-type dopant impurity is introduced also into the region where the separation N-type well 32 is formed. Further, when implantation of an N-type dopant impurity for forming the N-type wells 28a and 28b for high-voltage PMOS transistors as well, the N-type dopant impurity is introduced into the region where the separation N-type well 32 is formed. The concentration of the N-type impurity in the separation well 32 at a first depth deeper than a bottom surface of the element isolation region 14 and shallower than a bottom surface of the P-type well 16a is equal to the sum of the concentration of the N-type impurity in the N-type well 20a at the first depth and the concentration of the N-type impurity in the N-type well 28a at the first depth.

In a region between the N-type well 20a for first low-voltage PMOS transistors and the N-type well 20b for second low-voltage PMOS transistors, a separation P-type well (P-type impurity layer) 34 is formed. The separation P-type well 34 is to electrically separate the N-type well 20a and the N-type well 20b. Bias voltages different from each other are sometimes applied to the N-type well 20a and the N-type well 20b.

Incidentally, the same bias voltage may also be applied to the N-type well 20a and the N-type well 20b.

In order to sufficiently reduce a leak current when bias voltages different from each other are applied to the N-type well 20a and the N-type well 20b, a P-type dopant impurity is introduced into the separation P-type well 34 in relatively high concentration. The concentration of the P-type dopant impurity in the separation P-type well 34 is higher than that in the P-type well having the highest concentration of the P-type dopant impurity of the plural P-type wells formed in the semiconductor substrate 10. The peak concentration of the P-type dopant impurity in the separation P-type well 34 is set to $7 \times 10^{17}$ cm$^{-3}$ or so, for example. The separation P-type well 34 is one formed by implanting the P-type dopant impurity a plurality of times. Here, the implantation of the P-type dopant impurity is performed two times, and thereby the separation P-type well 34 is formed. Specifically, when implantation of a P-type dopant impurity for forming the P-type wells 16a and 16b for low-voltage NMOS transistors, the P-type dopant impurity is introduced also into the region where the separation P-type well 34 is formed. Further, when implantation of a P-type dopant impurity for forming the P-type wells 24a and 24b for high-voltage NMOS transistors as well, the P-type dopant impurity is introduced into the region where the separation P-type well 34 is formed. The concentration of the P-type impurity in the separation well 34 at a second depth deeper than the bottom surface of the element isolation region 14 and shallower than a bottom surface of the N-type well 20a is equal to the sum of the concentration of the P-type impurity in the P-type well 16a at the second depth and the concentration of the P-type impurity in the P-type well 24a at the second depth.

In a region between the P-type well 24a for first high-voltage NMOS transistors and the P-type well 24b for second high-voltage NMOS transistors, a separation N-type well 36 is formed. The separation N-type well 36 is to electrically separate the P-type well 24a and the P-type well 24b. Bias voltages different from each other are sometimes applied to the P-type well 24a and the second P-type well 24b.

Incidentally, the same bias voltage may also be applied to the P-type well 24a and the second P-type well 24b.

In order to sufficiently reduce a leak current when bias voltages different from each other are applied to the P-type well 24a and the P-type well 24b, an N-type dopant impurity is introduced into the separation N-type well 36 in relatively high concentration. The concentration of the N-type dopant impurity in the separation N-type well 36 is higher than that in the N-type well having the highest concentration of the N-type dopant impurity of the plural N-type wells formed in the semiconductor substrate 10. The peak concentration of the N-type dopant impurity in the separation N-type well 36 is set to $6 \times 10^{17}$ cm$^{-3}$ or so, for example. The separation N-type well 36 is one formed by implanting the N-type dopant impurity a plurality of times. Here, the implantation of the N-type dopant impurity is performed two times, and thereby the separation N-type well 36 is formed. Specifically, when the implantation of the N-type dopant impurity for forming the N-type wells 20a and 20b for low-voltage PMOS transistors, the N-type dopant impurity is introduced also into the region where the separation N-type well 36 is formed. Further, when the implantation of the N-type dopant impurity for forming the N-type wells 28a and 28b for high-voltage PMOS transistors as well, the N-type dopant impurity is introduced into the region where the separation N-type well 36 is formed. The concentration of the N-type impurity in the separation well 36 at a third depth deeper than the bottom surface of the element isolation region 14 and shallower than a bottom surface of the P-type well 24a is equal to the sum of the concentration of the N-type impurity in the N-type well 20a at the third depth and the concentration of the N-type impurity in the N-type well 28a at the third depth.

In a region between the N-type well 28a for first high-voltage PMOS transistors and the N-type well 28b for second high-voltage PMOS transistors, a separation P-type well 38 is formed. The separation P-type well 38 is to electrically separate the N-type well 28a and the N-type well 28b. Bias voltages different from each other are sometimes applied to the N-type well 28a and the N-type well 28b.

Incidentally, the same bias voltage may also be applied to the N-type well 28a and the N-type well 28b.

In order to sufficiently reduce a leak current when bias voltages different from each other are applied to the N-type well 28a and the N-type well 28b, a P-type dopant impurity is introduced into the separation P-type well 38 in relatively high concentration. The concentration of the P-type dopant impurity in the separation P-type well 38 is higher than that in the P-type well having the highest concentration of the P-type dopant impurity of the plural P-type wells formed in the semiconductor substrate 10. The peak concentration of the P-type dopant impurity in the separation P-type well 38 is set to $7 \times 10^{17}$ cm$^{-3}$ or so, for example. The separation P-type well 38 is one formed by implanting the P-type dopant impurity a plurality of times. Here, the implantation of the P-type dopant impurity is performed two times, and thereby the separation P-type well 38 is formed. Specifically, when the implantation of the P-type dopant impurity for forming the P-type wells 16a and 16b for low-voltage NMOS transistors, the P-type dopant impurity is introduced also into the region where the separation P-type well 38 is formed. Further, when the implantation of the P-type dopant impurity for forming the P-type wells 24a and 24b for high-voltage NMOS transistors as well, the P-type dopant impurity is introduced into the region where the separation P-type well 38 is formed. The concentration of the P-type impurity in the separation well 38 at a fourth depth deeper than the bottom surface of the element isolation region 14 and shallower than a bottom surface of the N-type well 28a is equal to the sum of the concentration of the P-type impurity in the P-type well 16a at the fourth depth and the concentration of the P-type impurity in the P-type well 24a at the fourth depth.

In a region that includes the region LN1 including the element regions 12a where the first low-voltage NMOS transistors are formed and the region LN2 including the element regions 12b where the second low-voltage NMOS transistors are formed, an N-type embedded well (embedded impurity layer) 40a is formed. The N-type embedded well 40a is to electrically separate the P-type wells 16a and 16b and the P-type semiconductor substrate 10. The N-type embedded well 40a is connected also to the N-type well 20a and the separation N-type well 32. A top surface of the N-type embedded well 40a is separated from a top surface of the semiconductor substrate 10.

In a region that includes the region HN1 including the element regions 12e where the first high-voltage NMOS transistors are formed and the region HN2 including the element regions 12f where the second high-voltage NMOS transistors are formed, an N-type embedded well 40b is formed. The N-type embedded well 40b is to electrically separate the P-type wells 24a and 24b and the P-type semiconductor substrate 10. The N-type embedded well 40b is connected also to the N-type wells 20b and 28a and the separation N-type well 36. A top surface of the N-type embedded well 40b is separated from the top surface of the semiconductor substrate 10.

At side portions of the P-type well 16a where the first low-voltage NMOS transistors are formed, the separation N-type well 32 and a not-illustrated N-type well and so on are disposed. That is, the P-type well 16a is surrounded by the N-type wells. Further, under the P-type well 16a, the N-type embedded well 40a is disposed. Therefore, the P-type well 16a is electrically separated from the P-type well 16b and the P-type semiconductor substrate 10. Further, at side portions of the P-type well 16b where the second low-voltage NMOS transistors are formed, the separation N-type well 32 and the N-type well 20a and so on are disposed. That is, the P-type well 16b is surrounded by the N-type wells. Further, under the P-type well 16b, the N-type embedded well 40a is disposed. Therefore, the P-type well 16b is electrically separated from the P-type well 16a and the P-type semiconductor substrate 10. The P-type well 16a and the P-type well 16b are electrically separated from each other, so that it is possible to apply bias voltages different from each other to the P-type well 16a and the P-type well 16b. The concentration of the N-type impurity in the separation N-type well 32 is relatively high, so that even though the distance between the P-type well 16a and the P-type well 16b is set to be small relatively, the leak current between the P-type well 16a and the P-type well 16b is quite small.

At side portions of the N-type well 20a where the first low-voltage PMOS transistors are formed, the separation P-type well 34 and the P-type well 16b and so on are disposed. That is, the N-type well 20a is surrounded by the P-type wells. Further, under the N-type well 20a, part of the P-type semiconductor substrate 10 is positioned. Further, at side portions of the N-type well 20b where the second low-voltage PMOS transistors are formed, the separation P-type well 34 and the P-type well 24a and so on are disposed. That is, the N-type well 20b is surrounded by the P-type wells. Further, under the N-type well 20b, part of the P-type semiconductor substrate 10 is positioned. Therefore, the N-type well 20a and the N-type well 20b are electrically separated, and it is possible to apply bias voltages different from each other to the N-type well 20a and the N-type well 20b. The concentration of the P-type impurity in the separation P-type well 34 is relatively high, so that even though the distance between the N-type well 20a and the N-type well 20b is set to be small relatively, the leak current between the N-type well 20a and the N-type well 20b is quite small.

At side portions of the P-type well 24a where the first high-voltage NMOS transistors are formed, the separation N-type well 36 and the N-type well 20b and so on are disposed. That is, the P-type well 24a is surrounded by the N-type wells. Further, under the P-type well 24a, the N-type embedded well 40b is disposed. Therefore, the P-type well 24a is electrically separated from the P-type well 24b and the P-type semiconductor substrate 10. Further, at side portions of the P-type well 24b where the second high-voltage NMOS transistors are formed, the separation N-type well 36 and the N-type well 28a and so on are disposed. That is, the P-type well 24b is surrounded by the N-type wells. Further, under the P-type well 24b, the N-type embedded well 40b is disposed. Therefore, the P-type well 24b is electrically separated from the P-type well 24a, the P-type semiconductor substrate 10, and so on. The P-type well 24a and the P-type well 24b are electrically separated from each other, so that it is possible to apply bias voltages different from each other to the P-type well 24a and the P-type well 24b. The concentration of the N-type impurity in the separation N-type well 36 is relatively high, so that even though the distance between the P-type well 24a and the P-type well 24b is set to be small relatively, the leak current between the P-type well 24a and the P-type well 24b is quite small.

At side portions of the N-type well 28a where the first high-voltage PMOS transistors are formed, the separation P-type well 38 and the P-type well 24b and so on are disposed. That is, the N-type well 28a is surrounded by the P-type wells. Further, under the N-type well 28a, part of the P-type semiconductor substrate 10 is positioned. Further, at side portions of the N-type well 28b where the second high-voltage PMOS transistors are formed, the separation P-type well 38 and a not-illustrated P-type well and so on are disposed. That is, the N-type well 28b is surrounded by the P-type wells. Further, under the N-type well 28b, part of the P-type semiconductor substrate 10 is positioned. Therefore, the N-type well 28a and the N-type well 28b are electrically separated, and it is possible to apply bias voltages different from each other to the N-type well 28a and the N-type well 28b. The concentration of the P-type impurity in the separation P-type well 38 is relatively high, so that even though the distance between the N-type well 28a and the N-type well 28b is set to be small relatively, the leak current between the N-type well 28a and the N-type well 28b is quite small.

In the element region 12a where the first low-voltage NMOS transistors are formed and the element region 12b where the second low-voltage NMOS transistors are formed, gate electrodes 44a are formed on the semiconductor substrate 10 via a gate insulating film 42a.

In the semiconductor substrate 10 at both sides of each of the gate electrodes 44a of the low-voltage NMOS transistors, a low concentration impurity region (extension region) 46 forming a shallow region in an extension source/drain structure is formed.

In the element region 12c where the first low-voltage PMOS transistors are formed and the element region 12d where the second low-voltage PMOS transistors are formed, gate electrodes 44b are formed on the semiconductor substrate 10 via the gate insulating film 42a.

In the semiconductor substrate 10 at both sides of each of the gate electrodes 44b of the low-voltage PMOS transistors, a low concentration impurity region 48 forming a shallow region in an extension source/drain structure is formed.

In the element region 12e where the first high-voltage NMOS transistors are formed and the element region 12f where the second high-voltage NMOS transistors are formed, gate electrodes 44c are formed on the semiconductor substrate 10 via a gate insulating film 42b.

In the semiconductor substrate 10 at both sides of each of the gate electrodes 44c of the high-voltage NMOS transistors, a low concentration impurity region 50 forming a shallow region in an extension source/drain structure is formed.

In the element region 12g where the first high-voltage PMOS transistors are formed and the element region 12h where the second high-voltage PMOS transistors are formed, gate electrodes 44d are formed on the semiconductor substrate 10 via the gate insulating film 42b.

In the semiconductor substrate 10 at both sides of each of the gate electrodes 44d of the high-voltage PMOS transistors, a low concentration impurity region 52 forming a shallow region in an extension source/drain structure is formed.

The film thickness of the gate insulating film 42b for high-voltage transistors 70a, 70b, 76a, and 76b is set to be larger than that of the gate insulating film 42a for low-voltage transistors 59a, 59b, 64a, and 64b.

Each sidewall insulating film 54 is formed on sidewall portions of the gate electrodes 44a to 44d.

In the semiconductor substrate 10 at both sides of each of the gate electrodes 44a, each having had the sidewall insulating films 54 formed thereon, of the low-voltage NMOS transistors, a high concentration impurity region 56 forming a deep region in an extension source/drain structure is formed. By the low concentration impurity regions 46 and the high concentration impurity regions 56, N-type source/drain regions 58 are formed.

In this manner, the first low-voltage NMOS transistors 59a and the second low-voltage NMOS transistors 59b each having the gate electrode 44a and the source/drain regions 58 are formed.

In the semiconductor substrate 10 at both sides of each of the gate electrodes 44b, each having had the sidewall insulating films 54 formed thereon, of the low-voltage PMOS transistors, a high concentration impurity region 60 forming a deep region in an extension source/drain structure is formed. By the low concentration impurity regions 48 and the high concentration impurity regions 60, P-type source/drain regions 62 are formed.

In this manner, the first low-voltage PMOS transistors 64a and the second low-voltage PMOS transistors 64b each having the gate electrode 44b and the source/drain regions 62 are formed.

In the semiconductor substrate 10 at both sides of each of the gate electrodes 44c, each having had the sidewall insulating films 54 formed thereon, of the high-voltage NMOS transistors, a high concentration impurity region 66 forming a deep region in an extension source/drain structure is formed. By the low concentration impurity regions 50 and the high concentration impurity regions 66, N-type source/drain regions 68 are formed.

In this manner, the first high-voltage NMOS transistors 70a and the second high-voltage NMOS transistors 70b each having the gate electrode 44c and the source/drain regions 68 are formed.

In the semiconductor substrate 10 at both sides of each of the gate electrodes 44d, each having had the sidewall insulating films 54 formed thereon, of the high-voltage PMOS transistors, a high concentration impurity region 72 forming a deep region in an extension source/drain structure is formed. By the low concentration impurity regions 52 and the high concentration impurity regions 72, P-type source/drain regions 74 are formed.

In this manner, the first high-voltage PMOS transistors 76a and the second high-voltage PMOS transistors 76b each having the gate electrode 44d and the source/drain regions 74 are formed.

On the semiconductor substrate 10 where the low-voltage NMOS transistors 59a and 59b, the low-voltage PMOS transistors 64a and 64b, the high-voltage NMOS transistors 70a and 70b, and the high-voltage PMOS transistors 76a and 76b are formed, an interlayer insulating film 78 is formed. As the interlayer insulating film 78, for example, a silicon oxide film having a film thickness of 250 to 400 nm or so is used.

In the interlayer insulating film 78, contact holes 80 reaching the source/drain regions 58, 62, 68, and 74 are formed.

In each of the contact holes 80, for example, a conductive plug 82 of tungsten is embedded.

On the interlayer insulating film 78 in which the conductive plugs 82 are embedded, an interlayer insulating film 84 is formed.

In the interlayer insulating film 84, grooves 88 for embedding wirings 86 therein are formed. To bottom surfaces of the grooves 88, top surfaces of the conductive plugs 82 are exposed.

In each of the grooves 88, for example, the wiring 86 of Cu is embedded.

Figures 2A, 2B:
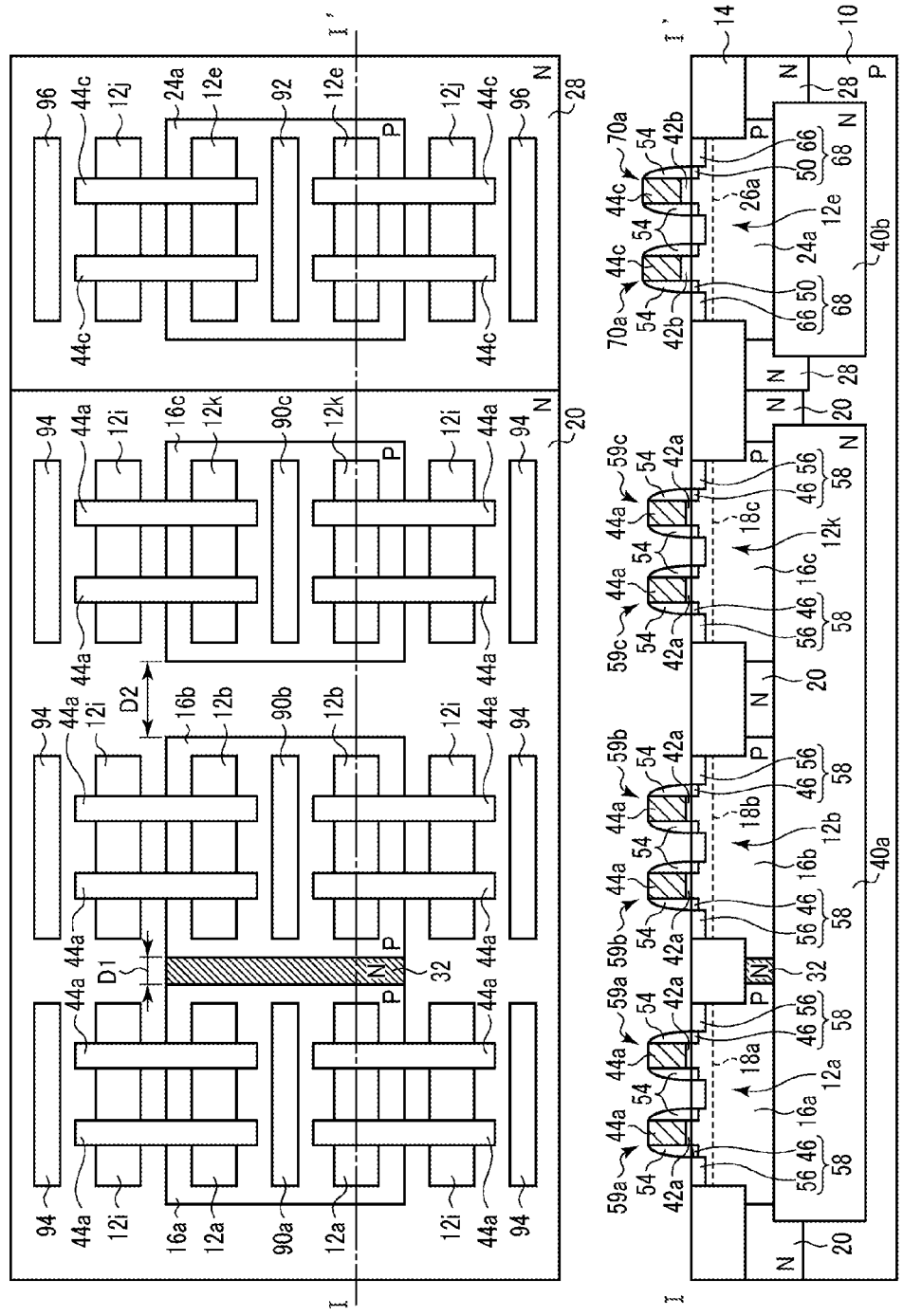
FIG. 2A and FIG. 2B are a plan view and a cross-sectional view each illustrating part of the semiconductor device according to the first embodiment (part 1)

FIG. 2A and FIG. 2B are a plan view and a cross-sectional view each illustrating part of the semiconductor device according to this embodiment (part 1). FIG. 2A is a plan view, and FIG. 2B is a cross-sectional view taken along the line I-I' in FIG. 2A.

As illustrated in FIG. 2A and FIG. 2B, in the region including the element regions 12a where the low-voltage NMOS transistors are formed, the P-type well 16a is formed. In the region where the P-type well 16a is formed, a P-type well tap region (contact region) 90a for applying a desired bias voltage to the P-type well 16a is formed.

Further, in the region including the element regions 12b where the low-voltage NMOS transistors are formed, the P-type well 16b is formed. In the region where the P-type well 16b is formed, a P-type well tap region 90b for applying a desired bias voltage to the P-type well 16b is formed.

Further, in a region including element regions 12k where the low-voltage NMOS transistors are formed, a P-type well 16c is formed. In the P-type well 16c, a P-type channel doped layer 18c is formed. In the region where the P-type well 16c is formed, a P-type well tap region 90c for applying a desired bias voltage to the P-type well 16c is formed.

To these P-type wells 16a to 16c, bias voltages different from one another may be applied or the same bias voltage may also be applied.

An N-type well 20 is formed so as to surround the P-type wells 16a to 16c. The N-type well 20 is formed in a region including element regions 12i where the low-voltage PMOS transistors are formed. In the region where the N-type well 20 is formed, N-type well tap regions 94 for applying a desired bias voltage to the N-type well 20 are formed.

Further, in the region including the element regions 12e where the high-voltage NMOS transistors are formed, the P-type well 24a is formed. In the region where the P-type well 24a is formed, a P-type well tap region 92 for applying a desired bias voltage to the P-type well 24a is formed.

An N-type well 28 is formed so as to surround the P-type well 24a. The N-type well 28 is formed in a region including element regions 12j where the high-voltage PMOS transistors are formed. In the region where the N-type well 28 is formed, N-type well tap regions 96 for applying a desired bias voltage to the N-type well 28 are formed.

In a place where a distance D1 between the P-type well 16a and the P-type well 16b is relatively small, the separation N-type well 32 into which the N-type dopant impurity is introduced in relatively high concentration is formed.

On the other hand, in a place where a distance D2 between the P-type well 16b and the P-type well 16c is relatively large, the concentration of an N-type impurity in the place is equal to that in the N-type well 20. The reason why the concentration of the impurity in the N-type well 20 between the P-type well 16b and the P-type well 16c is not set to be high relatively is because the distance D2 between the P-type well 16b and the P-type well 16c is relatively large, and thus a leak current does not flow easily.

As above, in the place where the distance D1 between the P-type wells 16a and 16b adjacent to each other is relatively small, the separation well 32 into which the N-type impurity is introduced in relatively high concentration is provided.

On the other hand, in the place where the distance between the P-type wells 16b and 16c adjacent to each other is relatively large, the concentration of the N-type impurity in the place need not be set to be high intentionally.

Incidentally, the same manner is applied also to the P-type wells 24a and 24b where the high-voltage NMOS transistors are formed (see FIG. 1). That is, the separation N-type well 36 (see FIG. 1) needs to be selectively provided in a place where the distance between the P-type well 24a and the P-type well 24b is relatively small.

As illustrated in FIG. 2A, gate wirings (gate electrodes) 44 are disposed so as to intersect with the element regions 12a, 12b, and 12k where the low-voltage NMOS transistors are formed and the element regions 12i where the low-voltage PMOS transistors are formed. Further, as illustrated in FIG. 2B, in the element regions 12a, 12b, and 12k where the low-voltage NMOS transistors are formed, the low-voltage NMOS transistors 59a and 59b and low-voltage NMOS transistors 59c each having the gate electrode 44a and the source/drain regions 58 are formed respectively.

Further, as illustrated in FIG. 2A, the gate wirings 44 are disposed so as to intersect with the element regions 12e where the high-voltage NMOS transistors are formed and the element regions 12j where the high-voltage PMOS transistors are formed. Further, as illustrated in FIG. 2B, in the element region 12e where the high-voltage NMOS transistors are formed, the high-voltage NMOS transistors 70a each having the gate electrode 44c and the source/drain regions 68 are formed.

FIG. 3A and FIG. 3B are a plan view and a cross-sectional view illustrating part of the semiconductor device according to this embodiment (part 2). FIG. 3A is a plan view, and FIG. 3B is a cross-sectional view taken along the line II-II' in FIG. 3A.

As illustrated in FIG. 3A and FIG. 3B, in the region including the element regions 12c where the low-voltage PMOS transistors are formed, the N-type well 20a is formed. In the region where the N-type well 20a is formed, an N-type well tap region (contact region) 98a for applying a desired bias voltage to the N-type well 20a is formed.

Further, in the region including the element regions 12d where the low-voltage PMOS transistors are formed, the N-type well 20b is formed. In the region where the N-type well 20b is formed, an N-type well tap region 98b for applying a desired bias voltage to the N-type well 20b is formed.

Further, in a region including element regions 12l where the low-voltage PMOS transistors are formed, an N-type well 20c is formed. In the N-type well 20c, an N-type channel doped layer 22c is formed. In the region where the N-type well 20c is formed, an N-type well tap region 98c for applying a desired bias voltage to the N-type well 20c is formed.

A P-type well 16 is formed so as to surround the N-type wells 20a to 20c. The P-type well 16 is formed in a region including element regions 12m where the low-voltage NMOS transistors are formed. In the region where the P-type well 16 is formed, P-type well tap regions 100 for applying a desired bias voltage to the P-type well 16 are formed.

Further, in the region including the element regions 12g where the high-voltage PMOS transistors are formed, the N-type well 28a is formed. In the region where the N-type well 28a is formed, an N-type well tap region 102 for applying a desired bias voltage to the N-type well 28a is formed.

A P-type well 24 is formed so as to surround the N-type well 28a. The P-type well 24 is formed in a region including element regions 12n where the high-voltage NMOS transistors are formed. In the region where the P-type well 24 is formed, P-type well tap regions 104 for applying a desired bias voltage to the P-type well 24 are formed.

In a place where a distance D3 between the N-type well 20a and the N-type well 20b is relatively small, the separation P-type well 34 into which the P-type dopant impurity is introduced in relatively high concentration is formed.

On the other hand, in a place where a distance D4 between the N-type well 20b and the N-type well 20c is relatively large, the concentration of a P-type impurity in the place is equal to that in the P-type well 16. The reason why the concentration of the impurity in the P-type well 16 between the N-type well 20b and the N-type well 20c is not set to be high relatively is because the distance D4 between the N-type well 20b and the N-type well 20c is large relatively, and thereby a leak current does not flow easily.

As above, in the place where the distance D3 between the N-type wells 20a and 20b adjacent to each other is relatively small, the separation well 34 into which the P-type impurity is introduced in relatively high concentration is provided.

On the other hand, in the place where the distance between the N-type wells 20b and 20c adjacent to each other is relatively large, the concentration of the P-type impurity in the place need not be set to be high intentionally.

Incidentally, the same manner is applied also to the N-type wells 28a and 28b where the high-voltage PMOS transistors are formed (see FIG. 1). That is, the separation P-type well 38 (see FIG. 1) needs to be selectively provided in a place where the distance between the N-type well 28a and the N-type well 28b is relatively small.

As illustrated in FIG. 3A, the gate wirings 44 are disposed so as to intersect with the element regions 12c, 12d, and 12l where the low-voltage PMOS transistors are formed and the element regions 12m where the low-voltage NMOS transistors are formed. Further, as illustrated in FIG. 3B, in the element regions 12c, 12d, and 12l where the low-voltage PMOS transistors are formed, the low-voltage PMOS transistors 64a and 64b and low-voltage PMOS transistors 64c each having the gate electrode 44b and the source/drain regions 62 are formed respectively.

Further, as illustrated in FIG. 3A, the gate wirings 44 are disposed so as to intersect with the element regions 12g where the high-voltage PMOS transistors are formed and the element regions 12n where the high-voltage NMOS transistors are formed. Further, as illustrated in FIG. 3B, in the element region 12g where the high-voltage PMOS transistors are formed, the high-voltage PMOS transistors 76a each having the gate electrode 44d and the source/drain regions 74 are formed.

In this manner, the semiconductor device according to this embodiment is formed.

As above, according to this embodiment, between the P-type well 16a and the P-type well 16b close to each other, the separation N-type well 32 into which the N-type impurity is introduced in relatively high concentration is formed, and between the P-type well 24a and the P-type well 24b close to each other, the separation N-type well 36 into which the N-type impurity is introduced in relatively high concentration is formed. The concentration of the N-type impurity in the separation N-type wells 32 and 36 is relatively high, so that even though the distance between the P-type well 16a and the P-type well 16b and the distance between the P-type well 24a and the P-type well 24b are set to be small relatively, it is possible to prevent a large leak current from flowing. Further, between the N-type well 20a and the N-type well 20b close to each other, the separation P-type well 34 into which the P-type impurity is introduced in relatively high concentration is formed, and between the N-type well 28a and the N-type well 28b close to each other, the separation P-type well 38 into which the P-type impurity is introduced in relatively high concentration is formed. The concentration of the P-type impurity in the separation P-type wells 34 and 38 is relatively high, so that even though the distance between the N-type well 20a and the N-type well 20b and the distance between the N-type well 28a and the N-type well 28b are set to be small relatively, it is possible to prevent a large leak current from flowing. Thus, according to this embodiment, it is possible to achieve miniaturization of the semiconductor device.

(Generating Method of Separation Well Pattern)

Next, there is explained an example of a generating method of a separation well pattern by using FIG. 4A and FIG. 4B and FIG. 5A and FIG. 5B. FIG. 4A and FIG. 4B and FIG. 5A and FIG. 5B are plan views each illustrating the example of the generating method of the separation well pattern.

First, as illustrated in FIG. 4A, for example, a pattern of the P-type well 16 and patterns of the N-type wells 20a to 20c are disposed. Here, the case where the distance between the N-type well 20a and the N-type well 20b is relatively small and the distance between the N-type well 20b and the N-type well 20c is relatively large is explained as an example.

Next, as illustrated in FIG. 4B, the patterns of the N-type wells 20a to 20c are each expanded in the X direction and in the Y direction by a predetermined dimension a, and the patterns that are overlapped with each other by the expansion are merged. Thick-line patterns 106a and 106b in FIG. 4B indicate patterns obtained after merge processing is performed.

Figure 5A:
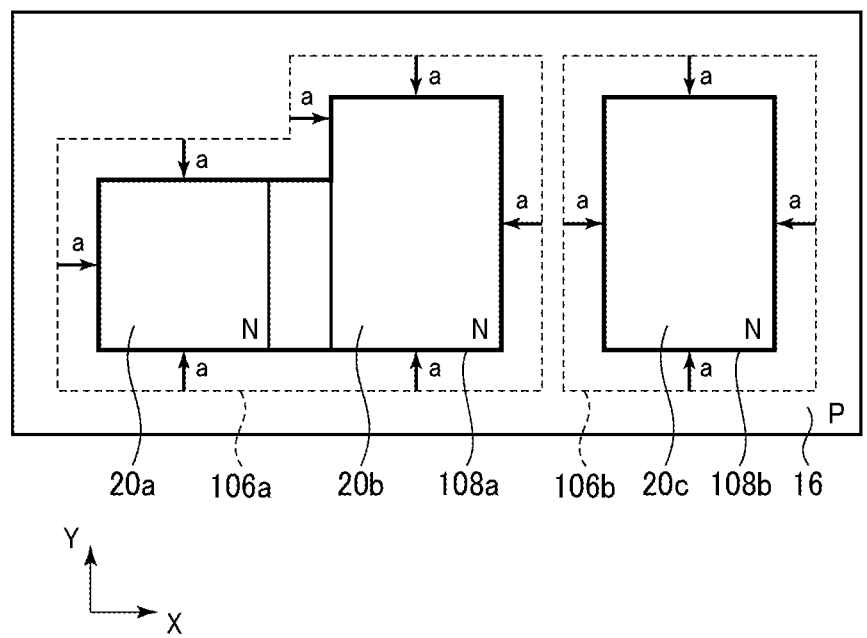
FIG. 5A and FIG. 5B are plan views each illustrating the example of the generating method of the separation well pattern (part 2)
Figure 5B:
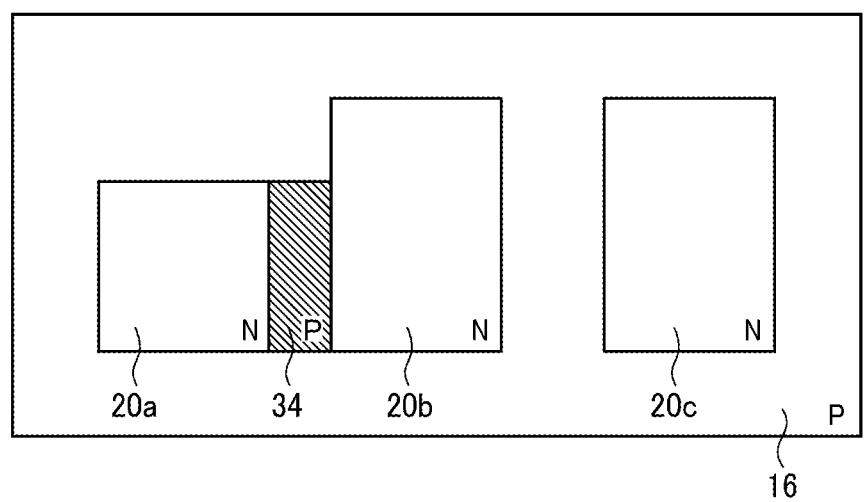

Next, as illustrated in FIG. 5A, the patterns 106a and 106b are each shrunk in the X direction and in the Y direction by the predetermined dimension a. Thick-line patterns 108a and 108b in FIG. 5A indicate patterns obtained after shrink processing is performed.

Next, a difference region between the patterns 106a and 106b illustrated in FIG. 5A and the original patterns 20a to 20c illustrated in FIG. 4A is obtained. Such a difference region corresponds to the region where the separation well 34 is formed. A pattern of the P-type separation well 34 is merged with the pattern of the P-type well where the low-voltage NMOS transistors are formed, and is also merged with the pattern of the P-type well where the high-voltage NMOS transistors are formed. Thus, when forming the P-type well where the low-voltage NMOS transistors are formed, the P-type dopant impurity is introduced also into the region where the separation well 34 is formed. Further, when forming the P-type well where the high-voltage NMOS transistors are formed, the P-type dopant impurity is further introduced into the region where the separation well 34 is formed.

Figure 6:
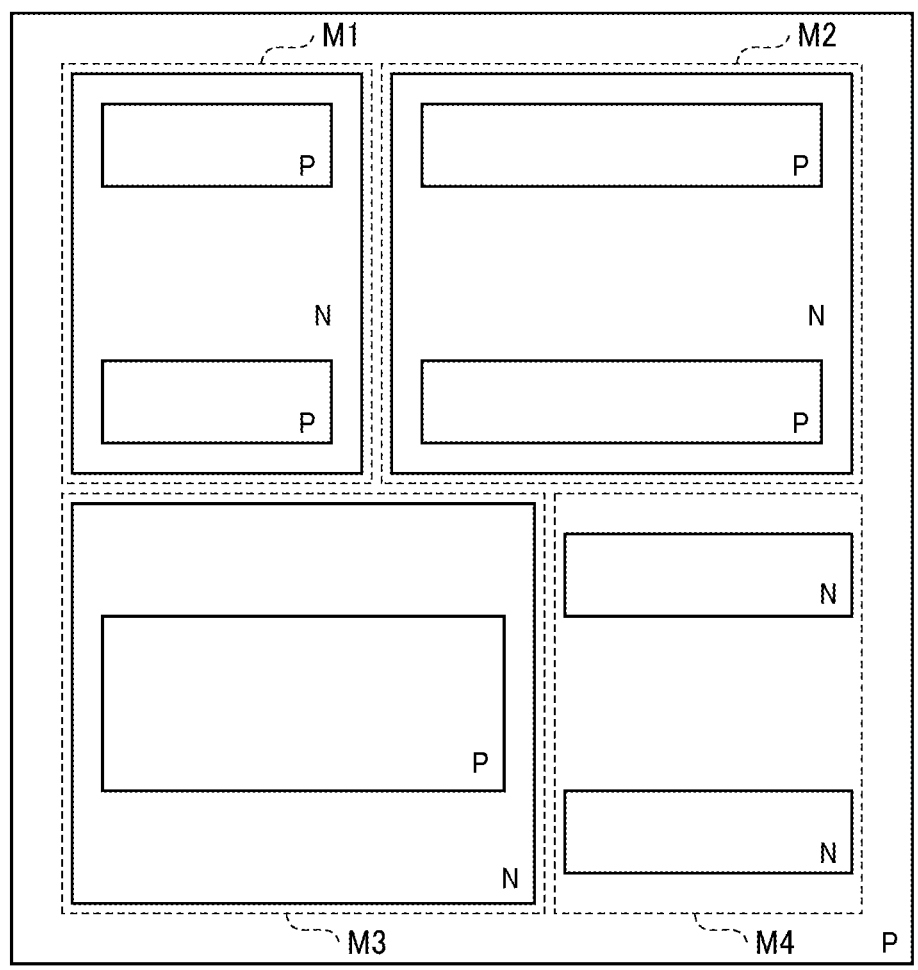
FIG. 6 is a plan view illustrating a disposition example of separation wells when macros are disposed (part 1)
Figure 7:
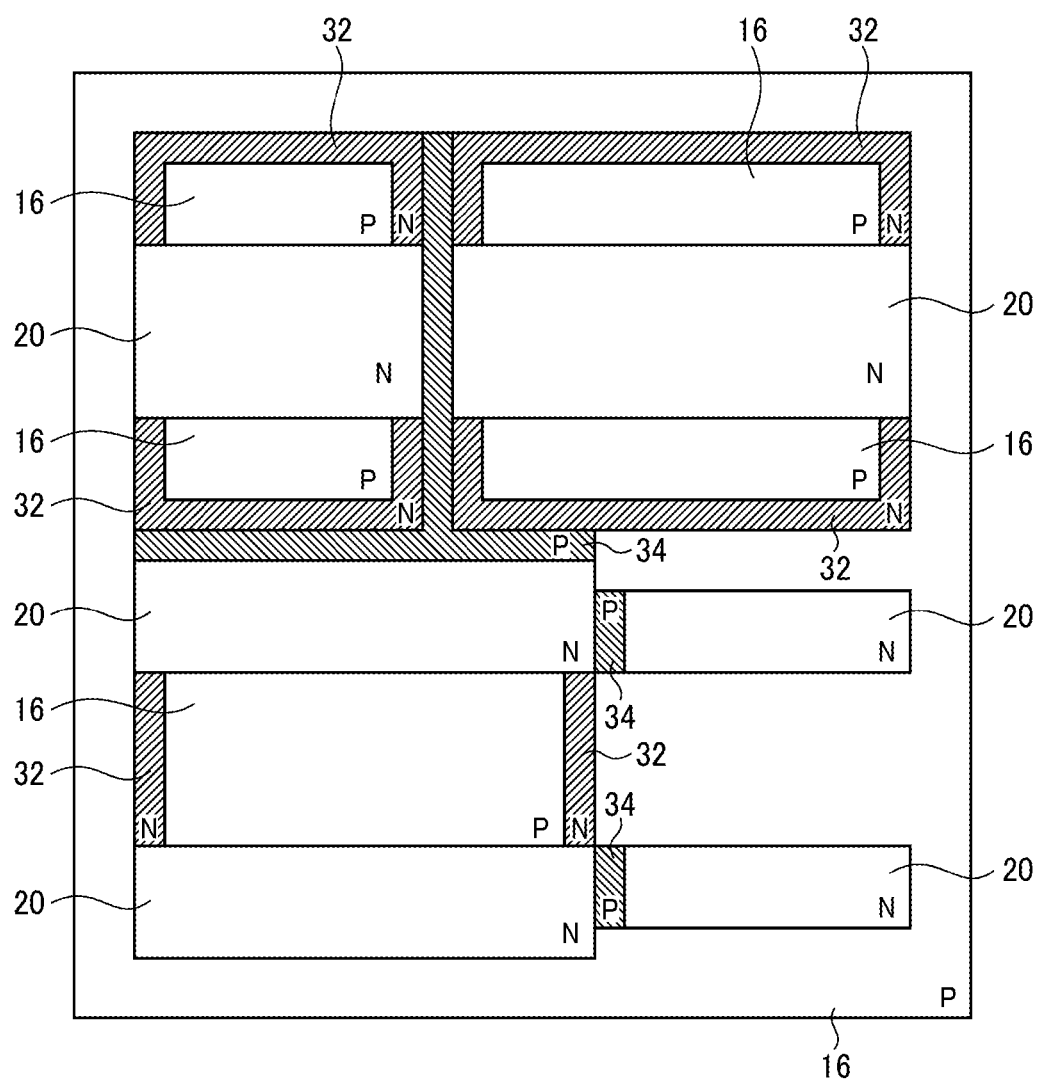
FIG. 7 is a plan view illustrating the disposition example of the separation wells when the macros are disposed (part 2)

FIG. 6 and FIG. 7 are plan views each illustrating a disposition example of separation wells when macros are disposed. FIG. 6 illustrates a state before the separation wells are disposed, and FIG. 7 illustrates a state after the separation wells are disposed.

As illustrated in FIG. 6, plural macros M1 to M4 are disposed. For example, the macros M1 to M3 each are a macro in which a bias voltage is applied to the well. For example, the macro M4 is a macro in which no bias voltage is applied to the well. Incidentally, the reason for applying a bias voltage to the well is to perform adjustment and the like of operation speed, power consumption, and so on. In order to achieve optimization in each macro, the bias voltage to be applied is made different in each macro.

As illustrated in FIG. 7, in each place where the distance between the P-type wells 16 is small, the separation N-type well 32 is selectively disposed.

Further, in each place where the distance between the N-type wells 20 is small, the separation P-type well 34 is selectively disposed.

Incidentally, in FIG. 7, the case where both the separation N-type wells 32 and the separation P-type wells 34 are disposed is explained as an example, but only the ones having a higher effect out of the separation N-type wells 32 and the separation P-type wells 34 may also be disposed.

Figure 8:
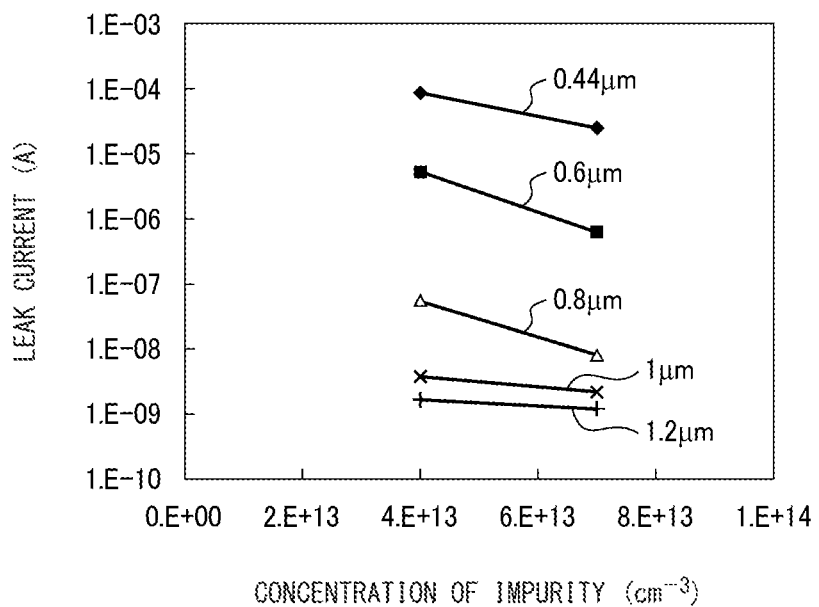
FIG. 8 is a graph illustrating the relationship between the concentration of an impurity in a P-type well positioned between two N-type wells close to each other and a leak current.

FIG. 8 is a graph illustrating the relationship between the concentration of an impurity in a P-type well positioned between two N-type wells close to each other and a leak current. The horizontal axis in FIG. 8 indicates the concentration of the impurity in the P-type well positioned between the two N-type wells close to each other. The vertical axis in FIG. 8 indicates the leak current between the two N-type wells adjacent to each other.

Respective measurements in the case of the distance between the two N-type wells close to each other being 0.44 μm, 0.6 μm, 0.8 μm, 1 μm, and 1.2 μm were performed. The ambient temperature when the measurement was set to 125° C.

As can be found from FIG. 8, the concentration of the impurity in the P-type well positioned between the two N-type wells close to each other is increased, thereby making it possible to reduce the leak current between the two N-type wells close to each other.

Figure 9:
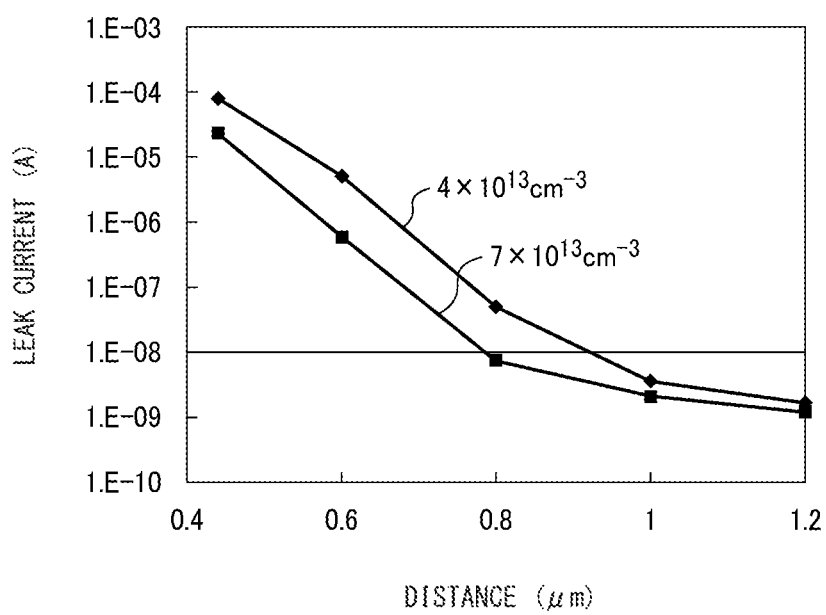
FIG. 9 is a graph illustrating the relationship between the distance between the two N-type wells close to each other and the leak current.

FIG. 9 is a graph illustrating the relationship between the distance between the two N-type wells close to each other and the leak current. The horizontal axis in FIG. 9 indicates the distance between the two N-type wells close to each other. The vertical axis in FIG. 9 indicates the leak current between the two N-type wells close to each other.

Respective measurements in the case of the concentration of the impurity in the P-type well positioned between the two N-type wells close to each other being $4\times10^{13}$ cm$^{-3}$ and $7\times10^{13}$ cm$^{-3}$ were performed. The ambient temperature when the measurement was set to 125° C.

As can be found from FIG. 9, on the condition that the concentration of the impurity in the P-type well positioned between the N-type wells close to each other is $4\times10^{13}$ cm$^{-3}$, the leak current becomes $1\times10^{-8}$ A or so when the distance between the N-type wells adjacent to each other is about 0.9 μm or so.

Further, on the condition that the concentration of the impurity in the P-type well positioned between the N-type wells close to each other is $7\times10^{13}$ cm$^{-3}$, the leak current becomes $1\times10^{-8}$ A or so when the distance between the N-type wells adjacent to each other is about 0.8 μm or so.

Thus, the concentration of the impurity in the P-type well positioned between the N-type wells close to each other is increased to $7\times10^{13}$ cm$^{-3}$ from $4\times10^{13}$ cm$^{-3}$, thereby making it possible to make the distance between the N-type wells adjacent to each other small by about 0.1 μm or so.

Figure 10:
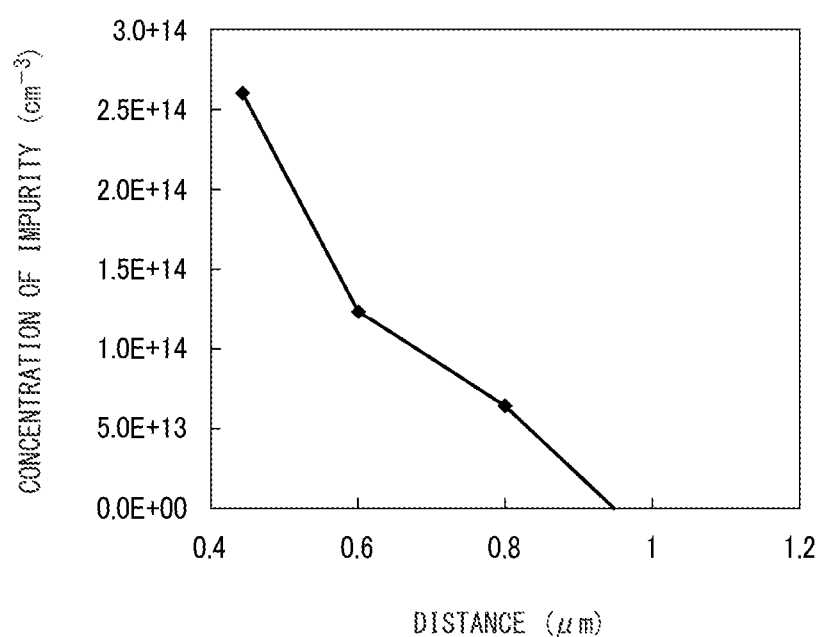
FIG. 10 is a graph illustrating the relationship between the distance between the N-type wells close to each other and the concentration of the impurity in the P-type well for setting the leak current to a permissible value or less.

FIG. 10 is a graph illustrating the relationship between the distance between the N-type wells close to each other and the concentration of the impurity in the P-type well for setting the leak current to a permissible value or less. The horizontal axis in FIG. 10 indicates the distance between the N-type wells close to each other. The vertical axis in FIG. 10 indicates the concentration of the impurity in the P-type well necessary for setting the leak current to a permissible value or less.

The ambient temperature when the measurement was set to 125° C. The permissible value of the leak current was set to $1\times10^{-8}$ A.

As can be found from FIG. 10, the concentration of the impurity in the P-type well positioned between the N-type wells close to each other is increased, thereby making it possible to make the distance between the N-type wells close to each other small.

When the distance between the N-type wells close to each other is made quite small, it is preferable to make the concentration of the P-type impurity in the separation wells 34 and 38 higher than the sum of the concentration of the P-type impurity introduced into the P-type wells 16a and 16b and the concentration of the P-type impurity introduced into the P-type wells 24a and 24b. In this case, it is preferable that a mask for additional implantation of the P-type impurity is further formed, and by using such a mask, the P-type dopant impurity is additionally implanted into the regions where the separation wells 34 and 38 are formed.

Further, when the distance between the P-type wells close to each other is made quite small, it is preferable to make the concentration of the N-type impurity in the separation wells 32 and 36 higher than the sum of the concentration of the N-type impurity introduced into the N-type wells 20a and 20b and the concentration of the N-type impurity introduced into the N-type wells 28a and 28b. In this case, it is preferable that a mask for additional implantation of the N-type impurity preferably is further formed, and by using such a mask, the N-type dopant impurity is additionally implanted into the regions where the separation wells 32 and 36 are formed.

(Manufacturing Method of Semiconductor Device)

Next, there is explained the manufacturing method of the semiconductor device according to this embodiment by using FIG. 11A and FIG. 11B to FIG. 16A and FIG. 16B.

FIG. 11A and FIG. 11B to FIG. 16A and FIG. 16B are process cross-sectional views each illustrating the manufacturing method of the semiconductor device according to this embodiment.

First, as illustrated in FIG. 11A, by an STI method, for example, element isolation regions 14 demarcating plural element regions 12a to 12h are formed in a semiconductor substrate 10. As the semiconductor substrate 10, for example, a P-type silicon substrate is used. As a material of the element isolation regions 14, for example, silicon dioxide is used. The depth of the element isolation regions 14 is set to 250 to 350 nm or so, for example.

Next, a photoresist film 110 is formed on the whole surface by a spin coat method, for example.

Next, by using a photolithography technique, the photoresist film 110 is patterned. Thereby, there are formed opening portions 112 exposing regions where P-type wells 16a and 16b for low-voltage NMOS transistors are formed and opening portions 112 exposing regions where separation P-type wells 33 and 37 are formed in the photoresist film 110 (see FIG. 11B).

Next, by using the photoresist film 110 as a mask, a P-type dopant impurity is introduced into the semiconductor substrate 10 by an ion implantation method, for example. As the P-type dopant impurity, for example, boron (B) is used. Acceleration energy is set to 135 keV or so, for example. A dose amount is set to $4.0\times10^{13}$ cm$^{-2}$ or so, for example. Thereby, the P-type wells 16a and 16b, and separation P-type wells 33 and 37 are formed. The separation P-type wells 33 and 37 turn to the separation P-type wells 34 and 38 by further introducing a P-type dopant impurity thereinto in a subsequent process. The thicknesses of the P-type wells 16a and 16b and the separation P-type wells 33 and 37 each become 1 μm or so, for example. The peak concentration of the P-type dopant impurity in the P-type wells 16a and 16b and the separation P-type wells 33 and 37 becomes $4\times10^{17}$ cm$^{-3}$ or so, for example.

Next, the photoresist film 110 is used as a mask, and by an ion implantation method, for example, a P-type dopant impurity is introduced into the semiconductor substrate 10, and thereby P-type channel doped layers 18a and 18b are formed. As the P-type dopant impurity, for example, B is used. Acceleration energy is set to 10 keV or so, for example. A dose amount is set to $1.0\times10^{13}$ to $2.5\times10^{13}$ cm$^{-2}$ or so, for example.

Thereafter, by ashing, for example, the photoresist film 110 is exfoliated.

Next, a photoresist film 114 is formed on the whole surface by a spin coat method, for example.

Next, by using a photolithography technique, the photoresist film 114 is patterned. Thereby, there are formed opening portions 116 exposing regions where N-type wells 20a and 20b for low-voltage PMOS transistors are formed and opening portions 116 exposing regions where separation N-type wells 31 and 35 are formed in the photoresist film 114 (see FIG. 12A).

Next, by using the photoresist film 114 as a mask, an N-type dopant impurity is introduced into the semiconductor substrate 10 by an ion implantation method, for example. As the N-type dopant impurity, for example, phosphorus (P) is used. Acceleration energy is set to 330 keV or so, for example. A dose amount is set to $3.0\times10^{13}$ cm$^{-2}$ or so, for example. Thereby, the N-type wells 20a and 20b, and separation N-type wells 31 and 35 are formed. The separation N-type wells 31 and 35 turn to the separation N-type wells 32 and 36 by further introducing an N-type dopant impurity thereinto in a subsequent process. The thicknesses of the N-type wells 20a and 20b and the separation N-type wells 31 and 35 each become 1 μm or so, for example. The peak concentration of the N-type dopant impurity in the N-type wells 20a and 20b and the separation N-type wells 31 and 35 becomes $3\times10^{17}$ cm$^{-3}$ or so, for example.

Next, the photoresist film 114 is used as a mask, and by an ion implantation method, for example, an N-type dopant impurity is introduced into the semiconductor substrate 10, and thereby N-type channel doped layers 22a and 22b are formed. As the N-type dopant impurity, for example, arsenic (As) is used. Acceleration energy is set to 50 to 100 keV or so, for example. A dose amount is set to $0.8\times10^{13}$ to $1.4\times10^{13}$ cm$^{-2}$ or so, for example.

Thereafter, by ashing, for example, the photoresist film 114 is exfoliated.

Next, a photoresist film 118 is formed on the whole surface by a spin coat method, for example.

Next, by using a photolithography technique, the photoresist film 118 is patterned. Thereby, there are formed opening portions 120 exposing regions where P-type wells 24a and 24b for high-voltage NMOS transistors are formed and opening portions 120 exposing the regions where the separation P-type wells 34 and 38 are formed in the photoresist film 118 (see FIG. 12B).

Next, by using the photoresist film as a mask, a P-type dopant impurity is introduced into the semiconductor substrate 10 by an ion implantation method, for example. Thereby, the P-type wells 24a and 24b are formed. Further, the P-type dopant impurity is further introduced into the separation P-type wells 33 and 37, and thereby the separation P-type wells 33 and 37 turn to the separation P-type wells 34 and 38. As the P-type dopant impurity, for example, B is used. Acceleration energy is set to 150 keV or so, for example. A dose amount is set to $3.0\times10^{13}$ cm$^{-2}$ or so, for example. The thicknesses of the P-type wells 24a and 24b and the separation P-type wells 34 and 38 each become 1 μm or so, for example. The peak concentration of the P-type dopant impurity in the P-type wells 24a and 24b becomes $3\times10^{17}$ cm$^{-3}$ or so, for example. The peak concentration of the P-type dopant impurity in the separation P-type wells 34 and 38 becomes $7\times10^{17}$ cm$^{-3}$ or so, for example. The concentration of the P-type impurity in the separation well 34 at a second depth deeper than a bottom surface of the element isolation region 14 becomes equal to the sum of the concentration of the P-type impurity in the P-type well 16a at the second depth and the concentration of the P-type impurity in the P-type well 24a at the second depth. Further, the concentration of the P-type impurity in the separation well 38 at a fourth depth deeper than the bottom surface of the element isolation region 14 becomes equal to the sum of the concentration of the P-type impurity in the P-type well 16a at the fourth depth and the concentration of the P-type impurity in the P-type well 24a at the fourth depth.

Next, the photoresist film 118 is used as a mask, and by an ion implantation method, for example, a P-type dopant impurity is introduced into the semiconductor substrate 10, and thereby P-type channel doped layers 26a and 26b are formed. As the P-type dopant impurity, for example, B is used. Acceleration energy is set to 10 keV or so, for example. A dose amount is set to $2.0\times10^{12}$ to $5.0\times10^{12}$ cm$^{-2}$ or so, for example.

Thereafter, by ashing, for example, the photoresist film 118 is exfoliated.

Next, a photoresist film 122 is formed on the whole surface by a spin coat method, for example.

Next, by using a photolithography technique, the photoresist film 122 is patterned. Thereby, there are formed opening portions 124 exposing regions where N-type wells 28a and 28b for high-voltage PMOS transistors are formed and opening portions 124 exposing the regions where the separation N-type wells 32 and 36 are formed in the photoresist film 122 (see FIG. 13A).

Next, by using the photoresist film 122 as a mask, an N-type dopant impurity is introduced into the semiconductor substrate 10 by an ion implantation method, for example. Thereby, the N-type wells 28a and 28b are formed. Further, the N-type dopant impurity is further introduced into the separation N-type wells 31 and 35, and thereby the separation N-type wells 31 and 35 turn to the separation N-type wells 32 and 36. As the N-type dopant impurity, for example, P is used. Acceleration energy is set to 360 keV or so, for example. A dose amount is set to $3.0\times10^{13}$ cm$^{-2}$ or so, for example. The thicknesses of the N-type wells 28a and 28b and the separation N-type wells 32 and 36 each become 1 μm or so, for example. The peak concentration of the N-type dopant impurity in the N-type wells 28a and 28b becomes $3\times10^{13}$ cm$^{-3}$ or so, for example. The peak concentration of the N-type dopant impurity in the separation N-type wells 32 and 36 becomes $6\times10^{17}$ cm$^{-3}$ or so, for example. The concentration of the N-type impurity in the separation N-type well 32 at a first depth deeper than the bottom surface of the element isolation region 14 becomes equal to the sum of the concentration of the N-type impurity in the N-type well 20a at the first depth and the concentration of the N-type impurity in the N-type well 28a at the first depth. Further, the concentration of the N-type impurity in the separation N-type well 36 at a third depth deeper than the bottom surface of the element isolation region 14 becomes equal to the sum of the concentration of the N-type impurity in the N-type well 20a at the third depth and the concentration of the N-type impurity in the N-type well 28a at the third depth.

Next, the photoresist film 122 is used as a mask, and by an ion implantation method, for example, an N-type dopant impurity is introduced into the semiconductor substrate 10, and thereby N-type channel doped layers 30a and 30b are formed. As the N-type dopant impurity, for example, As is used. Acceleration energy is set to 100 keV or so, for example. A dose amount is set to $0.7\times10^{12}$ to $1.5\times10^{12}$ cm$^{-2}$ or so, for example.

Thereafter, by ashing, for example, the photoresist film 122 is exfoliated.

Next, a photoresist film 126 is formed on the whole surface by a spin coat method, for example.

Next, by using a photolithography technique, the photoresist film 126 is patterned. Thereby there are formed opening portions 128 exposing regions where N-type embedded wells 40a and 40b are formed in the photoresist film 126 (see FIG. 13B).

Next, the photoresist film 126 is used as a mask, and by an ion implantation method, for example, an N-type dopant impurity is introduced into the semiconductor substrate 10, and thereby the N-type embedded wells 40a and 40b are formed. As the N-type dopant impurity, for example, P is used. Acceleration energy is set to 500 to 800 keV or so, for example. A dose amount is set to $1.0\times10^{13}$ to $2.0\times10^{13}$ cm$^{-2}$ or so, for example. The distance between a top surface of the embedded wells 40a and 40b and a top surface of the semiconductor substrate 10 is set to 0.5 to 0.9 μm or so, for example. In this manner, the N-type embedded wells 40a and 40b are formed in the semiconductor substrate 10.

Thereafter, by ashing, for example, the photoresist film 126 is exfoliated.

Next, a silicon oxide film having a film thickness of 6 to 8 nm or so is formed on the whole surface by a thermal oxidation method, for example.

Next, by using a photolithography technique, the silicon oxide film in regions where low-voltage NMOS transistors are formed and regions where low-voltage PMOS transistors are formed is removed by etching.

Next, a silicon oxide film having a film thickness of 1.4 to 1.7 nm or so is formed on the whole surface by a thermal oxidation method, for example. In this manner, on the element isolation regions 12a and 12b where the low-voltage NMOS transistors are formed and on the element isolation regions 12c and 12d where the low-voltage PMOS transistors are formed, a gate insulating film 42a for low-voltage MOS transistors is formed (see FIG. 14A). The film thickness of the gate insulating film 42a for low-voltage MOS transistors is set to 1.4 to 1.7 nm or so, for example. On the other hand, on the element isolation regions 12e and 12f where high-voltage NMOS transistors are formed and on the element isolation regions 12g and 12h where high-voltage PMOS transistors are formed, a gate insulating film 42b for high-voltage MOS transistors is formed. The film thickness of the gate insulating film 42b for high-voltage MOS transistors is set to 6 to 8 nm or so, for example.

Next, a polysilicon film having a film thickness of 90 to 120 nm or so, for example, is formed on the whole surface by a CVD (Chemical Vapor Deposition) method, for example.

Next, by using a photolithography technique, the polysilicon film is patterned into shapes of gate electrodes 44a to 44d (see FIG. 14B).

Next, a photoresist film (not illustrated) is formed by a spin coat method, for example.

Next, by using a photolithography technique, there are formed opening portions (not illustrated) exposing regions LN1 and LN2 where the low-voltage NMOS transistors are formed and regions where the high-voltage NMOS transistors are formed in the photoresist film.

Next, by using the photoresist film as a mask, an N-type dopant impurity is introduced into the semiconductor substrate 10 at both sides of each of the gate electrodes 44a to 44d by an ion implantation method, for example. As the N-type dopant impurity, for example, As is used. Acceleration energy is set to 1.0 to 2.0 keV or so, for example. A dose amount is set to $3 \times 10^{14}$ to $10 \times 10^{14}$ cm$^{-2}$ or so, for example. In this manner, there are formed N-type low concentration impurity regions (extension regions) 46 and 50 each forming a shallow region in an extension source/drain structure (see FIG. 15A).

Thereafter, by ashing, for example, the photoresist film is exfoliated.

Next, by a spin coat method, for example, a photoresist film (not illustrated) is formed.

Next, by using a photolithography technique, there are formed opening portions (not illustrated) exposing regions LP1 and LP2 where the low-voltage PMOS transistors are formed and regions HP1 and HP2 where the high-voltage PMOS transistors are formed in the photoresist film.

Next, by using the photoresist film as a mask, a P-type dopant impurity is introduced into the semiconductor substrate 10 at both sides of each of the gate electrodes 44a to 44d by an ion implantation method, for example. As the P-type dopant impurity, for example, B is used. Acceleration energy is set to 0.3 to 0.7 keV or so, for example. A dose amount is set to $1.5 \times 10^{14}$ to $4.0 \times 10^{14}$ cm$^{-2}$ or so, for example. In this manner, there are formed P-type low concentration impurity regions 48 and 52 each forming a shallow region in an extension source/drain structure.

Thereafter, by ashing, for example, the photoresist film is exfoliated.

Next, by a CVD method, for example, a silicon oxide film having a film thickness of 60 to 80 nm or so, for example, is formed on the whole surface.

Next, the silicon oxide film is anisotropically etched, and thereby each sidewall insulating film 54 being the silicon oxide film is formed on sidewall portions of the gate electrodes 44a to 44d (see FIG. 15B).

Next, a photoresist film (not illustrated) is formed by a spin coat method, for example.

Next, by using a photolithography technique, there are formed opening portions (not illustrated) exposing the regions LN1 and LN2 where the low-voltage NMOS transistors are formed and the regions HN1 and HN2 where the high-voltage NMOS transistors are formed in the photoresist film.

Next, by using the photoresist film as a mask, an N-type dopant impurity is introduced into the semiconductor substrate 10 at both sides of each of the gate electrodes 44a to 44d each having had the sidewall insulating films 54 formed thereon by an ion implantation method, for example. As the N-type dopant impurity, for example, P is used. Acceleration energy is set to 7 to 10 keV or so, for example. A dose amount is set to $0.6 \times 10^{16}$ to $1.6 \times 10^{16}$ cm$^{-2}$ or so, for example. In this manner, there are formed N-type high concentration impurity regions 56 and 66 each forming a deep region in an extension source/drain structure. By the low concentration impurity regions 46 and the high concentration impurity regions 56, source/drain regions 58 in an extension source/drain structure are formed, and by the low concentration impurity regions 50 and the high concentration impurity regions 66, source/drain regions 68 in an extension source/drain structure are formed (see FIG. 16A).

Thereafter, by ashing, for example, the photoresist film is exfoliated.

Next, by a spin coat method, for example, a photoresist film (not illustrated) is formed.

Next, by using a photolithography technique, there are formed opening portions (not illustrated) exposing the regions LP1 and LP2 where the low-voltage PMOS transistors are formed and the regions HP1 and HP2 where the high-voltage PMOS transistors are formed in the photoresist film.

Next, by using the photoresist film as a mask, a P-type dopant impurity is introduced into the semiconductor substrate 10 at both sides of each of the gate electrodes 44a to 44d each having had the sidewall insulating films 54 formed thereon by an ion implantation method, for example. As the P-type dopant impurity, for example, B is used. Acceleration energy is set to 3 to 5 keV or so, for example. A dose amount is set to $4 \times 10^{15}$ to $8 \times 10^{15}$ cm$^{-2}$ or so, for example. In this manner, there are formed P-type high concentration impurity regions 60 and 72 each forming a deep region in an extension source/drain structure. By the low concentration impurity regions 48 and the high concentration impurity regions 60, source/drain regions 62 in an extension source/drain structure are formed, and by the low concentration impurity regions 52 and the high concentration impurity regions 72, source/drain regions 74 in an extension source/drain structure are formed.

Thereafter, by ashing, for example, the photoresist film is exfoliated.

Next, by a CVD method, for example, an interlayer insulating film 78 being a silicon oxide film, having a film thickness of 500 to 700 nm or so, is formed.

Next, by a CMP (Chemical Mechanical Polishing) method, for example, the interlayer insulating film 78 is polished to a film thickness of 250 to 400 nm or so, for example.

Next, by using a photolithography technique, contact holes 80 reaching the source/drain regions 58, 62, 68, and 74 are formed in the interlayer insulating film. On this occasion, contact holes (not illustrated) reaching well tap regions (see FIG. 2A and FIG. 3A) 90a to 90c, 92, 94, 96, 98a to 98c, 100, 102, and 104 are also formed in the interlayer insulating film 78.

Next, for example, by a sputtering method, on the whole surface, a titanium (Ti) film having a film thickness of 7 to 15 nm or so and a titanium nitride (TiN) film having a film thickness of 5 to 10 nm or so are stacked, and thereby a barrier film (not illustrated) is formed, for example.

Next, by a CVD method, for example, a tungsten film having a film thickness of 150 to 250 nm or so, for example, is formed on the whole surface.

Next, by a CMP method, for example, the tungsten film and the barrier film are polished until the surface of the interlayer insulating film 78 is exposed. Thereby, conductive plugs 82 of tungsten are each embedded in the contact holes 80.

Next, by a CVD method, for example, an interlayer insulating film 84 being a silicon oxide film, having a film thickness of 150 to 250 nm or so, for example, is formed on the whole surface.

Next, by using a photolithography technique, grooves 88 for embedding wirings 86 therein are formed in the interlayer insulating film 84. To bottom surfaces of the grooves 88, top surfaces of the conductive plugs 82 are exposed.

Next, by a sputtering method, for example, a barrier film of Ti having a film thickness of 15 to 25 nm or so (not illustrated), for example, is formed on the whole surface.

Next, by a sputtering method, for example, a seed layer of copper (Cu) having a film thickness of 30 to 50 nm or so (not illustrated), for example, is formed on the whole surface.

Next, by an electrolytic plating method, for example, a Cu film having a film thickness of 0.8 to 1.3 μm or so, for example, is formed.

Next, by a CMP method, for example, the Cu film and the barrier film are polished until the surface of the interlayer insulating film 84 is exposed. Thereby, the wirings 86 of Cu are embedded in the grooves 88.

Figure 16A:
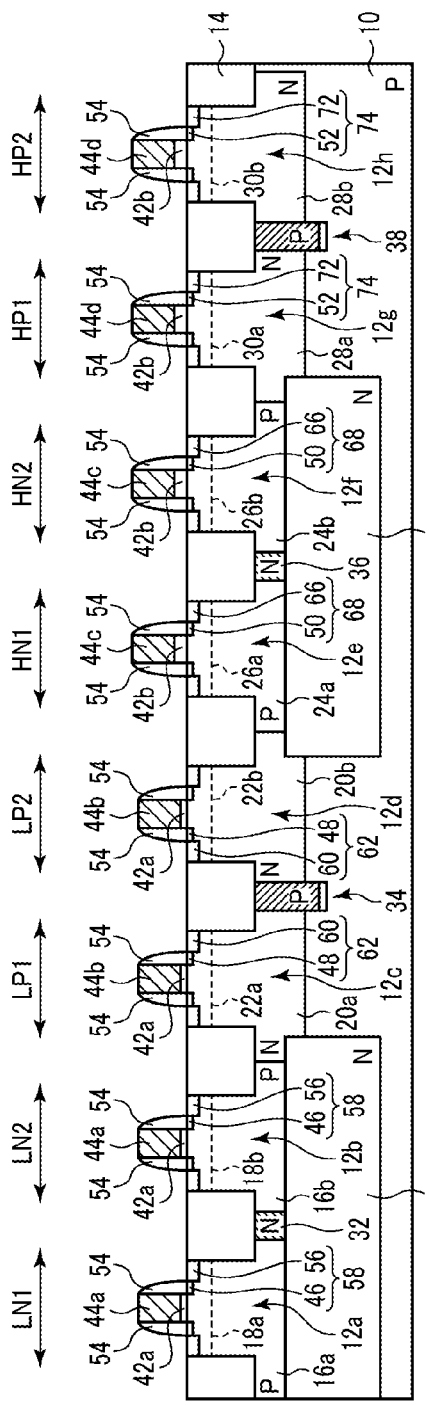
FIG. 16A and FIG. 16B are process cross-sectional views each illustrating the manufacturing method of the semiconductor device according to the first embodiment (part 6)
Figure 16B:
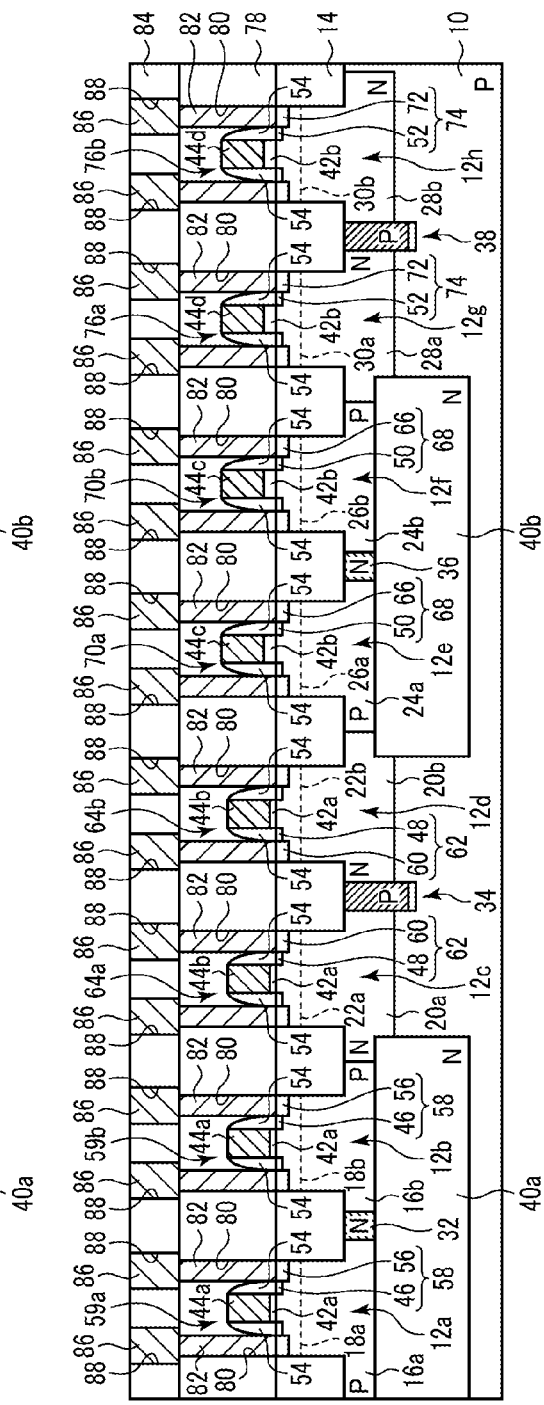

In this manner, the semiconductor device according to this embodiment is manufactured (see FIG. 16B).

As above, according to this embodiment, when the N-type dopant impurity is introduced into the regions where the N-type wells 20a and 20b are formed, the N-type dopant impurity is introduced also into the regions where the separation N-type wells 32 and 36 are formed. Further, when the N-type dopant impurity is introduced into the regions where the N-type wells 28a and 28b are formed, the N-type dopant impurity is introduced also into the regions where the separation N-type wells 32 and 36 are formed. Therefore, it is possible to form the separation N-type wells 32 and 36 each having a relatively high concentration of the impurity without increasing the number of processes. Further, according to this embodiment, when the P-type dopant impurity is introduced into the regions where the P-type wells 16a and 16b are formed, the P-type dopant impurity is introduced also into the regions where the separation P-type wells 34 and 38 are formed. Further, when the P-type dopant impurity is introduced into the regions where the P-type wells 24a and 24b are formed, the P-type dopant impurity is introduced also into the regions where the separation P-type wells 34 and 38 are formed. Therefore, it is possible to form the separation P-type wells 34 and 38 each having a relatively high concentration of the impurity without increasing the number of processes. Thus, according to this embodiment, it is possible to achieve the miniaturization of the semiconductor device without causing an increase in the number of processes.

Second Embodiment

There is explained a manufacturing method of a semiconductor device according to a second embodiment by using FIG. 17A and FIG. 17B to FIG. 23. FIG. 17A and FIG. 17B to FIG. 23 are process cross-sectional views each illustrating the manufacturing method of the semiconductor device according to this embodiment. The same reference numerals and symbols are added to the same components as those of the semiconductor device and the manufacturing method thereof according to the first embodiment illustrated in FIG. 1 to FIG. 16A and FIG. 16B, and explanations are omitted or simplified.

The manufacturing method of the semiconductor device according to this embodiment is that the wells 16a, 16b, 20a, and 20b where the low-voltage MOS transistors 59a, 59b, 64a, and 64b are formed are formed and then the element isolation regions 14 are formed.

First, as illustrated in FIG. 17A, by using a photolithography technique, part of a semiconductor substrate 10 is etched, to thereby form an alignment mark 130 in the semiconductor substrate 10. The alignment mark 130 is used for alignment when patterns are transferred to a photoresist film in a subsequent process.

Next, in the same manner as the manufacturing method of the semiconductor device according to the first embodiment described above by using FIG. 11A, P-type wells 16a and 16b, separation P-type wells 33 and 37, and channel doped layers 18a and 18b are formed (see FIG. 17B).

Next, in the same manner as the manufacturing method of the semiconductor device according to the first embodiment described above by using FIG. 11B, N-type wells 20a and 20b, separation N-type wells 31 and 35, and channel doped layers 22a and 22b are formed (see FIG. 18B).

Next, in the same manner as the manufacturing method of the semiconductor device according to the first embodiment described above by using FIG. 11A, element isolation regions 14 demarcating element regions 12a to 12h are formed (see FIG. 18B). On this occasion, in the alignment mark 130, an insulating film 14a made of the same material as that of the element isolation regions 14 is embedded.

Next, in the same manner as the manufacturing method of the semiconductor device according to the first embodiment described above by using FIG. 12B, a P-type dopant impurity is introduced into the semiconductor substrate 10 (see FIG. 19A). Thereby, P-type wells 24A and 24b are formed. Further, the P-type dopant impurity is further introduced into the separation P-type wells 33 and 37, and thereby the separation P-type wells 33 and 37 turn to separation P-type wells 34 and 38. Further, channel doped layers 26a and 26b are formed.

Next, in the same manner as the manufacturing method of the semiconductor device according to the first embodiment described above by using FIG. 13A, an N-type dopant impurity is introduced into the semiconductor substrate 10 (see FIG. 19B). Thereby, N-type wells 28a and 28b are formed. Further, the N-type dopant impurity is further introduced into the separation N-type wells 31 and 35, and thereby the separation N-type wells 31 and 35 turn to separation N-type wells 32 and 36. Further, channel doped layers 30a and 30b are formed.

Next, in the same manner as the manufacturing method of the semiconductor device according to the first embodiment described above by using FIG. 13B, N-type embedded wells 40a and 40b are formed (see FIG. 20A).

Next, in the same manner as the manufacturing method of the semiconductor device according to the first embodiment described above by using FIG. 14A, gate insulating films 42a and 42b are formed (see FIG. 20B).

Next, in the same manner as the manufacturing method of the semiconductor device according to the first embodiment described above by using FIG. 14B, gate electrodes 44a to 44d are formed (see FIG. 21A).

Next, in the same manner as the manufacturing method of the semiconductor device according to the first embodiment described above by using FIG. 15A, low concentration impurity regions 46, 48, 50, and 52 are formed (see FIG. 21B).

Figures 22A, 22B:
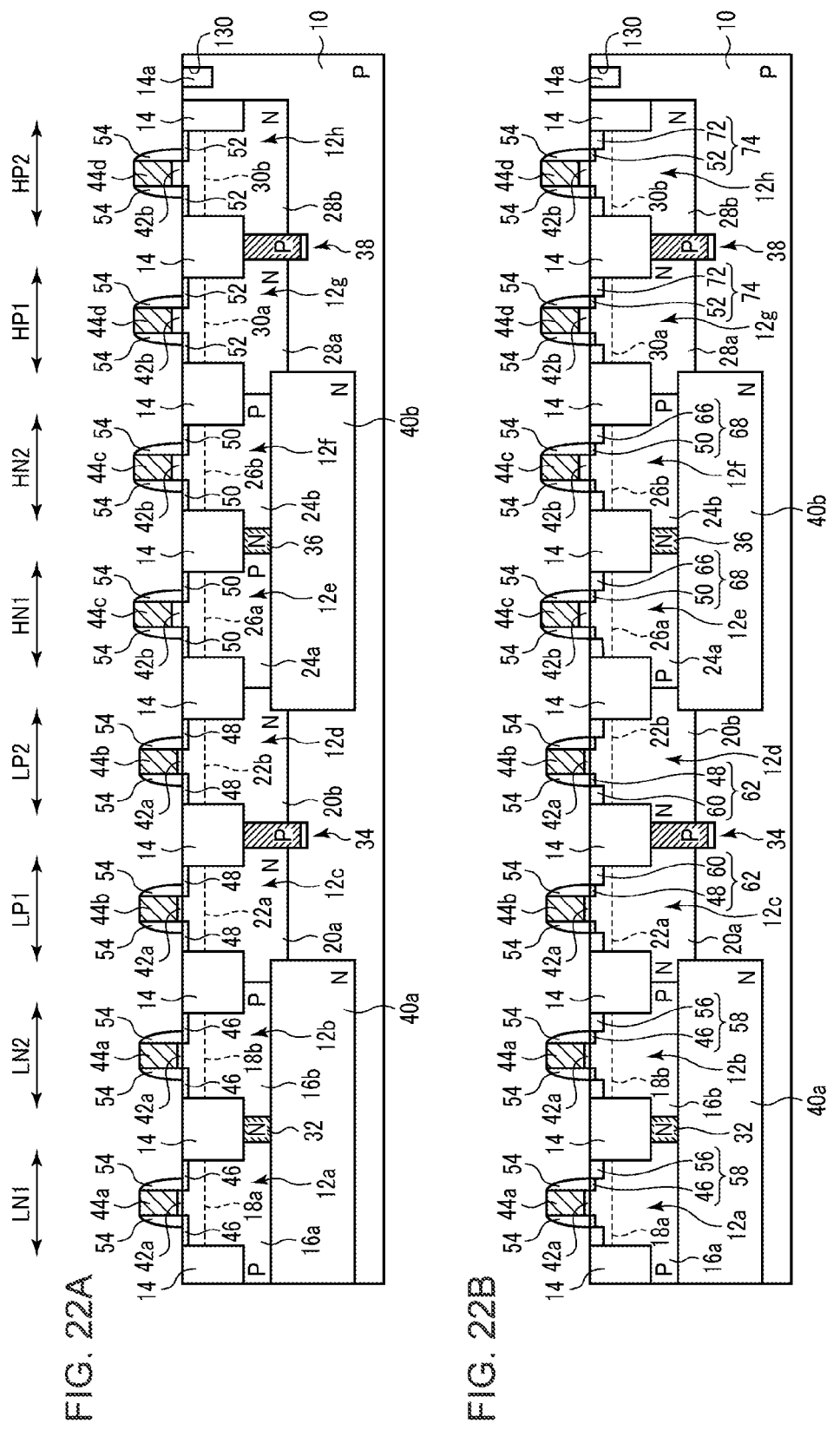

Next, in the same manner as the manufacturing method of the semiconductor device according to the first embodiment described above by using FIG. 15B, sidewall insulating films 54 are formed (see FIG. 22A).

Next, in the same manner as the manufacturing method of the semiconductor device according to the first embodiment described above by using FIG. 16A, high concentration impurity regions 56, 60, 66, and 72 are formed, and thereby source/drain regions 58, 62, 68, and 74 are formed (see FIG. 22B).

Next, in the same manner as the manufacturing method of the semiconductor device according to the first embodiment described above by using FIG. 16B, an interlayer insulating film 78, conductive plugs 80, an interlayer insulating film 84, and wirings 86 are formed.

Figure 23:
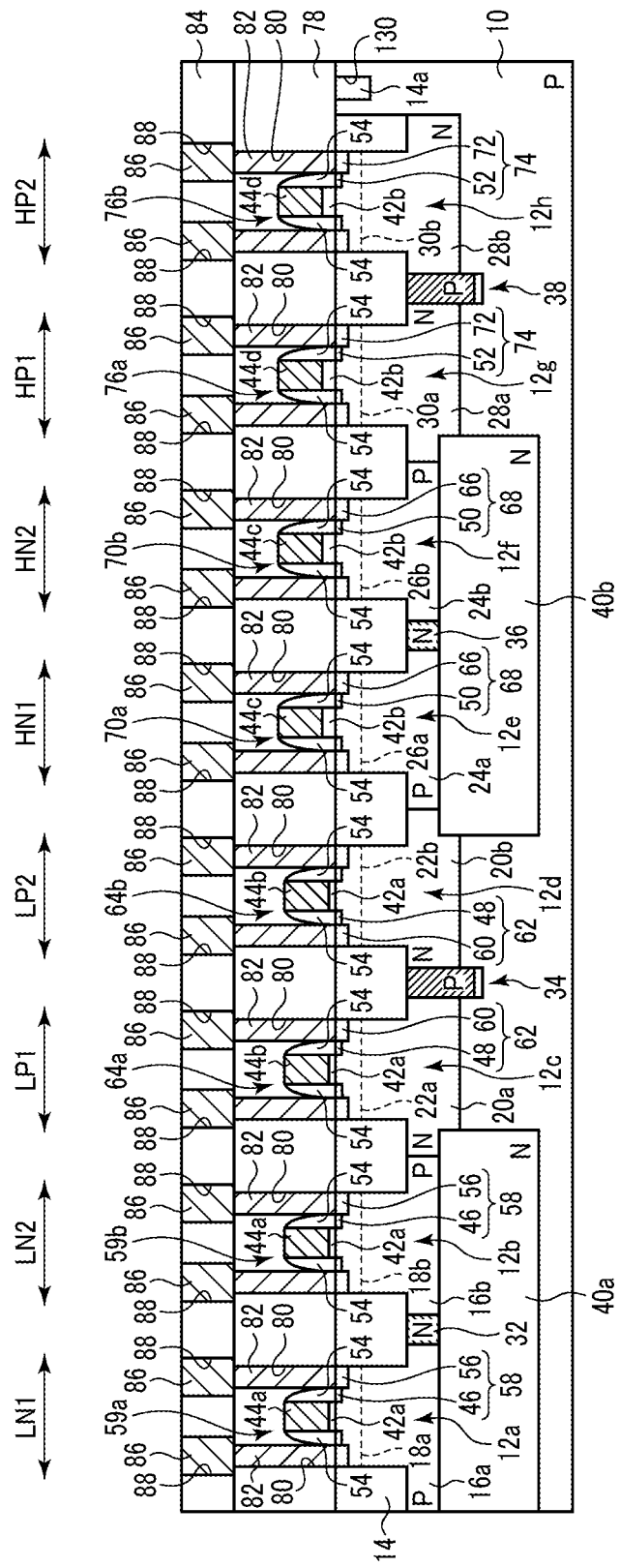
FIG. 23 is a process cross-sectional view illustrating the manufacturing method of the semiconductor device according to the second embodiment (part 7)

In this manner, the semiconductor device according to this embodiment is manufactured (see FIG. 23).

As above, it is also possible to form the wells 16a, 16b, 20a, and 20b for low-voltage MOS transistors and then to form the element isolation regions 14.

Third Embodiment

There are explained a semiconductor device and a manufacturing method thereof according to a third embodiment by using FIG. 24 to FIG. 31A and FIG. 31B. The same reference numerals and symbols are added to the same components as those of the semiconductor device and the manufacturing method thereof according to the first or second embodiment illustrated in FIG. 1 to FIG. 23, and explanations are omitted or simplified.

(Semiconductor Device)

Figure 24:
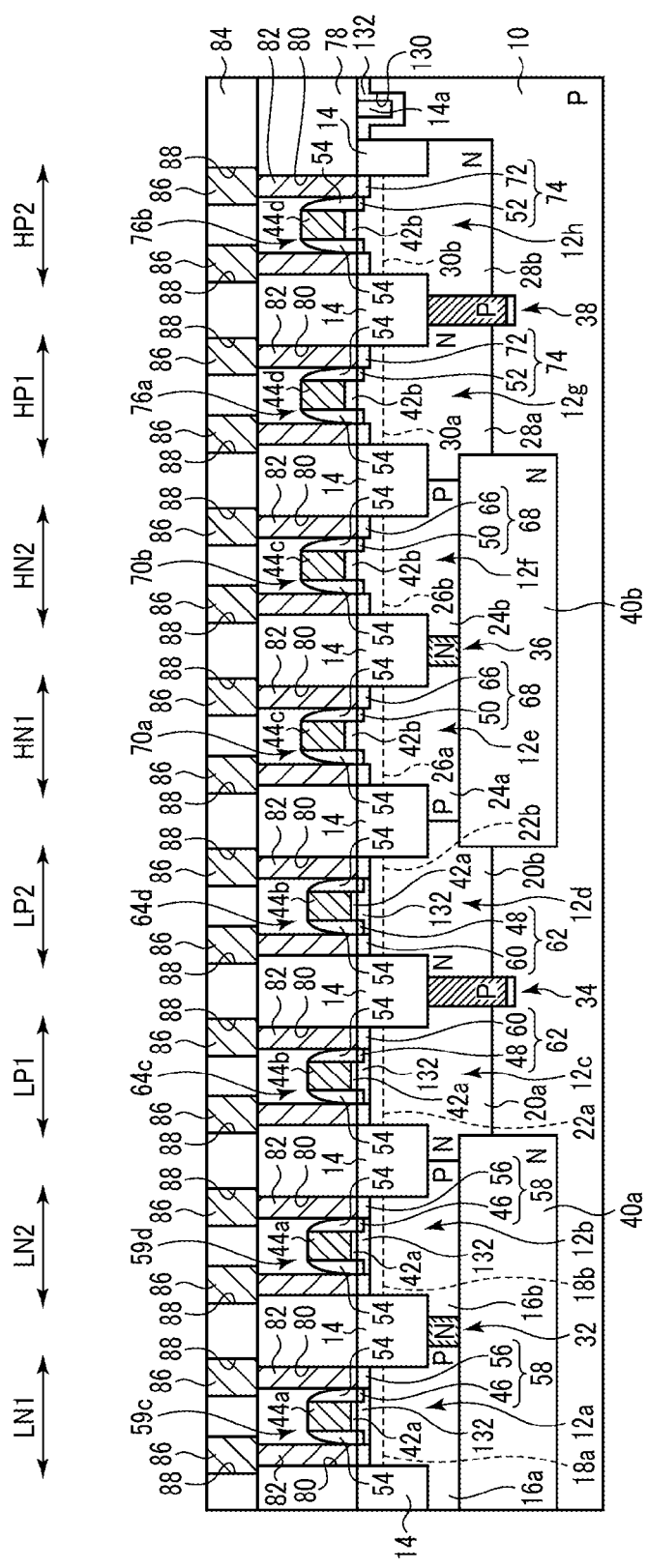
FIG. 24 is a cross-sectional view illustrating a semiconductor device according to a third embodiment.

First, there is explained the semiconductor device according to this embodiment by using FIG. 24. FIG. 24 is a cross-sectional view illustrating the semiconductor device according to this embodiment.

The semiconductor device according to this embodiment is one in which DDC (Deeply Depleted Channel) MOS transistors 59c, 59d, 64c, and 64d are formed.

As illustrated in FIG. 24, in regions LN1 and LN2 where low-voltage NMOS transistors are formed, P-type wells 16a and 16b are formed respectively.

In the P-type wells 16a and 16b, channel doped layers 18a and 18b are formed respectively.

On the channel doped layers 18a and 18b, a silicon layer (an epitaxial layer) 132 into which no impurity is implanted, namely a layer 132 with a quite low concentration of impurity is formed. The thickness of the silicon layer 132 is set to 20 to 30 nm or so, for example.

On the silicon layer 132, gate electrodes 44a are formed via a gate insulating film 42a.

In this manner, the DDC-structured low-voltage NMOS transistors 59c and 59d each having the gate electrode 44a and source/drain regions 58 are formed.

In regions LP1 and LP2 where low-voltage PMOS transistors are formed, N-type wells 20a and 20b are formed respectively.

In the N-type wells 20a and 20b, channel doped layers 22a and 22b are formed respectively.

On the channel doped layers 22a and 22b, the silicon layer 132 into which no impurity is implanted, namely the layer 132 with a quite low concentration of impurity is formed.

On the silicon layer 132, gate electrodes 44b are formed via the gate insulating film 42a.

In this manner, the DDC-structured low-voltage PMOS transistors 64c and 64d each having the gate electrode 44b and source/drain regions 62 are formed.

In the DDC-structured MOS transistors 59c, 59d, 64c, and 64d, a channel region immediately under the gate insulating film 42a is the layer 132 with a quite low concentration of impurity, so that a depletion layer is designed to extend down to a deep region. Therefore, it is possible to obtain the MOS transistors 59c, 59d, 64c, and 64d each having small fluctuations of a threshold voltage.

In this manner, the semiconductor device according to this embodiment is formed.

(Manufacturing Method of Semiconductor Device)

Next, there is explained the manufacturing method of the semiconductor device according to this embodiment by using FIG. 25A and FIG. 25B to FIG. 31A and FIG. 31B. FIG. 25A and FIG. 25B to FIG. 31A and FIG. 31B are process cross-sectional views each illustrating the manufacturing method of the semiconductor device according to this embodiment.

First, as illustrated in FIG. 25A, by using a photolithography technique, part of a semiconductor substrate 10 is etched, to thereby form a position mark 130 in the semiconductor substrate 10.

Next, in the same manner as the manufacturing method of the semiconductor device according to the first embodiment described above by using FIG. 11B, P-type wells 16a and 16b, separation P-type wells 33 and 37, and channel doped layers 18a and 18b are formed (see FIG. 25A).

Next, in the same manner as the manufacturing method of the semiconductor device according to the first embodiment described above by using FIG. 12A, N-type wells 20a and 20b, separation N-type wells 31 and 35, and channel doped layers 22a and 22b are formed (see FIG. 26A).

Next, a silicon layer 132 having a thickness of 20 to 30 nm or so is made to epitaxially grow on the whole surface by a CVD method, for example (see FIG. 26B).

Figure 27A:
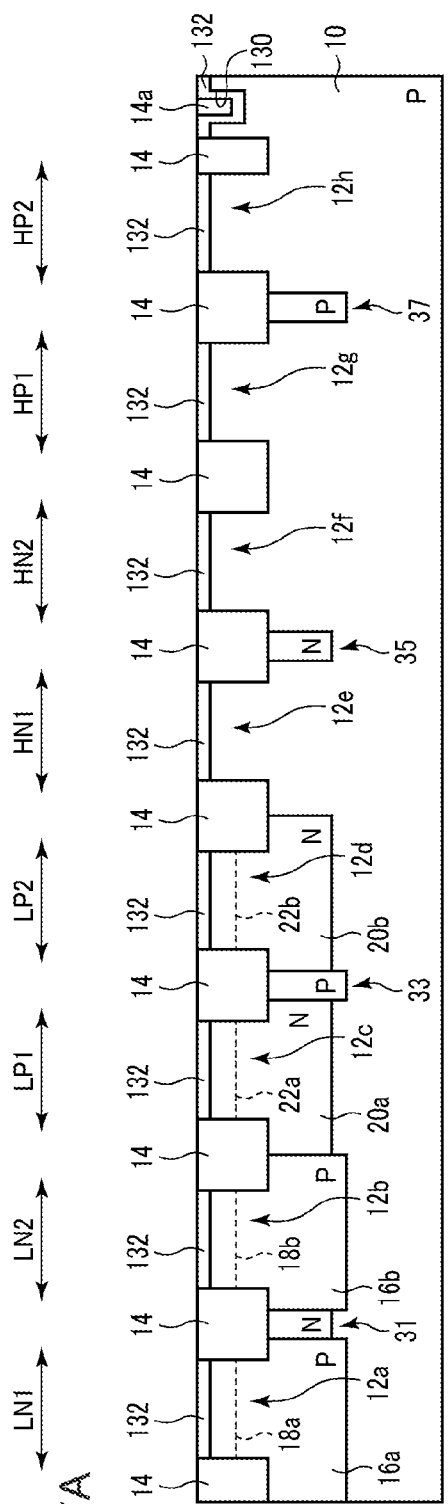
FIG. 27A and FIG. 27B are process cross-sectional views each illustrating the manufacturing method of the semiconductor device according to the third embodiment (part 3)

Next, in the same manner as the manufacturing method of the semiconductor device according to the first embodiment described above by using FIG. 11A, element isolation regions 14 demarcating element regions 12a to 12h are formed (see FIG. 27A). On this occasion, in the alignment mark 130, an insulating film 14a made of the same material as that of the element isolation regions 14 is embedded.

Figure 27B:
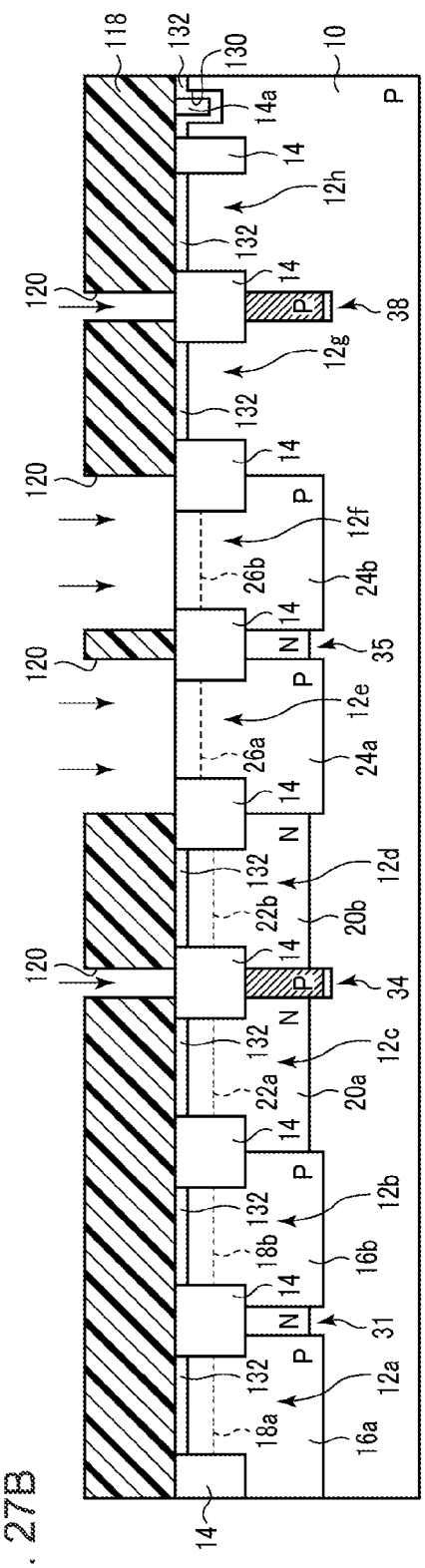

Next, in the same manner as the manufacturing method of the semiconductor device according to the first embodiment described above by using FIG. 12B, a P-type dopant impurity is introduced into the semiconductor substrate 10 (see FIG. 27B). Thereby, P-type wells 24a and 24b are formed. Further, the P-type dopant impurity is further introduced into the separation P-type wells 33 and 37, and thereby the separation P-type wells 33 and 37 turn to separation P-type wells 34 and 38. Further, channel doped layers 26a and 26b are formed.

Figures 28A, 28B:
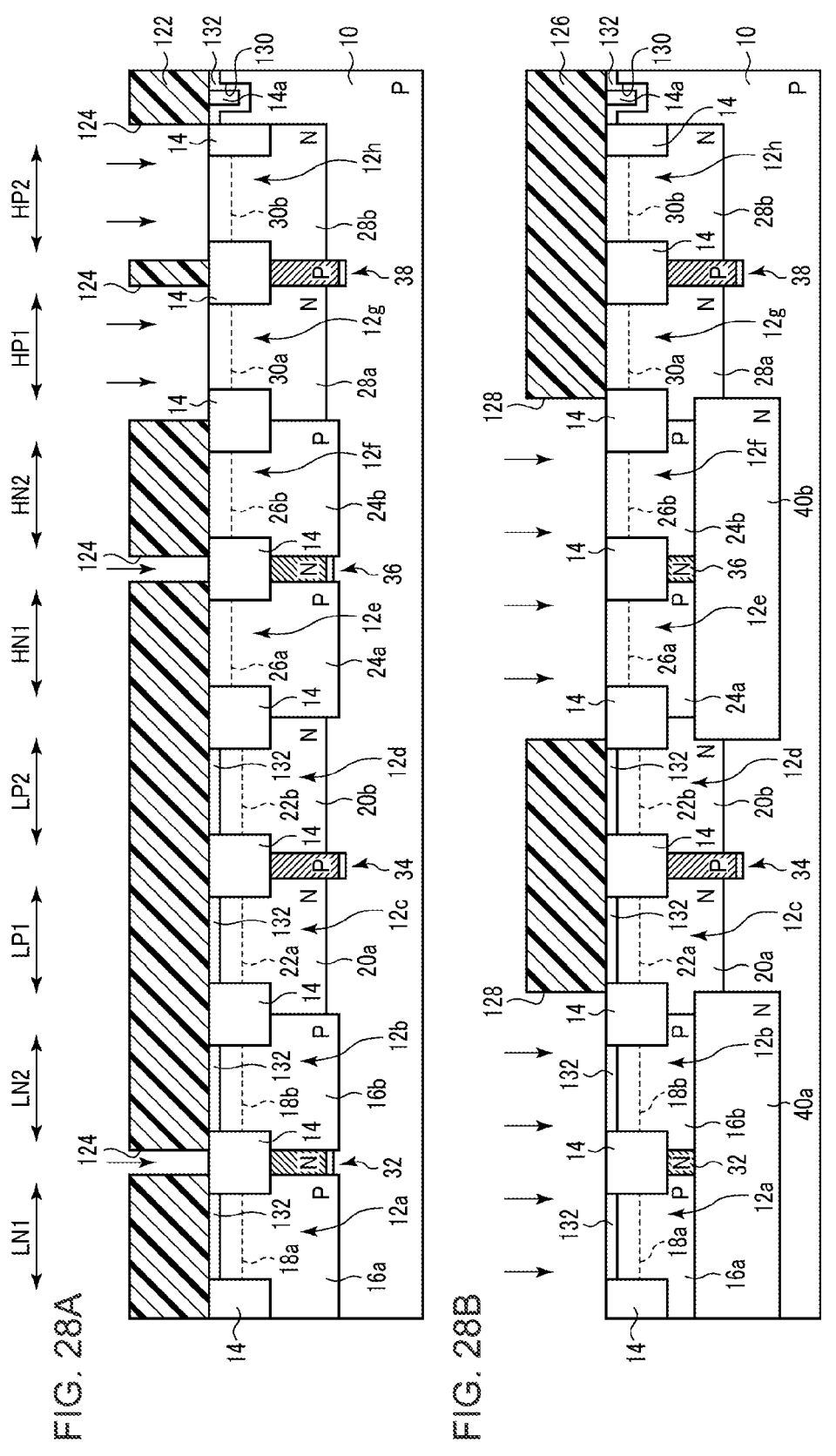

Next, in the same manner as the manufacturing method of the semiconductor device according to the first embodiment described above by using FIG. 13A, an N-type dopant impurity is introduced into the semiconductor substrate 10 (see FIG. 28A). Thereby, N-type wells 28a and 28b are formed. Further, the N-type dopant impurity is further introduced into the separation N-type wells 31 and 35, and thereby the separation N-type wells 31 and 35 turn to separation N-type wells 32 and 36. Further, channel doped layers 30a and 30b are formed.

Next, in the same manner as the manufacturing method of the semiconductor device according to the first embodiment described above by using FIG. 13B, N-type embedded wells 40a and 40b are formed (see FIG. 28B).

Next, in the same manner as the manufacturing method of the semiconductor device according to the first embodiment described above by using FIG. 14A, gate insulating films 42a and 42b are formed (see FIG. 29A).

Next, in the same manner as the manufacturing method of the semiconductor device according to the first embodiment described above by using FIG. 14B, gate electrodes 44a to 44d are formed (see FIG. 29B).

Next, in the same manner as the manufacturing method of the semiconductor device according to the first embodiment described above by using FIG. 15A, low concentration impurity regions 46, 48, 50, and 52 are formed (see FIG. 30A).

Next, in the same manner as the manufacturing method of the semiconductor device according to the first embodiment described above by using FIG. 15B, sidewall insulating films 54 are formed (see FIG. 30B).

Figure 31A:
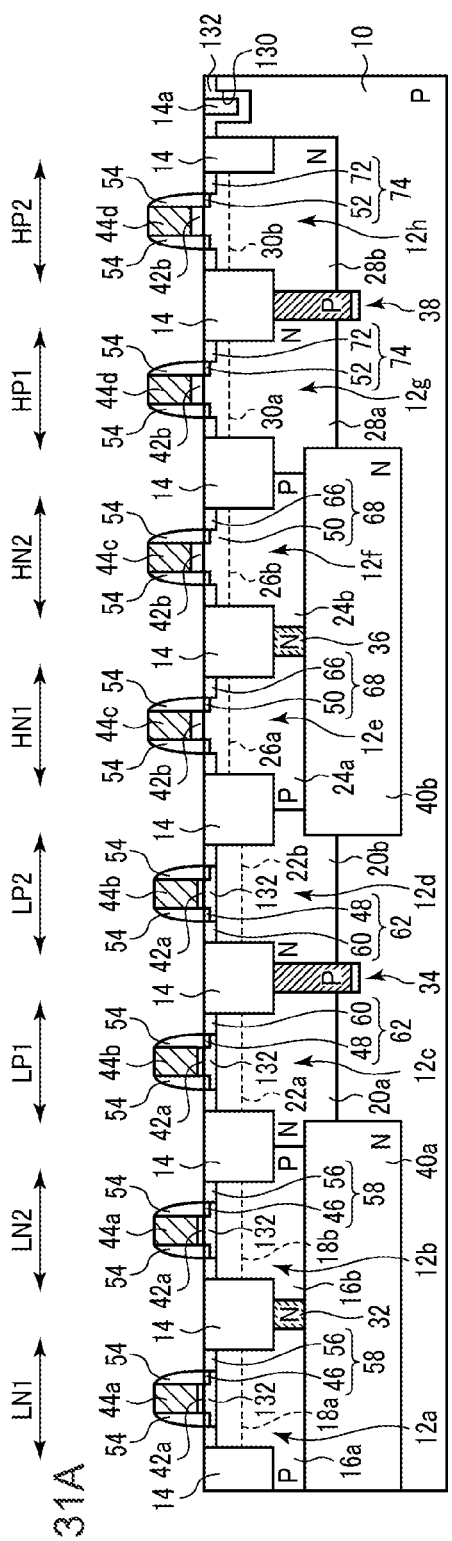
FIG. 31A and FIG. 31B are process cross-sectional views each illustrating the manufacturing method of the semiconductor device according to the third embodiment (part 7)

Next, in the same manner as the manufacturing method of the semiconductor device according to the first embodiment described above by using FIG. 16A, high concentration impurity regions 56, 60, 66, and 72 are formed (see FIG. 31A).

Next, in the same manner as the manufacturing method of the semiconductor device according to the first embodiment described above by using FIG. 16B, an interlayer insulating film 78, conductive plugs 80, an interlayer insulating film 84, and wirings 86 are formed.

Figure 31B:
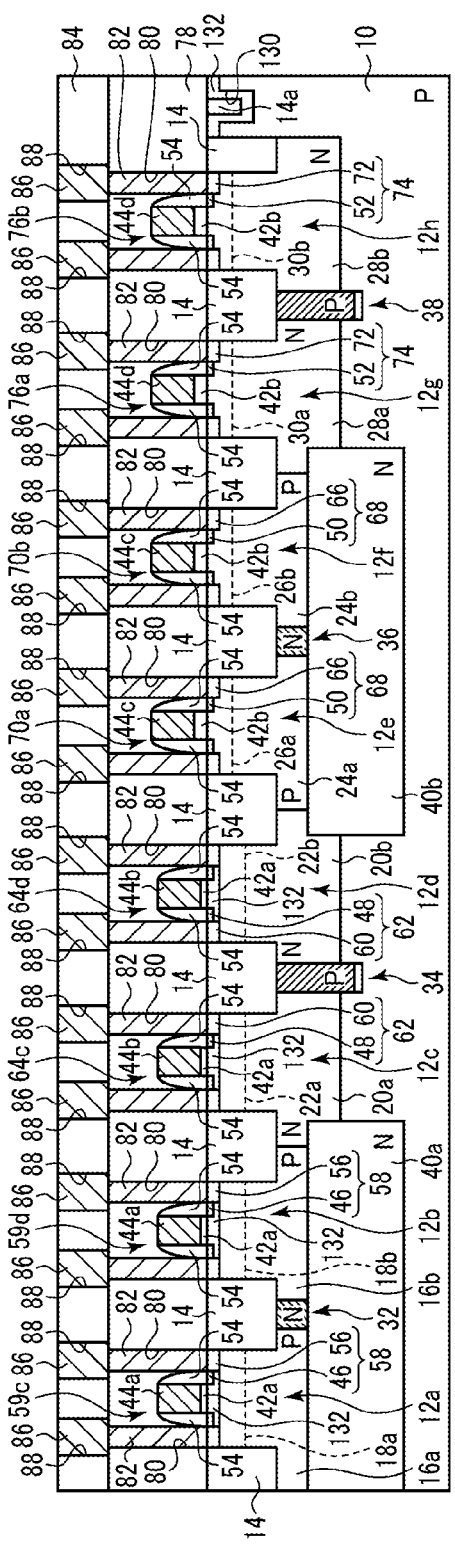

In this manner, the semiconductor device according to this embodiment is manufactured (see FIG. 31B).

As above, as the low-voltage MOS transistors, the DDC-structured MOS transistors 59c, 59d, 64c, and 64d may also be formed.

Fourth Embodiment

There are explained a semiconductor device and a manufacturing method thereof according to a fourth embodiment by using FIG. 32 to FIG. 38. The same reference numerals and symbols are added to the same components as those of the semiconductor devices and the manufacturing methods thereof according to the first to third embodiments illustrated in FIG. 1 to FIG. 31A and FIG. 31B, and explanations are omitted or simplified.

(Semiconductor Device)

Figure 32:
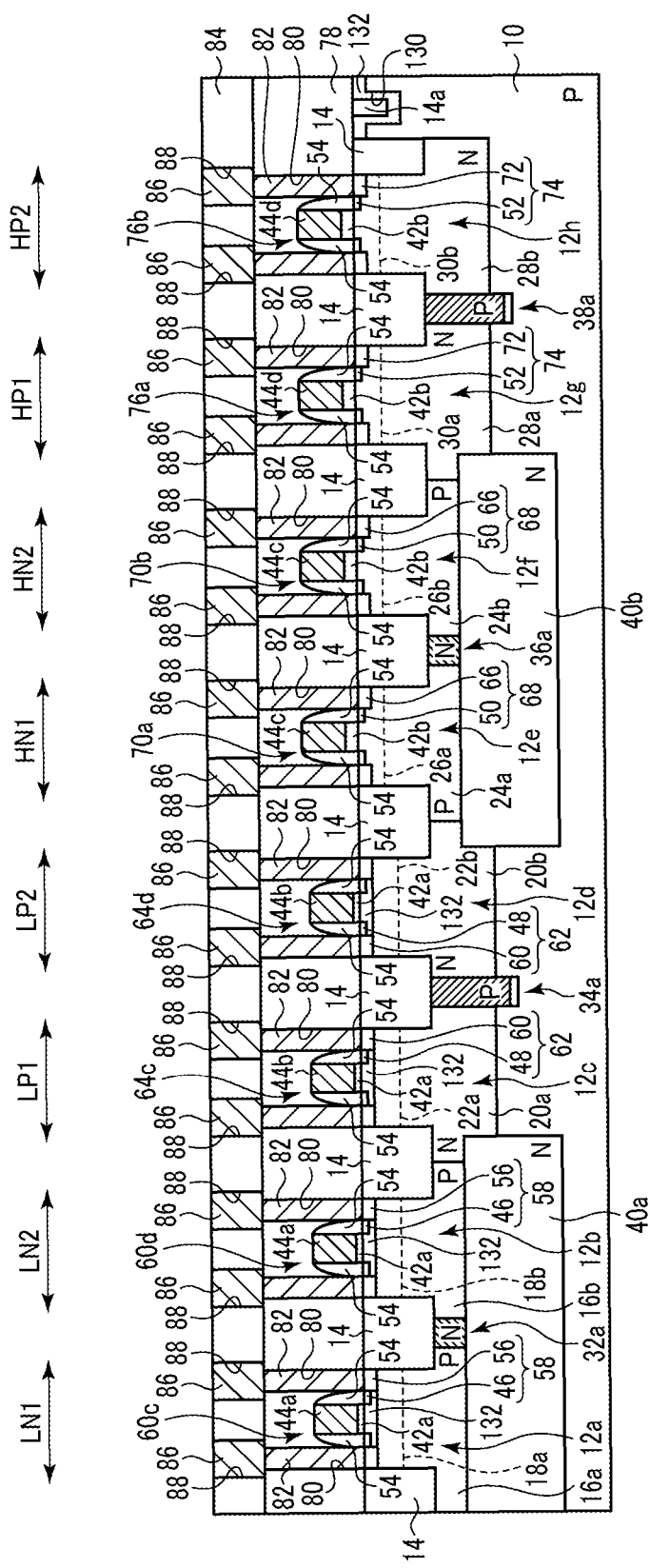
FIG. 32 is a cross-sectional view illustrating a semiconductor device according to a fourth embodiment.

First, there is explained the semiconductor device according to this embodiment by using FIG. 32. FIG. 32 is a cross-sectional view illustrating the semiconductor device according to this embodiment.

The semiconductor device according to this embodiment is one in which impurities are introduced into separation N-type wells 32a and 36a and separation P-type wells 34a and 38a in higher concentration.

As illustrated in FIG. 32, in a region between a P-type well 16a for first low-voltage NMOS transistors and a P-type well 16b for second low-voltage NMOS transistors, the separation N-type well 32a is formed. The concentration of an N-type impurity in the separation N-type well 32a at a first depth deeper than a bottom surface of an element isolation region 14 and shallower than a bottom surface of the P-type well 16a is larger than the sum of the concentration of an N-type impurity in an N-type well 20a at the first depth and the concentration of an N-type impurity in an N-type well 28a at the first depth. The peak concentration of the N-type dopant impurity in the separation N-type well 32a is set to $0.8 \times 10^{18}$ to $1.4 \times 10^{18}$ cm$^{-3}$ or so, for example. The separation N-type well 32a is formed by performing the implantation of an N-type dopant impurity three times. Specifically, when implantation of an N-type dopant impurity for forming N-type wells 20a and 20b for low-voltage PMOS transistors, the N-type dopant impurity is introduced also into the region where the separation N-type well 32a is formed. Further, when implantation of an N-type dopant impurity for forming N-type wells 28a and 28b for high-voltage PMOS transistors as well, the N-type dopant impurity is introduced into the region where the separation N-type well 32a is formed. Further, by using a mask 138 in which opening portions 140 exposing the regions where the separation N-type wells 32a and 36a are formed (see FIG. 37A) are formed (see FIG. 37A), an N-type dopant impurity is further introduced into the region where the separation N-type well 32a is formed.

In a region between the N-type well 20a for first low-voltage PMOS transistors and the N-type well 20b for second low-voltage PMOS transistors, the separation P-type well 34a is formed. The concentration of a P-type impurity in the separation P-type well 34a at a second depth deeper than the bottom surface of the element isolation region 14 and shallower than a bottom surface of the N-type well 20a is larger than the sum of the concentration of a P-type impurity in the P-type well 16a at the second depth and the concentration of a P-type impurity in a P-type well 24a at the second depth. The peak concentration of the P-type dopant impurity in the separation P-type well 34a is set to $0.8 \times 10^{18}$ to $1.4 \times 10^{18}$ cm$^{-3}$ or so, for example. The separation P-type well 34a is formed by performing the implantation of a P-type dopant impurity three times. Specifically, when implantation of a P-type dopant impurity for forming P-type wells 16a and 16b for low-voltage NMOS transistors, the P-type dopant impurity is introduced also into the region where the separation P-type well 34a is formed. Further, when implantation of a P-type dopant impurity or forming P-type wells 24a and 24b for high-voltage NMOS transistors as well, the P-type dopant impurity is introduced into the region where the separation P-type well 34a is formed. Further, by using a mask 134 in which opening portions 136 exposing the regions where the separation P-type wells 34a and 38a are formed (see FIG. 36B) are formed (see FIG. 36B), a P-type dopant impurity is further introduced into the region where the separation P-type well 34a is formed.

In a region between the P-type well 24a for first high-voltage NMOS transistors and the P-type well 24b for second high-voltage NMOS transistors, the separation N-type well 36a is formed. The concentration of an N-type impurity in the separation well 36a at a third depth deeper than the bottom surface of the element isolation region 14 and shallower than a bottom surface of the P-type well 24a is larger than the sum of the concentration of an N-type impurity in the N-type well 20a at the third depth and the concentration of an N-type impurity in the N-type well 28a at the third depth. The peak concentration of the N-type dopant impurity in the separation N-type well 36a is set to $0.8 \times 10^{18}$ to $1.4 \times 10^{18}$ cm$^{-3}$ or so, for example. The separation N-type well 36a is formed by performing the implantation of an N-type dopant impurity three times. Specifically, when implantation of an N-type dopant impurity for forming the N-type wells 20a and 20b for low-voltage PMOS transistors, the N-type dopant impurity is introduced also into the region where the separation N-type well 36a is formed. Further, when implantation of an N-type dopant impurity for forming the N-type wells 28a and 28b for high-voltage PMOS transistors as well, the N-type dopant impurity is introduced into the region where the separation N-type well 36a is formed. Further, by using the mask 138 in which the opening portions 140 exposing the regions where the separation N-type wells 32a and 36a are formed (see FIG. 37A) are formed (see FIG. 37A), an N-type dopant impurity is further introduced into the region where the separation N-type well 36a is formed.

In a region between the N-type well 28a for first high-voltage PMOS transistors and the N-type well 28b for second high-voltage PMOS transistors, the separation P-type well 38a is formed. The concentration of a P-type impurity in the separation well 38a at a fourth depth deeper than the bottom surface of the element isolation region 14 and shallower than a bottom surface of the N-type well 28a is larger than the sum of the concentration of a P-type impurity in the P-type well 16a at the fourth depth and the concentration of a P-type impurity in the P-type well 24a at the fourth depth. The peak concentration of the P-type dopant impurity in the separation P-type well 38a is set to $0.8 \times 10^{18}$ to $1.4 \times 10^{18}$ cm$^{-3}$ or so, for example. The separation P-type well 38a is formed by performing the implantation of a P-type dopant impurity three times. Specifically, when implantation of a P-type dopant impurity for forming the P-type wells 16a and 16b for low-voltage NMOS transistors, the P-type dopant impurity is introduced also into the region where the separation P-type well 38a is formed. Further, when implantation of a P-type dopant impurity for forming the P-type wells 24a and 24b for high-voltage NMOS transistors as well, the P-type dopant impurity is introduced into the region where the separation P-type well 38a is formed. Further, by using the mask 134 in which the opening portions 136 exposing the regions where the separation P-type wells 34a and 38a are formed (see FIG. 36B) are formed (see FIG. 36B), a P-type dopant impurity is further introduced into the region where the separation P-type well 38a is formed.

As above, the concentrations of the impurities in the separation N-type wells 32a and 36a and the separation P-type wells 34a and 38a may also be set to be higher in concentration. According to this embodiment, the concentration of the N-type impurity in the separation wells 32a and 36a is sufficiently high, so that it is possible to make the distance between the P-type well 16a and the P-type well 16b and the distance between the P-type well 24a and the P-type well 24b smaller. Further, according to this embodiment, the concentration of the P-type impurity in the separation P-type wells 34a and 38a is sufficiently high, so that it is possible to make the distance between the N-type well 20a and the N-type well 20b and the distance between the N-type well 28a and the N-type well 28b smaller. Thus, according to this embodiment, it is possible to achieve further miniaturization of the semiconductor device.

(Manufacturing Method of Semiconductor Device)

Next, there is explained the manufacturing method of the semiconductor device according to this embodiment by using FIG. 33A and FIG. 33B to FIG. 38. FIG. 33A and FIG. 33B to FIG. 38 are process cross-sectional views each illustrating the manufacturing method of the semiconductor device according to this embodiment.

First, as illustrated in FIG. 33A, by using a photolithography technique, part of a semiconductor substrate 10 is etched, to thereby form a position mark 130 in the semiconductor substrate 10.

Next, in the same manner as the manufacturing method of the semiconductor device according to the first embodiment described above by using FIG. 11B, P-type wells 16a and 16b, separation P-type wells 33 and 37, and channel doped layers 18a and 18b are formed (see FIG. 33A). The peak concentration of a P-type dopant impurity in the P-type wells 16a and 16b and the separation P-type wells 33 and 37 becomes $4 \times 10^{17}$ cm$^{-3}$ or so, for example.

Next, in the same manner as the manufacturing method of the semiconductor device according to the first embodiment described above by using FIG. 12A, N-type wells 20a and 20b, separation N-type wells 31 and 35, and channel doped layers 22a and 22b are formed (see FIG. 34A). The peak concentration of an N-type dopant impurity in the N-type wells 20a and 20b and the separation N-type wells 31 and 35 becomes $3 \times 10^{17}$ cm$^{-3}$ or so, for example.

Next, in the same manner as the manufacturing method of the semiconductor device according to the third embodiment described above by using FIG. 26B, a silicon layer 132 is made to epitaxially grow (see FIG. 34B).

Figures 35A, 35B:
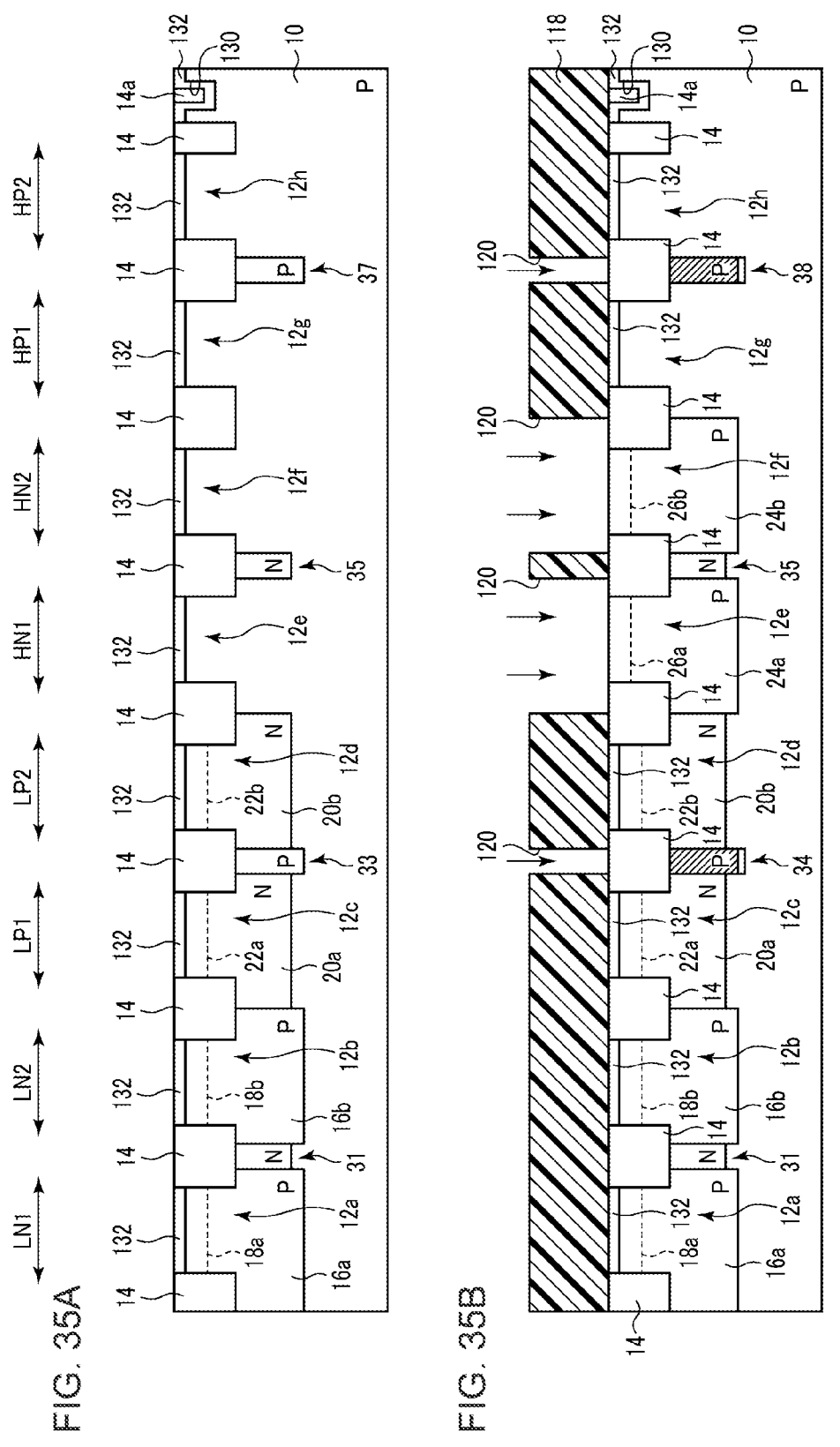

Next, in the same manner as the manufacturing method of the semiconductor device according to the first embodiment described above by using FIG. 11A, element isolation regions 14 demarcating element regions 12a to 12h are formed (see FIG. 35A). On this occasion, in the alignment mark 130, an insulating film 14a made of the same material as that of the element isolation regions 14 is embedded.

Next, in the same manner as the manufacturing method of the semiconductor device according to the first embodiment described above by using FIG. 12B, a P-type dopant impurity is introduced into the semiconductor substrate 10 (see FIG. 35B). Thereby, P-type wells 24a and 24b are formed. Further, the P-type dopant impurity is further introduced into the separation P-type wells 33 and 37, and thereby the separation P-type wells 33 and 37 turn to separation P-type wells 34 and 38. Further, channel doped layers 26a and 26b are formed. The peak concentration of the P-type dopant impurity in the P-type wells 24a and 24b becomes $3 \times 10^{17}$ cm$^{-3}$ or so, for example. The peak concentration of the P-type dopant impurity in the separation P-type wells 34 and 38 becomes $7 \times 10^{17}$ cm$^{-3}$ or so, for example. The concentration of the P-type impurity in the separation P-type well 34 at a second depth deeper than a bottom surface of the element isolation region 14 becomes equal to the sum of the concentration of the P-type impurity in the P-type well 16a at the second depth and the concentration of the P-type impurity in the P-type well 24a at the second depth. The concentration of the P-type impurity in the separation P-type well 38 at a fourth depth deeper than the bottom surface of the element isolation region 14 becomes equal to the sum of the concentration of the P-type impurity in the P-type well 16a at the fourth depth and the concentration of the P-type impurity in the P-type well 24a at the fourth depth.

Figures 36A, 36B:
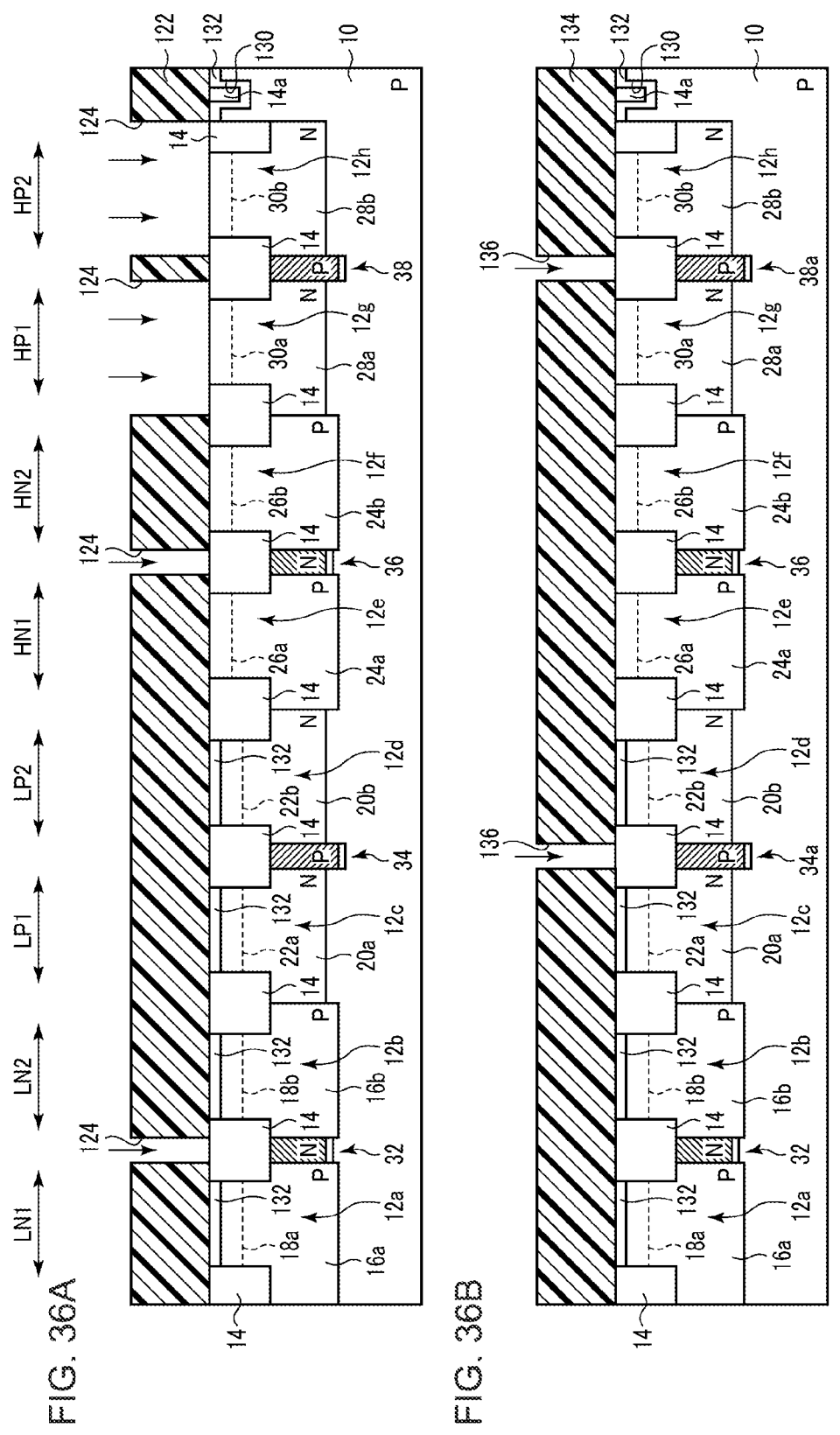

Next, in the same manner as the manufacturing method of the semiconductor device according to the first embodiment described above by using FIG. 13A, an N-type dopant impurity is introduced into the semiconductor substrate 10 (see FIG. 36A). Thereby, N-type wells 28a and 28b are formed. Further, the N-type dopant impurity is further introduced into the separation N-type wells 31 and 35, and thereby the separation N-type wells 31 and 35 turn to separation N-type wells 32 and 36. Further, channel doped layers 30a and 30b are formed. The peak concentration of the N-type dopant impurity in the N-type wells 28a and 28b becomes $3\times10^{17}$ cm$^{-3}$ or so, for example. Further, the peak concentration of the N-type dopant impurity in the separation N-type wells 32 and 36 becomes $6\times10^{17}$ cm$^{-3}$ or so, for example. The concentration of the N-type impurity in the separation well 32 at a first depth deeper than the bottom surface of the element isolation region 14 becomes equal to the sum of the concentration of the N-type impurity in the N-type well 20a at the first depth and the concentration of the N-type impurity in the N-type well 28a at the first depth. The concentration of the N-type impurity in the separation well 36 at a third depth deeper than the bottom surface of the element isolation region 14 becomes equal to the sum of the concentration of the N-type impurity in the N-type well 20a at the third depth and the concentration of the N-type impurity in the N-type well 28a at the third depth.

Next, by a spin coat method, for example, a photoresist film 134 is formed on the whole surface.

Next, by using a photolithography technique, there are formed opening portions 136 exposing regions where separation P-type wells 34a and 38a are formed in the photoresist film 134.

Next, by using the photoresist film 134 as a mask, a P-type dopant impurity is introduced into the semiconductor substrate 10 (see FIG. 36B). Thereby, the P-type dopant impurity is further introduced into the separation P-type wells 34 and 38, and thereby the separation P-type wells 34 and 38 turn to the separation P-type wells 34a and 38a. As the P-type dopant impurity, for example, B is used. Acceleration energy is set to 150 keV or so, for example. A dose amount is set to $4\times10^{13}$ to $10\times10^{13}$ cm$^{-2}$ or so, for example. The peak concentration of the P-type dopant impurity in the separation P-type wells 34a and 38a becomes $0.8\times10^{18}$ to $1.4\times10^{18}$ cm$^{-3}$ or so, for example. The concentration of the P-type impurity in the separation P-type well 34a at the second depth deeper than the bottom surface of the element isolation region 14 becomes larger than the sum of the concentration of the P-type impurity in the P-type well 16a at the second depth and the concentration of the P-type impurity in the P-type well 24a at the second depth. The concentration of the P-type impurity in the separation P-type well 38a at the fourth depth deeper than the bottom surface of the element isolation region 14 becomes larger than the sum of the concentration of the P-type impurity in the P-type well 16a at the fourth depth and the concentration of the P-type impurity in the P-type well 24a at the fourth depth.

Thereafter, the photoresist film 134 is exfoliated by ashing, for example.

Next, by a spin coat method, for example, a photoresist film 138 is formed on the whole surface.

Next, by using a photolithography technique, there are formed opening portions 140 exposing regions where separation N-type wells 32a and 36a are formed in the photoresist film 138.

Next, by using the photoresist film 138 as a mask, an N-type dopant impurity is introduced into the semiconductor substrate 10 (see FIG. 37A). Thereby, the N-type dopant impurity is further introduced into the separation N-type wells 32 and 36, and thereby the separation N-type wells 32 and 36 turn to the separation N-type wells 32a and 36a. As the N-type dopant impurity, for example, P is used. Acceleration energy is set to 360 keV or so, for example. A dose amount is set to $4\times10^{13}$ to $1.0\times10^{14}$ cm$^{-2}$ or so, for example. The peak concentration of the N-type dopant impurity in the separation N-type wells 32a and 36a becomes $0.8\times10^{18}$ to $1.4\times10^{18}$ cm$^{-3}$ or so, for example. The concentration of the N-type impurity in the separation well 32a at the first depth deeper than the bottom surface of the element isolation region 14 becomes larger than the sum of the concentration of the N-type impurity in the N-type well 20a at the first depth and the concentration of the N-type impurity in the N-type well 28a at the first depth. Further, the concentration of the N-type impurity in the separation P-type well 36a at the third depth deeper than the bottom surface of the element isolation region 14 becomes larger than the sum of the concentration of the N-type impurity in the N-type well 20a at the third depth and the concentration of the N-type impurity in the N-type well 28a at the third depth.

Next, in the same manner as the manufacturing method of the semiconductor device according to the first embodiment described above by using FIG. 13B, N-type embedded wells 40a and 40b are formed (see FIG. 37B).

The subsequent manufacturing method of the semiconductor device is the same as that of the semiconductor device according to the first embodiment described above by using FIG. 14A and FIG. 14B to FIG. 16A and FIG. 16B, so that explanations are omitted.

Figure 38:
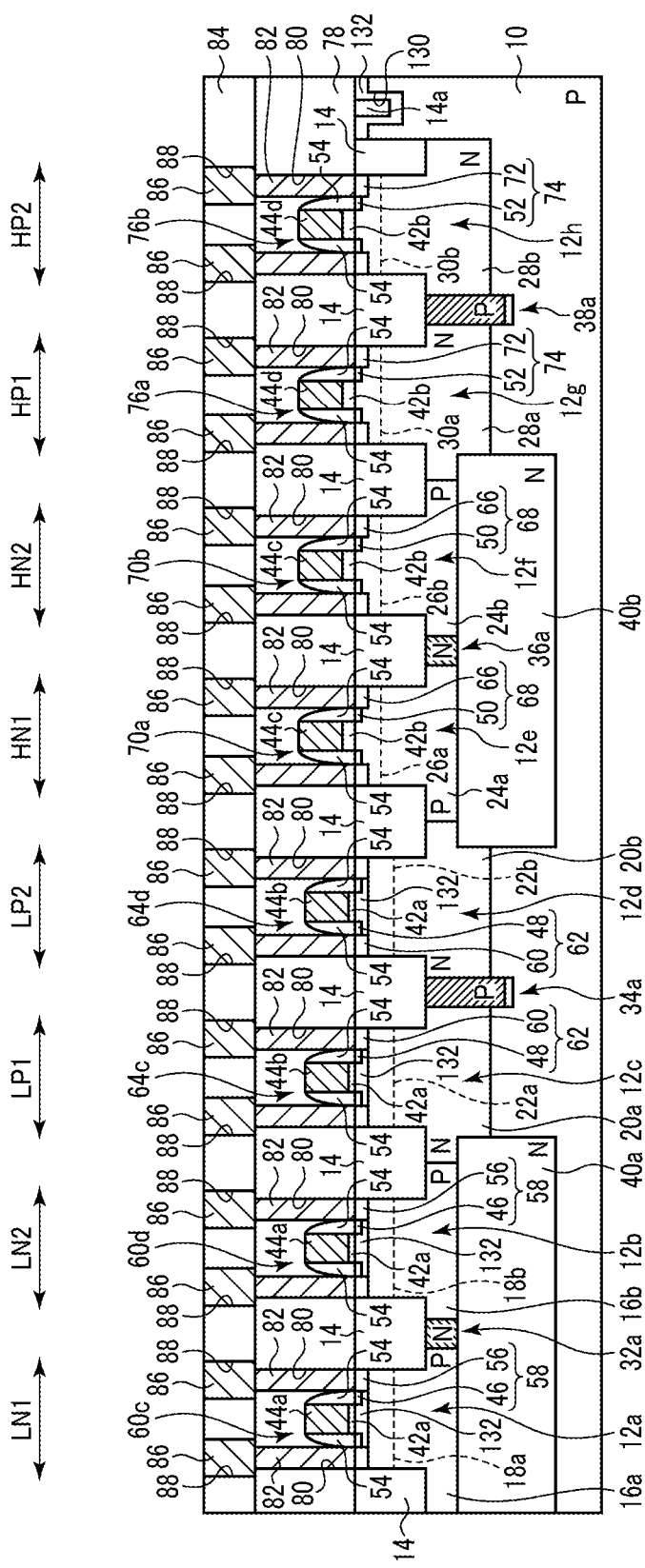
FIG. 38 is a process cross-sectional view illustrating the manufacturing method of the semiconductor device according to the fourth embodiment (part 6)

In this manner, the semiconductor device according to this embodiment is manufactured (see FIG. 38).

As above, the concentrations of the impurities in the separation N-type wells 32a and 36a and the separation P-type wells 34a and 38a may also be set to be higher in concentration. According to this embodiment, the concentration of the N-type impurity in the separation wells 32a and 36a is sufficiently high, so that it is possible to make the distance between the P-type well 16a and the P-type well 16b and the distance between the P-type well 24a and the P-type well 24b smaller. Further, according to this embodiment, the concentration of the P-type impurity in the separation P-type wells 34a and 38a is sufficiently high, so that it is possible to make the distance between the N-type well 20a and the N-type well 20b and the distance between the N-type well 28a and the N-type well 28b smaller. Thus, according to this embodiment, it is possible to achieve further miniaturization of the semiconductor device.

Modified Embodiment

In addition to the above-described embodiments, various modifications are possible.

For example, in the fourth embodiment, by performing the implantation of the N-type dopant impurity three times, the separation N-type wells 32a and 36a are formed, but by performing the implantation of the N-type dopant impurity four times or more, the separation N-type wells may also be formed.

Further, in the fourth embodiment, by performing the implantation of the P-type dopant impurity three times, the separation P-type wells 34a and 38a are formed, but by performing the implantation of the P-type dopant impurity four times or more, the separation P-type wells may also be formed.

According to the disclosed semiconductor devices and manufacturing methods thereof, between a first well of a first conductivity type and a second well of the first conductivity type, a separation well of a second conductivity type into which an impurity of the second conductivity type is introduced in relatively high concentration is formed. The concentration of the impurity of the second conductivity type in the separation well is relatively high, so that even though the distance between the first well and the second well is set to be small relatively, it is possible to prevent a large leak current from flowing. The distance between the first well and the second well can be made small, so that it is possible to achieve miniaturization of the semiconductor device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A manufacturing method of a semiconductor device comprising:
   forming element isolation regions demarcating element regions in a semiconductor substrate;
   introducing a first impurity of a first conductivity type into a first region of the semiconductor substrate to form a first well of the first conductivity type and introducing the first impurity into a second region of the semiconductor substrate to form a second well of the first conductivity type;
   introducing a second impurity of a second conductivity type, which is a conductivity type opposite to the first conductivity type, into a third region of the semiconductor substrate to form a third well of the second conductivity type and introducing the second impurity into a fourth region of the semiconductor substrate between the first well and the second well to form a first separation well of the second conductivity type;
   introducing a third impurity of the second conductivity type into the fourth region without introducing the third impurity into the third region; and
   forming an embedded well of the second conductivity type, which partially overlaps with the first well, the second well and the first separation well, by introducing the second impurity of the second conductivity type under the first well, the second well and the first separation well.

2. The manufacturing method of the semiconductor device according to claim 1, wherein
   in the introducing the third impurity, the third impurity is introduced into a fifth region of the semiconductor substrate to form a fourth well of the second conductivity type.

3. The manufacturing method of the semiconductor device according to claim 2, wherein
   in the forming the third well, the second impurity is introduced into a sixth region of the semiconductor substrate to form a fifth well of the second conductivity type, and
   in the forming the first well and the second well, the first impurity is introduced into a seventh region of the semiconductor substrate between the third well and the fifth well to form a second separation well of the first conductivity type, the manufacturing method further comprising:
   introducing a fourth impurity of the first conductivity type into the seventh region.

4. The manufacturing method of the semiconductor device according to claim 3, wherein
   in the introducing the fourth impurity, the fourth impurity is introduced into an eighth region of the semiconductor substrate to form a sixth well of the first conductivity type.

5. The manufacturing method of the semiconductor device according to claim 3, wherein
   in the forming the element isolation regions, a second portion of the element isolation region is formed in the seventh region, and
   the second separation well is positioned in the semiconductor substrate under the second portion.

6. The manufacturing method of the semiconductor device according to claim 4, wherein
   in the forming the sixth well, the fourth impurity is introduced into a ninth region of the semiconductor substrate to form a seventh well of the first conductivity type,
   in the forming the third well, the second impurity is introduced into a tenth region of the semiconductor substrate between the sixth well and the seventh well to form a third separation well of the second conductivity type, and
   in the forming the fourth well, the third impurity is introduced into the tenth region.

7. The manufacturing method of the semiconductor device, according to claim 6, wherein
   in the forming the fourth well, the third impurity is introduced into an eleventh region of the semiconductor substrate to form an eighth well of the second conductivity type,
   in the forming the first well and the second well, the first impurity is introduced into a twelfth region of the semiconductor substrate between the fourth well and the eighth well to form a fourth separation well of the first conductivity type, and
   in the forming the sixth well, the fourth impurity is introduced into the twelfth region.

8. The manufacturing method of the semiconductor device according to claim 1, further comprising:
   introducing a fifth impurity of the second conductivity type into the fourth region.

9. The manufacturing method of the semiconductor device according to claim 3, further comprising:
   introducing a sixth impurity of the first conductivity type into the seventh region.

10. The manufacturing method of the semiconductor device according to claim 1, wherein
    in the forming the element isolation regions, a first portion of the element isolation region is formed in the fourth region, and
    the first separation well is positioned in the semiconductor substrate under the first portion.

11. A manufacturing method of a semiconductor device comprising:
    forming element isolation regions demarcating element regions in a semiconductor substrate;
    introducing a first impurity of a first conductivity type into a first region of the semiconductor substrate to form a first well of the first conductivity type and introducing the first impurity into a second region of the semiconductor substrate to form a second well of the first conductivity type;

introducing a second impurity of a second conductivity type, which is a conductivity type opposite to the first conductivity type, into a third region of the semiconductor substrate to form a third well of the second conductivity type and introducing the second impurity into a fourth region of the semiconductor substrate between the first well and the second well to form a first separation well of the second conductivity type;

introducing a third impurity of the second conductivity type into the fourth region without introducing the third impurity into the third region; and forming a first MOS transistor on the first well in the first region, a second MOS transistor on the second well in the second region and a third MOS transistor on the third well in the third region, wherein in the forming the element isolation regions, a first portion of the element isolation region is formed in the fourth region, and the first separation well is positioned in the semiconductor substrate under the first portion.

* * * * *